(12) United States Patent
Yamanaka et al.

(10) Patent No.: US 7,252,924 B2
(45) Date of Patent: Aug. 7, 2007

(54) POSITIVE RESIST COMPOSITION AND METHOD OF PATTERN FORMATION USING THE SAME

(75) Inventors: Tsukasa Yamanaka, Shizuoka (JP); Kenichiro Sato, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 18 days.

(21) Appl. No.: 10/801,723

(22) Filed: Mar. 17, 2004

(65) Prior Publication Data

US 2004/0197707 A1 Oct. 7, 2004

(30) Foreign Application Priority Data

Mar. 31, 2003 (JP) .................. P.2003-095804

(51) Int. Cl.
*G03F 7/00* (2006.01)
*G03F 7/004* (2006.01)

(52) U.S. Cl. .................. 430/270.1; 430/330; 430/913

(58) Field of Classification Search ............. 430/270.1, 430/330, 913
See application file for complete search history.

(56) References Cited

U.S. PATENT DOCUMENTS

| | | | | |
|---|---|---|---|---|
| 5,968,713 A * | 10/1999 | Nozaki et al. | .............. | 430/326 |
| 6,042,991 A * | 3/2000 | Aoai et al. | ................ | 430/285.1 |
| 6,087,063 A * | 7/2000 | Hada et al. | .............. | 430/270.1 |
| 6,146,806 A * | 11/2000 | Maeda et al. | ................ | 430/170 |
| 6,303,266 B1 * | 10/2001 | Okino et al. | ............. | 430/270.1 |
| 6,383,713 B1 * | 5/2002 | Uetani et al. | ............. | 430/270.1 |
| 6,403,280 B1 * | 6/2002 | Yamahara et al. | ........ | 430/270.1 |
| 6,406,830 B2 * | 6/2002 | Inoue et al. | ............. | 430/270.1 |
| 6,451,501 B1 * | 9/2002 | Nozaki et al. | ............. | 430/270.1 |
| 6,469,197 B1 * | 10/2002 | Maeda et al. | ................ | 560/117 |
| 6,479,211 B1 * | 11/2002 | Sato et al. | ............... | 430/270.1 |
| 6,511,785 B1 * | 1/2003 | Takemura et al. | ....... | 430/270.1 |
| 6,548,221 B2 * | 4/2003 | Uetani et al. | ............. | 430/270.1 |
| 6,579,659 B2 * | 6/2003 | Uetani et al. | ............. | 430/270.1 |
| 6,593,056 B2 * | 7/2003 | Takeda et al. | .............. | 430/170 |
| 6,596,458 B1 * | 7/2003 | Sato et al. | ................. | 430/270.1 |
| 6,692,884 B2 * | 2/2004 | Fujimori et al. | ............ | 430/170 |
| 6,703,183 B2 * | 3/2004 | Nishi et al. | .............. | 430/270.1 |
| 6,710,188 B2 * | 3/2004 | Maeda et al. | ................ | 549/266 |
| 6,777,160 B2 * | 8/2004 | Sato et al. | ............... | 430/270.1 |
| 6,777,511 B2 * | 8/2004 | Ochiai et al. | ................ | 526/173 |
| 6,787,282 B2 * | 9/2004 | Sato | ........................... | 430/170 |
| 6,787,283 B1 * | 9/2004 | Aoai et al. | ............... | 430/270.1 |
| 6,806,026 B2 * | 10/2004 | Allen et al. | .............. | 430/270.1 |
| 6,824,956 B2 * | 11/2004 | Sato | ........................ | 430/270.1 |
| 6,849,381 B2 * | 2/2005 | Barclay et al. | .......... | 430/270.1 |
| 6,852,468 B2 * | 2/2005 | Sato | ........................ | 430/270.1 |
| 6,908,722 B2 * | 6/2005 | Ebata et al. | ............. | 430/270.1 |
| 6,927,009 B2 * | 8/2005 | Kodama et al. | ......... | 430/270.1 |
| 2002/0016431 A1 * | 2/2002 | Iwasa et al | ................. | 526/284 |
| 2002/0182535 A1 * | 12/2002 | Maeda et al. | ............ | 430/270.1 |

FOREIGN PATENT DOCUMENTS

| | | | |
|---|---|---|---|
| EP | 1143299 A1 | * | 10/2001 |
| JP | 2000-159758 A | | 6/2000 |
| JP | 2000-330287 A | | 11/2000 |
| JP | 2000-338674 A | | 12/2000 |
| JP | 2002-161116 A | | 6/2002 |
| JP | 2002-196497 A | | 7/2002 |
| JP | 2002-229210 A | | 8/2002 |
| JP | 2003241384 A | * | 8/2003 |

\* cited by examiner

*Primary Examiner*—Amanda Walke
(74) *Attorney, Agent, or Firm*—Sughrue Mion, PLLC

(57) ABSTRACT

A positive resist composition comprising: at least two resins which differ in glass transition temperature by at least 5° C.; and a compound which generates an acid upon irradiation with actinic rays or radiation, wherein each of the two resins comprises at least either of a repeating unit derived from an acrylic acid derivative monomer and a repeating unit derived from an methacrylic acid derivative monomer and further comprises an alicyclic structure and at least one group that increases a solubility of the resin in alkaline developer by the action of an acid.

8 Claims, No Drawings

POSITIVE RESIST COMPOSITION AND METHOD OF PATTERN FORMATION USING THE SAME

BACKGROUND OF THE INVENTION

1. Field of the Invention

The present invention relates to a positive resist composition for use in the production of semiconductors, e.g., IC's, in the production of circuit boards for liquid crystals, thermal heads, etc., and in other photofabrication processes. More particularly, the invention relates to a positive resist composition suitable for use in applications where resists are exposed to a light having a wavelength of 250 nm or shorter, such as far ultraviolet rays, or irradiated with electron beams or the like.

2. Description of the Related Art

A chemical amplification type positive resist composition is a pattern-forming material which, upon irradiation with radiation, e.g., far ultraviolet rays, generates an acid in the exposed areas and comes to have a difference in solubility in a developer between the actinic-ray-irradiated areas and the unirradiated areas based on a reaction catalyzed by the acid. A pattern is thus formed on a substrate.

In ArF resist processing, formation of contact holes of 120 nm or smaller is desired. However, the degree of completion of ArF resists is lower than those of resists heretofore in use, such as i-line resists and resists for KrF excimer lasers. It is thought that the formation of a hole pattern of 120 nm or finer is difficult even with an ArF excimer laser illuminator having an NA of 0.90, which may come to be produced in the future.

Resist compositions which comprise a hydroxystyrene resin and are intended to be used for obtaining a pattern having a desired hole size only through a flow bake process are disclosed in, e.g., JP-A-2002-196497. However, the hydroxystyrene resin transmits almost no ArF excimer laser light and, hence, these resist compositions have not been usable as an ArF resist at all. Resist compositions for ArF exposure which contain alicyclic structures are disclosed in, e.g., JP-A-2000-159758, JP-A-2000-330287, JP-A-2000-338674 and JP-A-2002-161116. However, since this resin has a glass transition temperature as high as 150° C. or higher due to the alicyclic structures contained therein, the resist pattern does not thermally flow upon heating at a practical flow temperature (200° C. or lower).

Furthermore, a resist composition containing a blend of acid-decomposable resins the relationship between which concerning glass transition temperature is reversed through exposure and resultant decomposition is disclosed in JP-A-2002-229210. However, all the resins shown therein as examples contain styrene structures and hence have an exceedingly low transmittance of ArF excimer laser light. Consequently, necessary resolution has not been obtained with the resist composition in contact hole formation through exposure with an ArF excimer laser.

SUMMARY OF THE INVENTION

Accordingly, an object of the invention is to provide a resist composition which is suitable for exposure to light having a wavelength of 200 nm or shorter, in particular, exposure with an ArF excimer laser, shows sufficient resolution even in ordinary pattern formation, and has such thermal flow suitability that a reduced pattern size can be obtained only through flow bake at an appropriate temperature and it is easy to regulate the flow amount while attaining an appropriate flow rate.

The invention provides positive resist compositions having the following constitutions, with which that object of the invention is accomplished.

(1) A positive resist composition comprising: at least two resins, each comprising: at least one of a repeating unit derived from an acrylic acid derivative monomer and a repeating unit derived from a methacrylic acid derivative monomer; an alicyclic structure; and at least one group that increases a solubility of each of the at least two resins in alkaline developer by the action of an acid; and a compound which generates an acid upon irradiation with actinic rays or radiation, wherein a first resin of the at least two resins has a glass transition temperature different from that of a second resin of the at least two resins by at least 5° C.

(2) The positive resist composition as described in(1), wherein at least one of the first and second resins comprises at least one kind of repeating units selected from ones represented by the formulae (A1) and (A2):

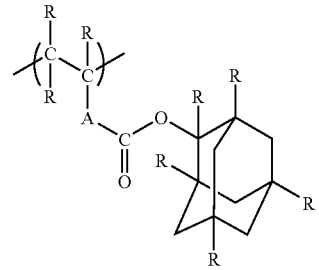

(A1)

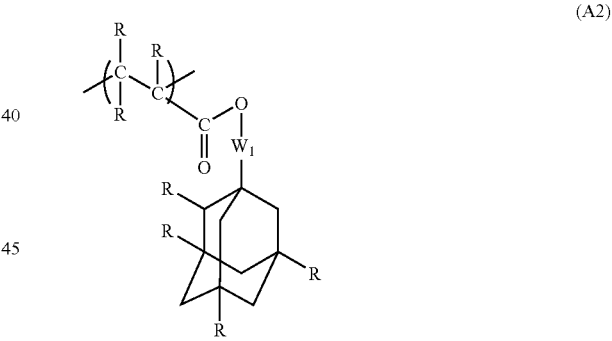

(A2)

wherein R represents a hydrogen atom, a hydroxyl group, a halogen atom, or an alkyl group having 1 to 4 carbon atoms, provided that the R's are the same or different; A is a single bond or represents one group or a combination of two or more groups selected from the group consisting of alkylene, ether, thioether, carbonyl, ester, amide, sulfonamide, urethane, and urea groups; and $W_1$ represents an alkylene group.

Preferred embodiments of the resist composition include the following constitutions.

(3) The positive resist composition as described in (1) or (2) above wherein each of the first and second resins comprises both of a repeating unit derived from the acrylic acid derivative monomer and a repeating unit derived from the methacrylic acid derivative monomer and the difference between the molar proportion of the repeating unit derived from the acrylic acid derivative monomer in the first resin and that in the second resin is from 20 to 95 mol %.

(4) The positive resist composition as described in any one of (1) to (3) above wherein one of the first and second resins has a glass transition temperature lower than 140° C. and the other one of the first and second resins has a glass transition temperature of from 140° C. to lower than 180° C.

(5) The positive resist composition as described in any one of (1) to (4) above wherein one of the first and second resins does not comprise a repeating unit derived from the methacrylic acid derivative monomer and the other one of the first and second resins comprises both of a repeating unit derived from the acrylic acid derivative monomer and a repeating unit derived from the methacrylic acid derivative monomer.

(6) The positive resist composition as described in any one of (1) to (5) above wherein at least one of the first and second resins comprises at least one of a repeating unit derived from a dihydroxyadamantyl methacrylate monomer and a repeating unit derived from a dihydroxyadamantyl acrylate monomer.

(7) The positive resist composition as described in any one of (1) to (6) above wherein the compound which generates an acid upon irradiation with actinic rays or radiation is at least one member selected from the group consisting of compounds represented by formulae (PAG1), (PAG2), and (PAG6):

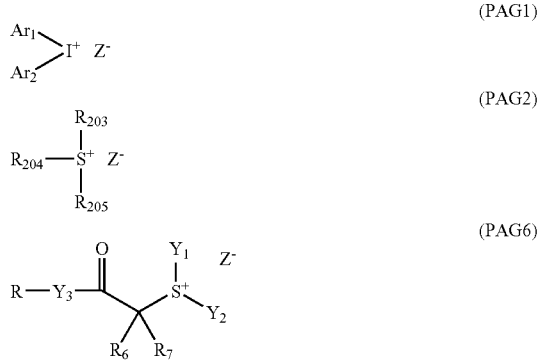

Ar$^1$ and Ar$^2$ each independently represents an aryl group;
R$^{203}$, R$^{204}$, and R$^{205}$ each independently represents an alkyl group or an aryl group;
R represents a chain or cyclic alkyl group or an aromatic group;
Y$_3$ represents a single bond or a bivalent connecting group;
R$_6$ and R$_7$ each represents a hydrogen atom, a cyano, an alkyl group, or an aryl group, provided that R$_6$ and R$_7$ may be bonded to each other to form a ring;
Y$_1$ and Y$_2$ each represents an alkyl group, an aryl group, an aralkyl group, or an aromatic group containing one or more heteroatoms, provided that Y$_1$ and Y$_2$ may be bonded to each other to form a ring; and
Z$^-$ in each formula represents a counter anion.

(8) A method of pattern formation comprising: forming a photoresist film on a semiconductor substrate with the positive resist composition as claimed in claim 1; subjecting the photoresist film to pattern-wise exposure with at least one of: radiation having a wavelength of 200 nm or shorter; electron beams; X-rays; and ion beams; heating the photoresist film; developing the photoresist film to form a contact hole pattern having a hole size larger than a desired size; and heating the semiconductor substrate to a temperature of from 120 to 200° C. to cause the contact hole pattern to flow thermally and thereby form a contact hole pattern having the desired hole size.

DETAILED DESCRIPTION OF THE INVENTION

The compounds to be used in the invention will be explained below in detail.

[1] Resins (Ingredient A)

The resist composition of the invention contains at least two resins which each comprise at least either of repeating units derived from an acrylic acid derivative monomer and repeating units derived from a methacrylic acid derivative monomer and further contain alicyclic structures and groups dissociating by the action of an acid to enhance solubility in an alkaline developer. These two resins differ in glass transition temperature (T$_g$) by at least 5° C.

The two resins to be used in the invention are resins containing groups (acid-dissociable groups) which dissociate by the action of an acid to enhance solubility in an alkaline developer (acid-decomposable resins). Namely, these are resins which come to have enhanced solubility in an alkaline developer by the action of an acid.

The glass transition temperature (T$_g$) of a resin can be measured by scanning calorimetry (differential scanning calorimeter).

The terms "acrylic acid derivative monomer" and "methacrylic acid derivative monomer" as used herein have meanings including acrylic acid monomer and methacrylic acid monomer, respectively.

Preferred examples of repeating units which are contained in the resins and have an alicyclic structure include repeating units having a partial structure which contains one or more alicyclic hydrocarbon groups and is represented by any of the following general formulae (pI) to (pVI).

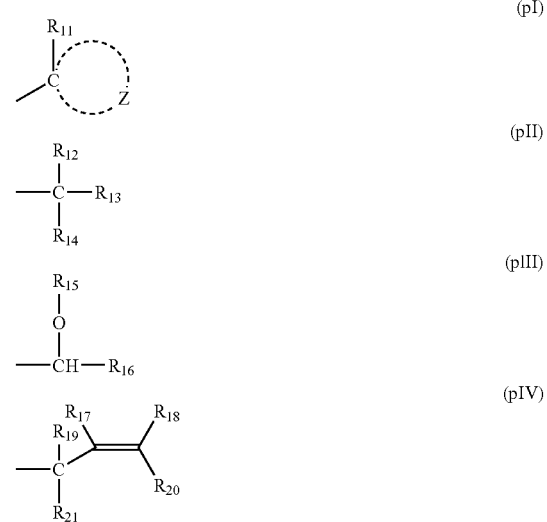

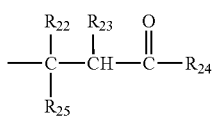
(pV)

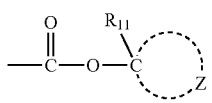
(pVI)

In the formulae, $R_{11}$ represents methyl, ethyl, n-propyl, isopropyl, n-butyl, isobutyl, or sec-butyl, and Z represents a group of atoms necessary for forming an alicyclic hydrocarbon group in cooperation with the carbon atom.

$R_{12}$ to $R_{16}$ each independently represent a linear or branched alkyl group having 1 to 4 carbon atoms or an alicyclic hydrocarbon group, provided that at least one of $R_{12}$ to $R_{14}$ or either of $R_{15}$ and $R_{16}$ represents an alicyclic hydrocarbon group.

$R_{17}$ to $R_{21}$ each independently represent a hydrogen atom, a linear or branched alkyl group having 1 to 4 carbon atoms, or an alicyclic hydrocarbon group, provided that at least one of $R_{17}$ to $R_{21}$ represents an alicyclic hydrocarbon group, and that either of $R_{19}$ and $R_{21}$ represents a linear or branched alkyl group having 1 to 4 carbon atoms or an alicyclic hydrocarbon group.

$R_{22}$ to $R_{25}$ each independently represent a hydrogen atom, a linear or branched alkyl group having 1 to 4 carbon atoms, or an alicyclic hydrocarbon group, provided that at least one of $R_{22}$ to $R_{25}$ represents an alicyclic hydrocarbon group, and that $R_{23}$ and $R_{24}$ may be bonded to each other to form a ring.

In general formulae (pI) to (pVI), the alkyl groups in $R_{12}$ to $R_{25}$ each are a linear or branched alkyl group which has 1 to 4 carbon atoms and may be either a substituted or unsubstituted one. Examples of these alkyl groups include methyl, ethyl, n-propyl, isopropyl, n-butyl, isobutyl, sec-butyl, and t-butyl.

Examples of substituents of the alkyl groups include alkoxy groups having 1 to 4 carbon atoms, halogen atoms (fluorine, chlorine, bromine, and iodine atoms), acyl groups, acyloxy groups, cyano, hydroxyl, carboxy, alkoxycarbonyl groups, and nitro.

The alicyclic hydrocarbon groups in $R_{11}$ to $R_{25}$ and the alicyclic hydrocarbon group formed by Z and a carbon atom may be monocyclic or polycyclic. Examples thereof include groups having a monocyclic, bicyclic, tricyclic, or tetracyclic structure having 5 or more carbon atoms. Such alicyclic hydrocarbon groups each have preferably 6 to 30 carbon atoms, especially preferably 7 to 25 carbon atoms. These alicyclic hydrocarbon groups may have one or more substituents.

Examples of the structures of the alicyclic moieties in the alicyclic hydrocarbon groups include the following.

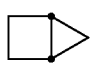
(1)

(2)

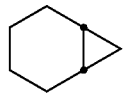
(3)

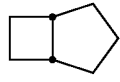
(4)

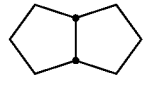
(5)

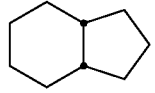
(6)

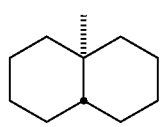
(7)

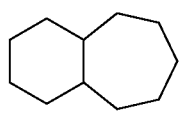
(8)

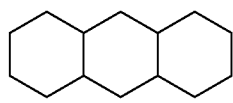
(9)

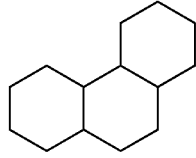
(10)

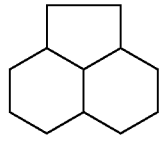
(11)

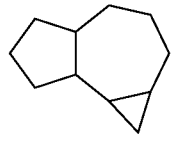
(12)

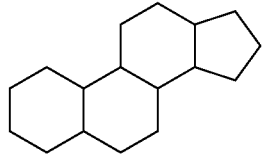
(13)

(14)

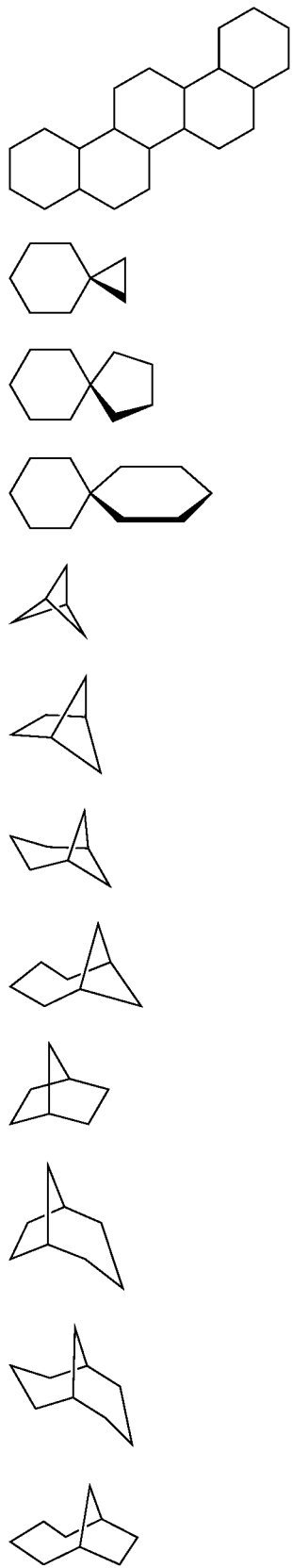
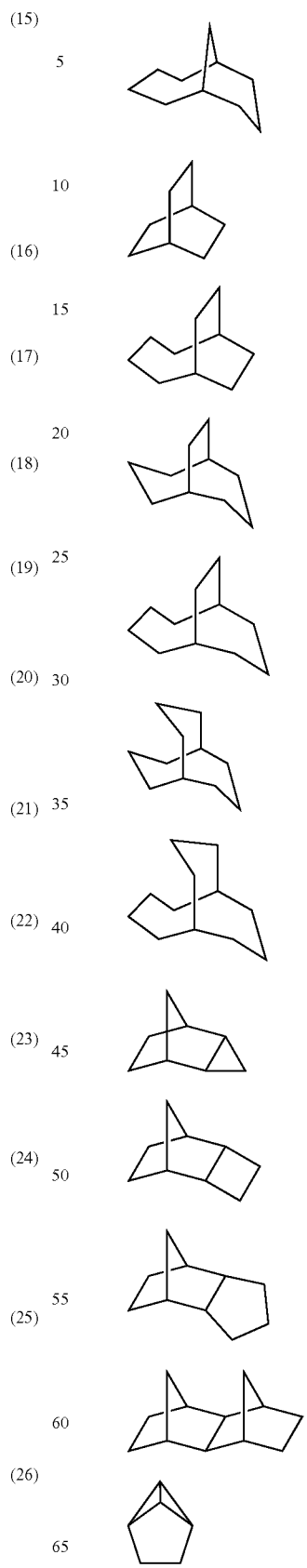

-continued

(39) 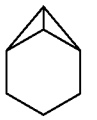

(40) 

(41) 

(42) 

(43) 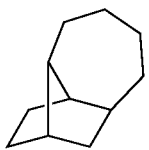

(44) 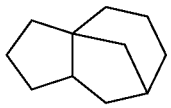

(45) 

(46) 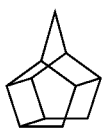

(47) 

(48) 

(49) 

(50) 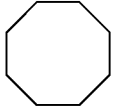

Preferred examples of the alicyclic moieties in the invention include adamantyl, noradamantyl, decalin residues, tricyclodecanyl, tetracyclododecanyl, norbornyl, cedrol, cyclohexyl, cycloheptyl, cyclooctyl, cyclodecanyl, and cyclododecanyl. More preferred are adamantyl, decalin residues, norbornyl, cedrol, cyclohexyl, cycloheptyl, cyclooctyl, cyclodecanyl, and cyclododecanyl.

Examples of the substituents of those alicyclic hydrocarbon groups include alkyl groups, substituted alkyl groups, halogen atoms, hydroxyl, alkoxy groups, carboxyl, and alkoxycarbonyl groups. The alkyl groups preferably are lower alkyl groups such as methyl, ethyl, propyl, isopropyl, and butyl. More preferred are one or more substituents selected from the group consisting of methyl, ethyl, propyl, and isopropyl. Examples of substituents of the substituted alkyl groups include hydroxyl, halogen atoms, and alkoxy groups. Examples of those alkoxy groups include ones having 1 to 4 carbon atoms, such as methoxy, ethoxy, propoxy, and butoxy.

The structures represented by general formulae (pI) to (pVI) in the resins can be used for the protection of alkali-soluble groups. Examples of the alkali-soluble groups include various groups known in this technical field.

Specific examples thereof include a carboxy group, sulfo group, phenol group, and thiol group. Preferred are carboxy and sulfo.

Preferred examples of alkali-soluble groups (acid-dissociable groups) protected by any of the structures represented by general formulae (pI) to (pVI) include groups represented by the following general formulae (pVII) to (pXI).

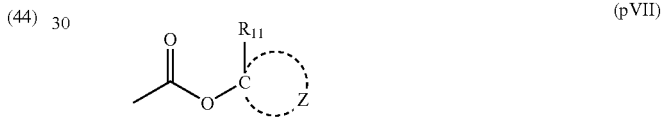
(pVII)

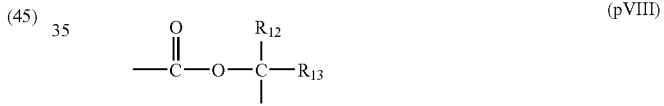
(pVIII)

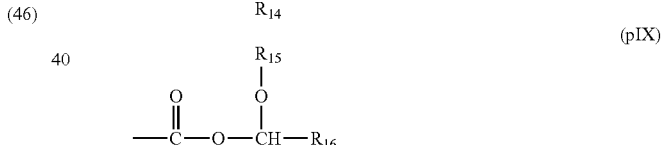
(pIX)

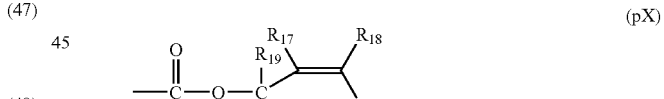
(pX)

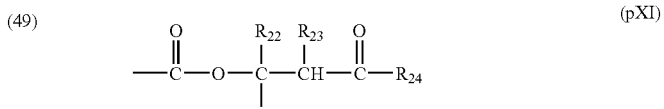
(pXI)

In the formulae, $R_{11}$ to $R_{25}$ and Z are the same as defined above.

The resins to be used in the invention preferably contain repeating units each having an alkali-soluble group protected by a group having an alicyclic structure and represented by any of general formulae (pI) to (pVI). Namely, the resins preferably contain repeating units each having both an alicyclic structure and an acid-dissociable group.

Examples of such repeating units include repeating units represented by the following general formula (pA).

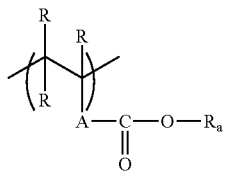

(pA)

In the formula, R represents a hydrogen atom, a halogen atom, or a substituted or unsubstituted-, linear or branched alkyl group having 1 to 4 carbon atoms, provided that the R's may be the same or different.

A is a single bond or represents one group or a combination of two or more groups selected from the group consisting of alkylene, substituted alkylene, ether, thioether, carbonyl, ester, amide, sulfonamide, urethane, and urea groups.

$R_a$ represents a group represented by any of formulae (pI) to (pVI).

Examples of monomers corresponding to the repeating units represented by general formula (pA) are shown below.

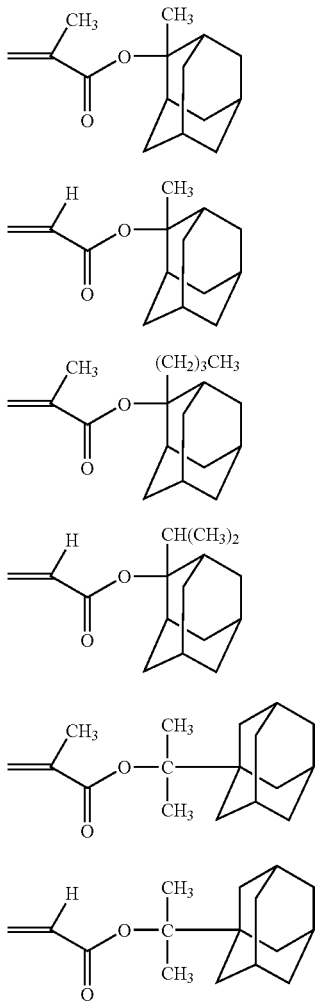

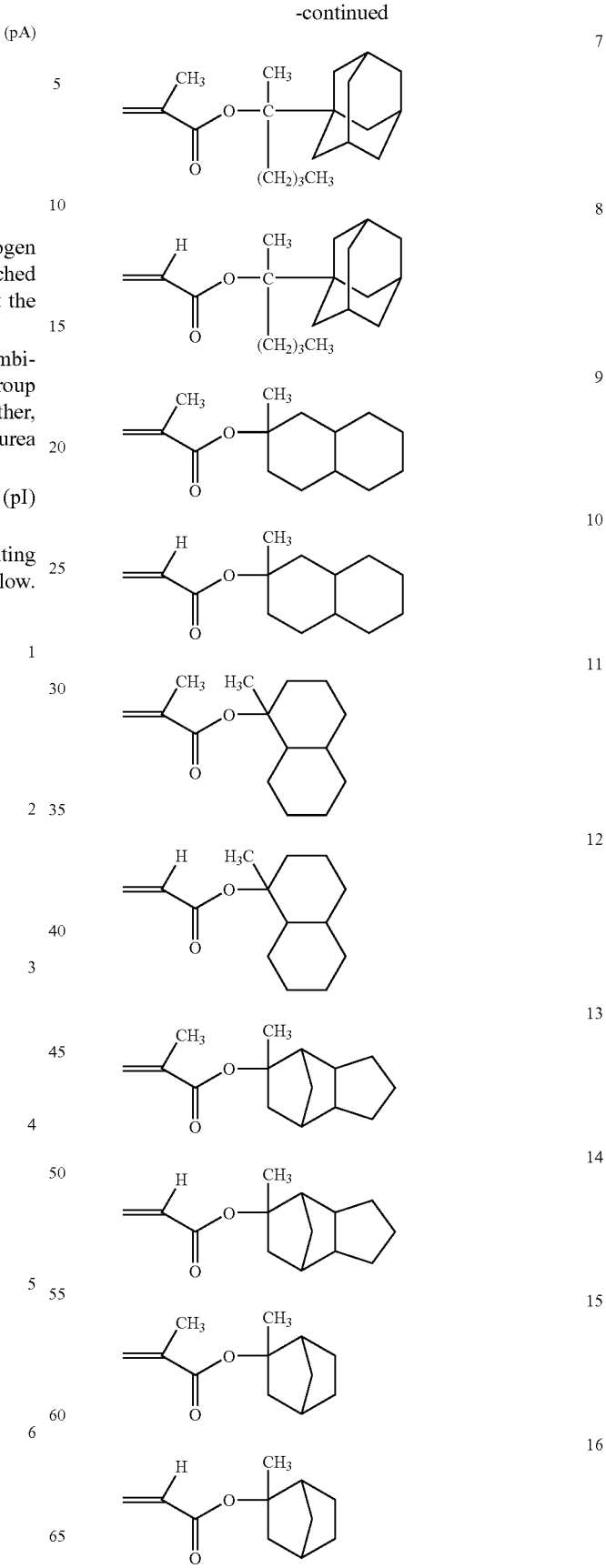

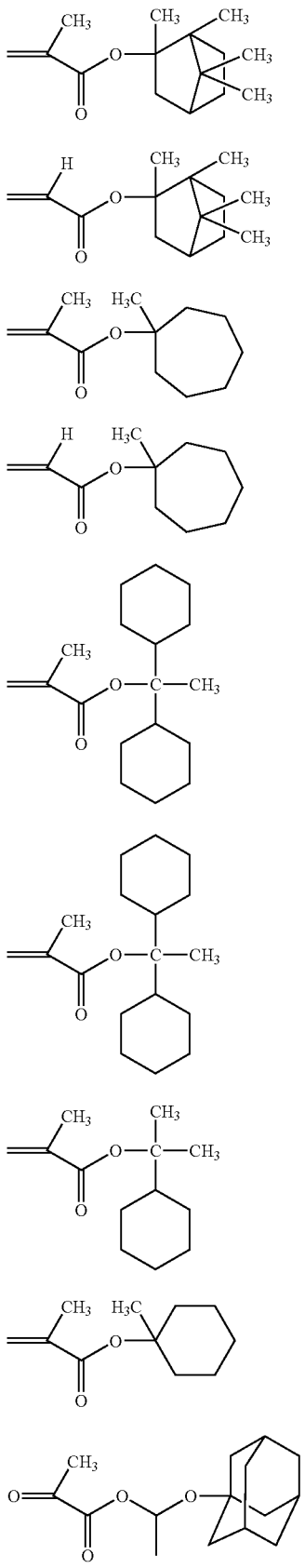
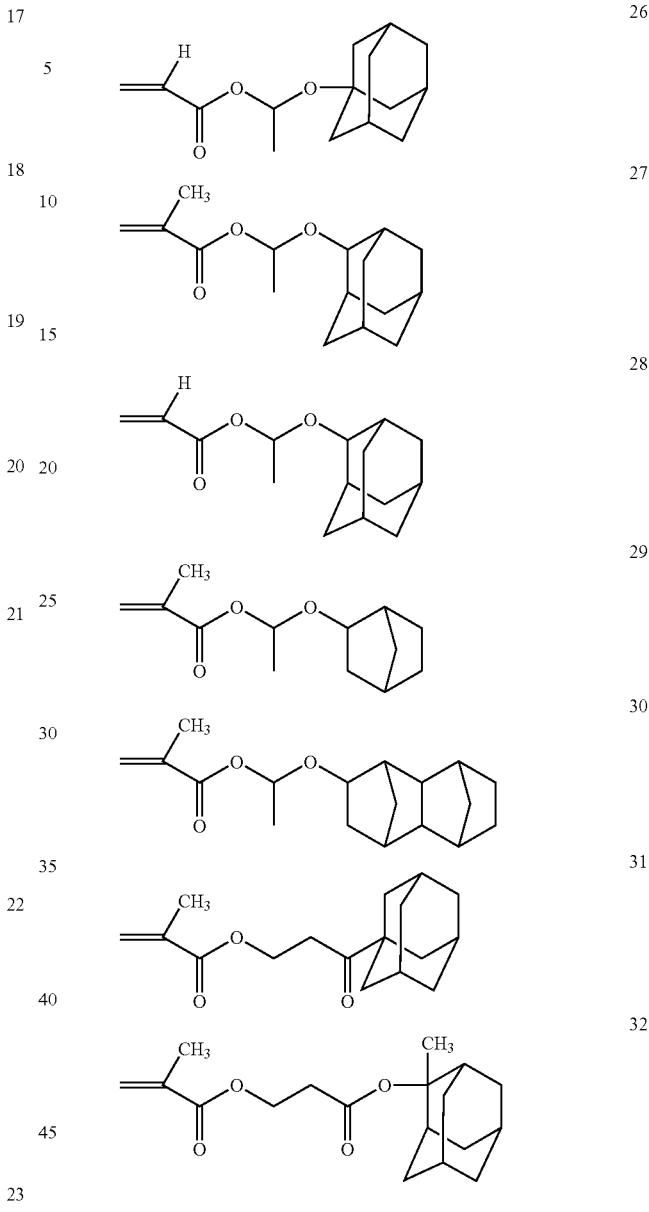

In the resins according to the invention, the acid-dissociable groups may be contained in repeating units having a partial structure which contains one or more alicyclic hydrocarbon groups and is represented by any of general formulae (pI) to (pVI). Alternatively, the acid-dissociable groups may be contained in at least one kind of repeating units among the repeating units derived from the comonomer ingredients which will be described later.

Besides the alkali-soluble groups (acid-dissociable groups) protected by the structures represented by general formulae (pI) to (pVI), examples of the structure of the acid-dissociable groups include ones represented by —C(=O)—X$_1$—R$_0$.

Examples of R$_0$ in the formula include tertiary alkyl groups such as t-butyl and t-amyl, isobornyl, 1-alkoxyethyl groups such as 1-ethoxyethyl, 1-butoxyethyl, 1-isobutoxyethyl, and 1-cyclohexyloxyethyl, alkoxymethyl groups such as 1-methoxymethyl and 1-ethoxymethyl, 3-oxoalkyl groups, tetrahydropyranyl, tetrahydrofuranyl, trialkylsilyl ester groups, 3-oxocyclohexyl ester groups, 2-methyl-2-adamantyl, and mevalonolactone residues. $X_1$ represents an oxygen atom, sulfur atom, —NH—, —NHSO$_2$—, or —NHSO$_2$NH—.

The resins preferably contain repeating units having a group represented by the following general formula (I).

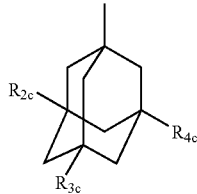
(I)

In general formula (I), $R_{2c}$ to $R_{4c}$ each independently represent a hydrogen atom or hydroxyl, provided that at least one of $R_{2c}$ to $R_{4c}$ represents hydroxyl.

The group represented by general formula (I) preferably has two hydroxyl groups or one hydroxyl group, and especially preferably has two hydroxyl groups.

Examples of the repeating units having a group represented by general formula (I) include repeating units represented by the following general formula (AII).

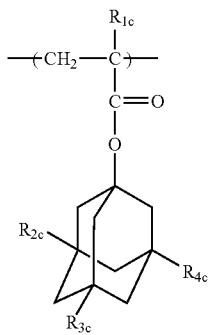
(A11)

In general formula (AII), $R_{1c}$ represents a hydrogen atom or methyl.

$R_{2c}$ to $R_{4c}$ each independently represent a hydrogen atom or hydroxyl, provided that at least one of $R_{2c}$ to $R_{4c}$ represents hydroxyl.

Specific examples of the repeating units represented by general formula (AII) are shown below, but the repeating units should not be construed as being limited to these examples.

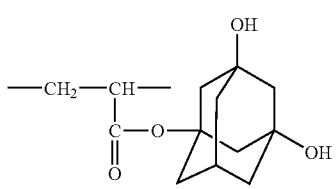
(1)

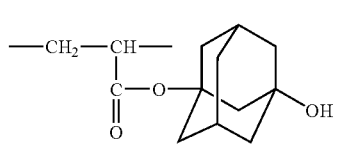
(2)

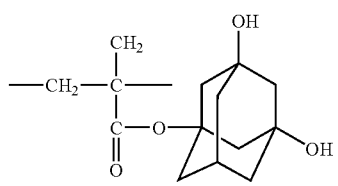
(3)

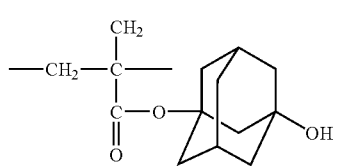
(4)

In the invention, it is especially preferred that at least one of the two resins should contain at least either of repeating units represented by the following general formula (A1) and repeating units represented by the following general formula (A2).

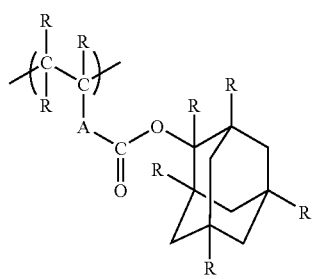
(A1)

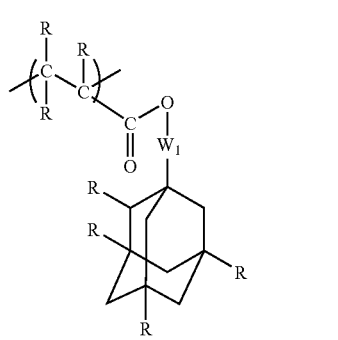
(A2)

R represents a hydrogen atom, hydroxyl, halogen atom, or alkyl group having 1 to 4 carbon atoms (preferably methyl or ethyl). The R's may be the same or different.

A is a single bond or represents one group or a combination of two or more groups selected from the group consisting of alkylene, ether, thioether, carbonyl, ester, amide, sulfonamide, urethane, and urea groups.

$W_1$ represents an alkylene group.

Examples of the alkylene groups represented by or contained in A and $W_1$ include groups represented by the following formula.

—[C(Rf)(Rg)]$_{r1}$—

In the formula, Rf and Rg may be the same or different and each represent a hydrogen atom, alkyl group, substituted alkylgroup, halogenatom, hydroxyl, oralkoxygroup. Preferred examples of the alkyl group include lower alkyl groups such asmethyl, ethyl, propyl, isopropyl, and butyl. More preferably, the alkyl group is one selected from methyl, ethyl, propyl, and isopropyl. Examples of the substituent(s) of the substituted alkyl group include hydroxyl, halogen atoms, and alkoxy groups. Examples of the alkoxy groups include ones having 1 to 4 carbon atoms, such as methoxy, ethoxy, propoxy, and butoxy. Examples of the halogen atoms include chlorine, bromine, fluorine, and iodine atoms. Symbol $r_1$ is an integer of 1 to 10.

Examples of the repeating units represented by general formulae (A1) and (A2) are shown below in terms of corresponding monomers. However, the repeating units should not be construed as being limited to these examples.

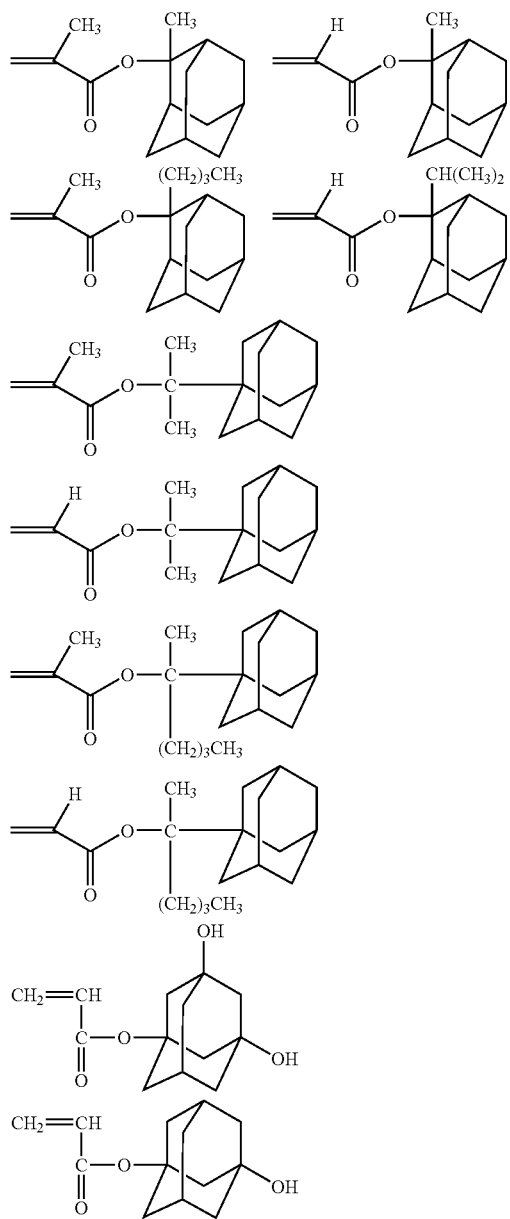

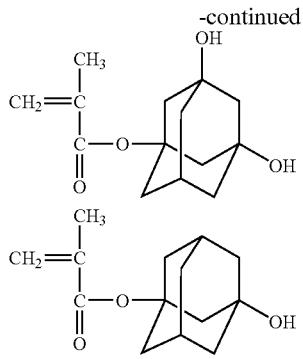

The resins may further contain repeating units having a lactone structure and represented by the following general formula (IV).

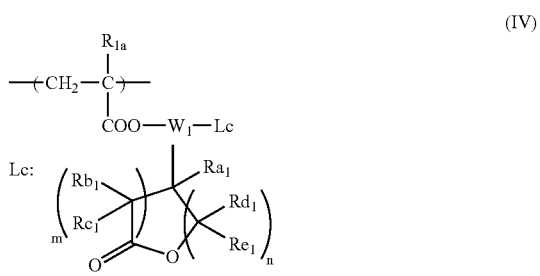

(IV)

In general formula (IV), $R_{1a}$ represents a hydrogen atom or methyl.

$W_1$ is a single bond or represents one group or a combination of two or more groups selected from the group consisting of alkylene, ether, thioether, carbonyl, and ester groups.

$Ra_1$, $Rb_1$, $Rc_1$, $Rd_1$, and $Re_1$ each independently represent a hydrogen atom or an alkyl group having 1 to 4 carbon atoms. Symbols m and n each independently represent an integer of 0 to 3, provided that m+n is from 2 to 6.

Examples of the alkyl groups having 1 to 4 carbon atoms represented by $Ra_1$ to $Re_1$ include methyl, ethyl, propyl, isopropyl, n-butyl, isobutyl, sec-butyl, and t-butyl.

Examples of the alkylene group represented by or contained in $W_1$ in general formula (IV) include groups represented by the following formula.

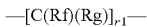
—[C(Rf)(Rg)]$_{r1}$—

In the formula, Rf and Rg may be the same or different and each represent a hydrogen atom, alkyl group, substituted alkylgroup, halogenatom, hydroxyl, oralkoxygroup. Preferred examples of the alkyl group include lower alkyl groups such asmethyl, ethyl, propyl, isopropyl, and butyl. More preferably, the alkyl group is one selected from methyl, ethyl, propyl, and isopropyl. Examples of the substituent(s) of the substituted alkyl group include hydroxyl, halogen atoms, and alkoxy groups. Examples of the alkoxy groups include ones having 1 to 4 carbon atoms, such as methoxy, ethoxy, propoxy, and butoxy. Examples of the halogen atoms include chlorine, bromine, fluorine, and iodine atoms. Symbol $r_1$ is an integer of 1 to 10.

The alkyl groups may have one or more substituents, examples of which include carboxyl, acyloxy groups, cyano, alkyl groups, substituted alkyl groups, halogen atoms, hydroxyl, alkoxy groups, substituted alkoxy groups, acetylamide groups, alkoxycarbonyl groups, and acyl groups.

Examples of the alkyl groups include lower alkyl groups such as methyl, ethyl, propyl, isopropyl, butyl, cyclopropyl, cyclobutyl, and cyclopentyl. Examples of the substituent(s) of the substituted alkyl groups include hydroxyl, halogen atoms, and alkoxy groups. Examples of the substituent(s) of the substituted alkoxy groups include alkoxy groups. Examples of the alkoxy groups include ones having 1 to 4 carbon atoms, such as methoxy, ethoxy, propoxy, and butoxy. Examples of the acyloxy groups include acetoxy. Examples of the halogen atoms include chlorine, bromine, fluorine, and iodine atoms.

Examples of monomers corresponding to the repeating units represented by general formula (IV) are shown below, but the monomers should not be construed as being limited to these examples.

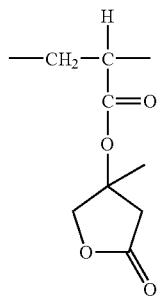
(IV-1)

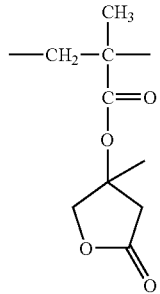
(IV-2)

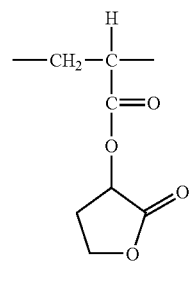
(IV-3)

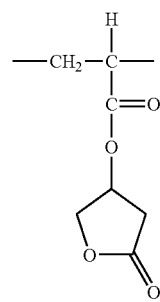
(IV-4)

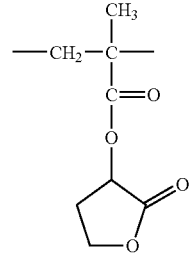
(IV-5)

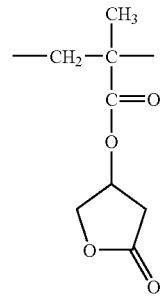
(IV-6)

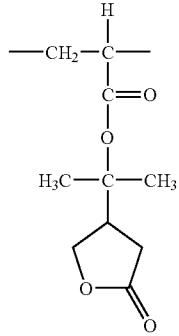
(IV-7)

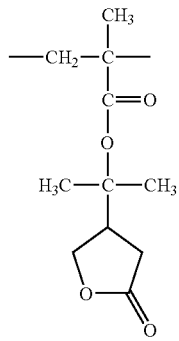
(IV-8)

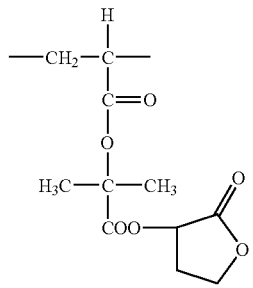
(IV-9)

(IV-10) 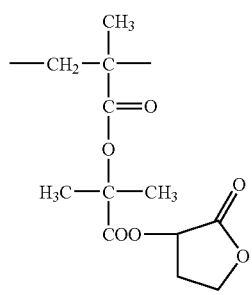
(IV-11) 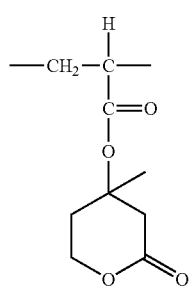
(IV-12) 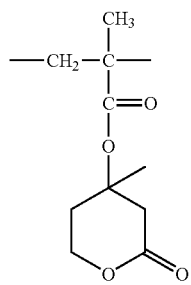
(IV-13) 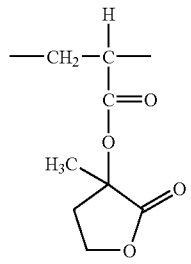
(IV-14) 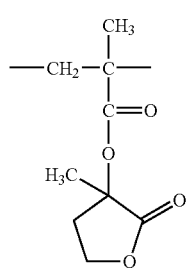
(IV-15) 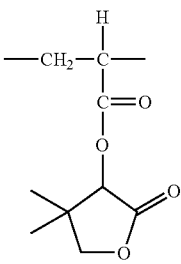
(IV-16) 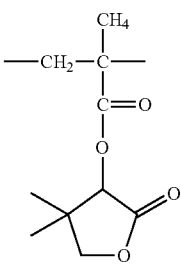
(IV-17) 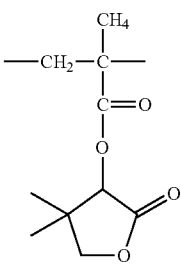
(IV-18) 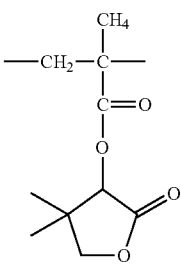
(IV-19) 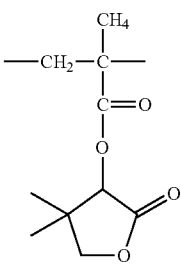

(IV-20) 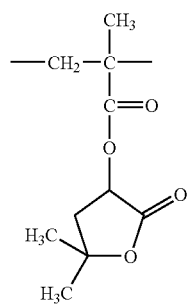
(IV-21) 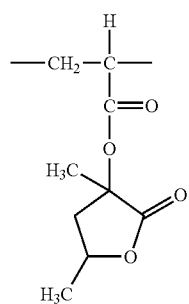
(IV-22) 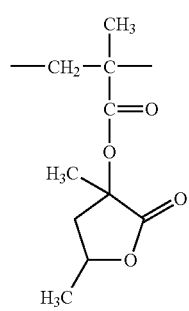
(IV-23) 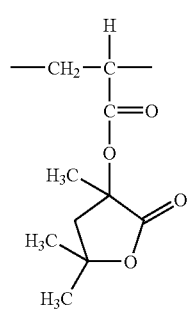
(IV-24) 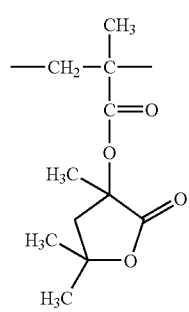
(IV-25) 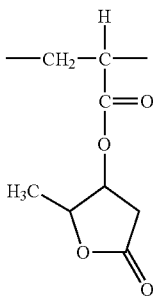
(IV-26) 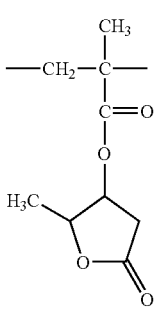
(IV-27) 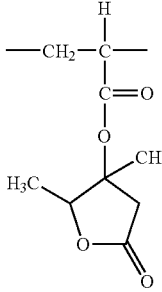
(IV-28) 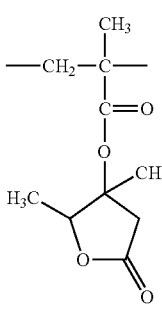
(IV-29) 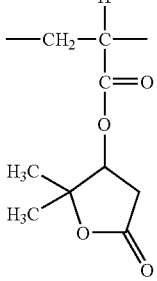

(IV-30)
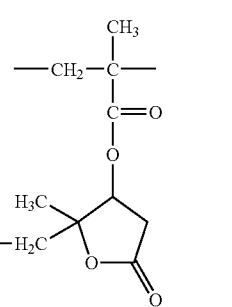

(IV-35)
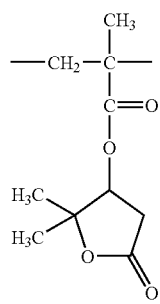

(IV-31)
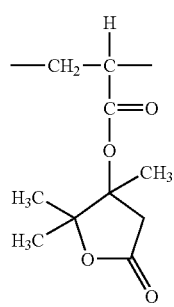

(IV-36)
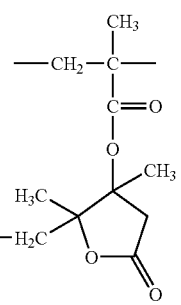

Preferred of those examples of general formula (IV) are (IV-17) to (IV-36) from the standpoint of attaining better exposure margin.

The structure of general formula (IV) preferably is one having an acrylate structure, from the standpoint of attaining satisfactory results concerning edge roughness.

The resins may further contain repeating units having a group represented by any of the following general formulae (V-1) to (V-4).

(IV-32)
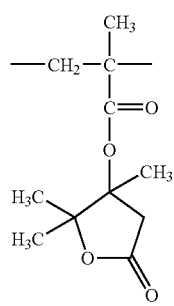

(V-1)
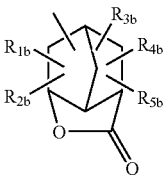

(IV-33)
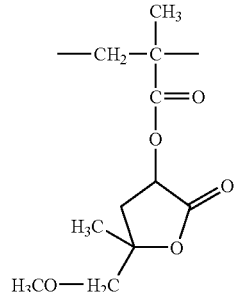

(V-2)
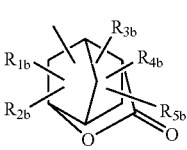

(IV-34)
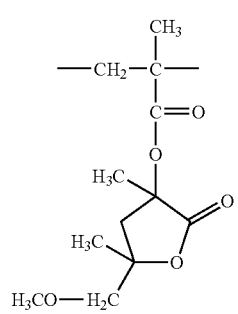

(V-3)
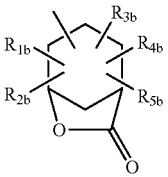

(V-4)
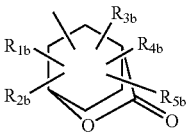

In general formulae (V-1) to (V-4), $R_{1b}$ to $R_{5b}$ each independently represent a hydrogen atom or an alkyl, cycloalkyl, or alkenyl group which may have one or more substituents, provided that two of $R_{1b}$ to $R_{5b}$ may be bonded to each other to form a ring.

Examples of the alkyl groups represented by $R_{1b}$ to $R_{5b}$ in general formulae (V-1) to (V-4) include linear or branched alkyl groups which may have one or more substituents.

The linear or branched alkyl groups are preferably linear or branched alkyl groups having 1 to 12 carbon atoms, more preferably linear or branched alkyl groups having 1 to 10 carbon atoms. Even more preferably, the alkyl groups are methyl, ethyl, propyl, isopropyl, n-butyl, isobutyl, sec-butyl, t-butyl, pentyl, hexyl, heptyl, octyl, nonyl, and decyl.

Preferred examples of the cycloalkyl groups represented by $R_{1b}$ to $R_{5b}$ include ones having 3 to 8 carbon atoms, such as cyclopropyl, cyclopentyl, cyclohexyl, cycloheptyl, and cyclooctyl.

Preferred examples of the alkenyl groups represented by $R_{1b}$ to $R_{5b}$ include ones having 2 to 6 carbon atoms, such as vinyl, propenyl, butenyl, and hexenyl.

Examples of the ring formed by the bonding of two of $R_{1b}$ to $R_{5b}$ include 3- to 8-membered rings such as cyclopropane, cyclobutane, cyclopentane, cyclohexane, and cyclooctane rings.

In general formulae (V-1) to (V-4), $R_{1b}$ to $R_{5b}$ each may be bonded to any of the carbon atoms constituting the ring framework.

Preferred examples of the substituents which may be possessed by the alkyl, cycloalkyl, and alkenyl groups include alkoxy groups having 1 to 4 carbon atoms, halogen atoms (fluorine, chlorine, bromine, and iodine atoms), acyl groups having 2 to 5 carbon atoms, acyloxy groups having 2 to 5 carbon atoms, cyano, hydroxyl, carboxy, alkoxycarbonyl groups having 2 to 5 carbon atoms, and nitro.

Examples of the repeating units having a group represented by any of general formulae (V-1) to (V-4) include repeating units represented by the following general formula (AI).

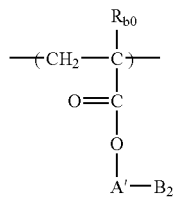

(AI)

In general formula (AI), $R_{b0}$ represents a hydrogen atom, a halogen atom, or a substituted or unsubstituted alkyl group having 1 to 4 carbon atoms. Preferred examples of the substituent(s) which may be possessed by the alkyl group represented by $R_{b0}$ include the substituents enumerated above as preferred examples of the substituents which may be possessed by the alkyl group represented by $R_{1b}$ in general formulae (V-1) to (V-4).

Examples of the halogen atom represented by $R_{b0}$ include fluorine, chlorine, bromine, and iodine atoms. Preferably, $R_{b0}$ is a hydrogen atom.

A' is a single bond or represents an ether, ester, carbonyl, or alkylene group or a bivalent group consisting of a combination of two or more of these.

$B_2$ represents a group represented by any of general formulae (V-1) to (V-4). Examples of the bivalent group represented by A' consisting of a combination of two or more groups include the following groups.

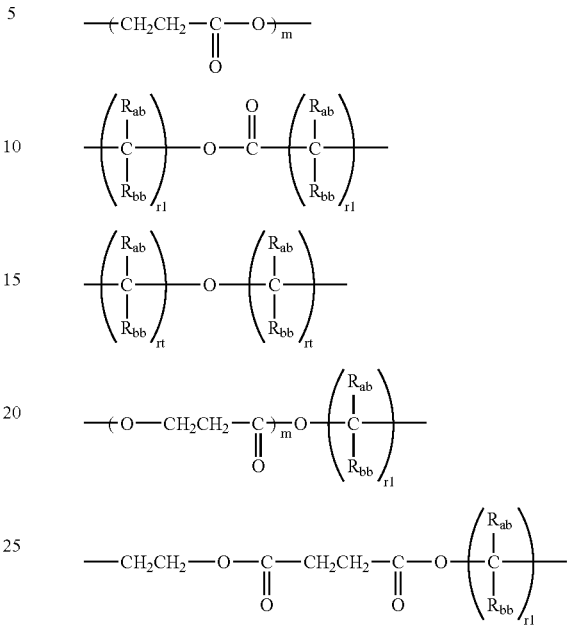

In the formulae given above, $R_{ab}$ and $R_{bb}$ may be the same or different and each represent a hydrogen atom, alkyl group, substituted alkyl group, halogen atom, hydroxyl, or alkoxy group.

Preferred examples of the alkyl group include lower alkyl groups such as methyl, ethyl, propyl, isopropyl, and butyl. More preferably, the alkyl group is one selected from methyl, ethyl, propyl, and isopropyl. Examples of the substituent (s) of the substituted alkyl group include hydroxyl, halogen atoms, and alkoxy groups having 1 to 4 carbon atoms.

Examples of the alkoxy group include ones having 1 to 4 carbon atoms, such as methoxy, ethoxy, propoxy, and butoxy. Examples of the halogen atom include chlorine, bromine, fluorine, and iodine atoms. Symbol r1 represents an integer of 1 to 10, preferably an integer of 1 to 4. Symbol m represents an integer of 1 to 3, preferably 1 or 2.

Examples of the repeating units represented by general formula (AI) are given below, but these examples should not be construed as limiting the contents of the invention.

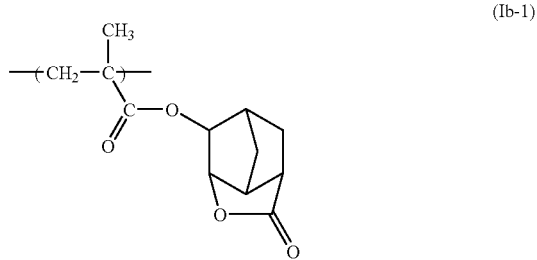

(Ib-1)

-continued
(Ib-2)
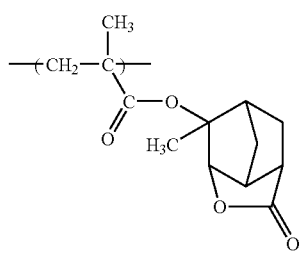
(Ib-3)
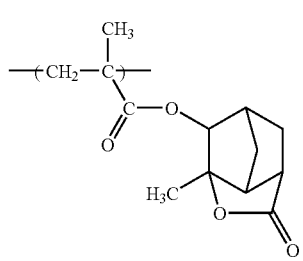
(Ib-4)
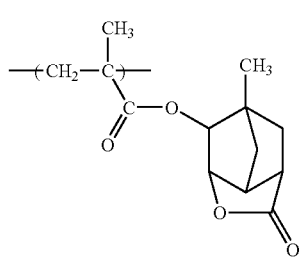
(Ib-5)
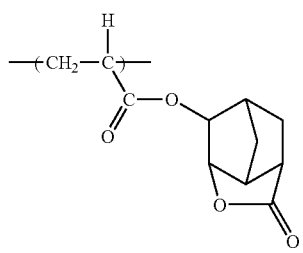
(Ib-6)
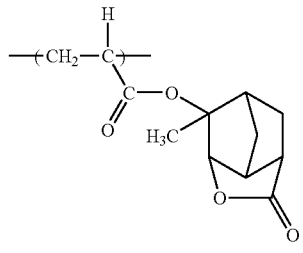
(Ib-7)
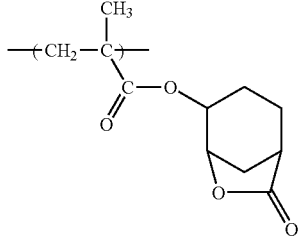
-continued
(Ib-8)
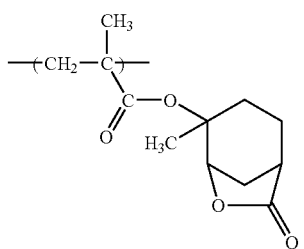
(Ib-9)
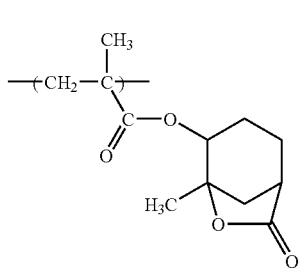
(Ib-10)
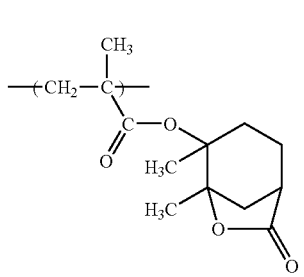
(Ib-11)
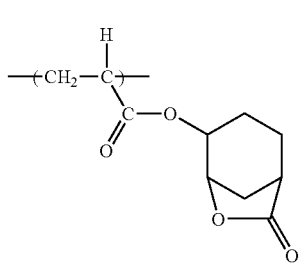
(Ib-12)
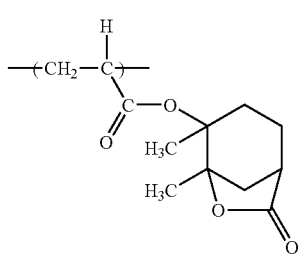
(Ib-13)
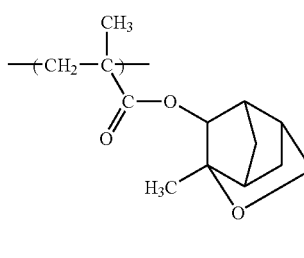

-continued
(Ib-14)
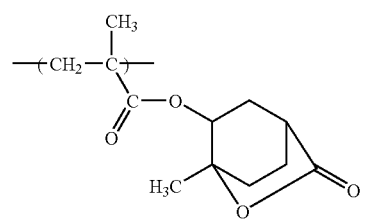
(Ib-15)
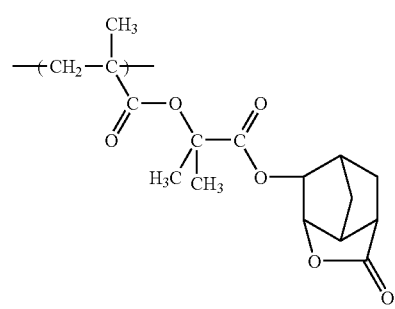
(Ib-16)
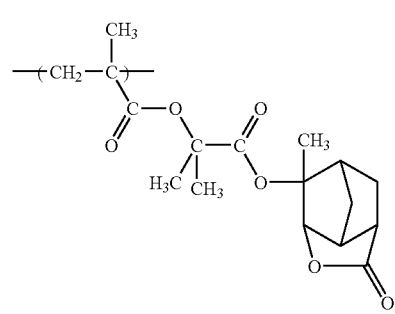
(Ib-17)
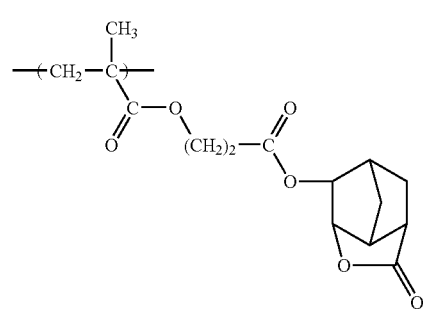
(Ib-18)
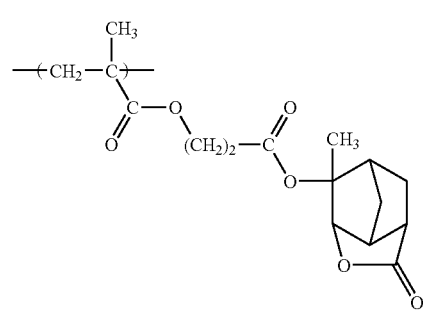
-continued
(Ib-19)
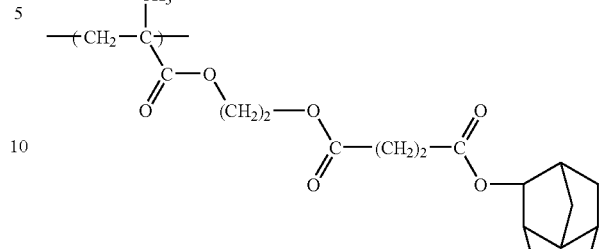
(Ib-20)
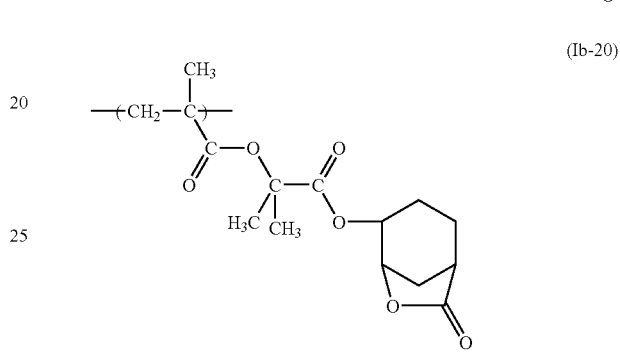
(Ib-21)
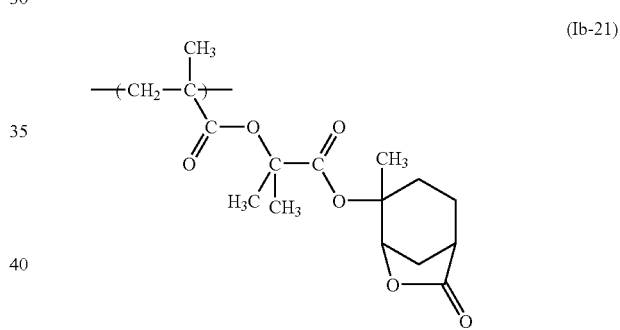
(Ib-22)
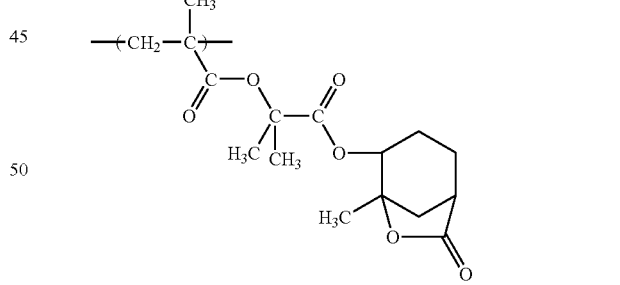
(Ib-23)
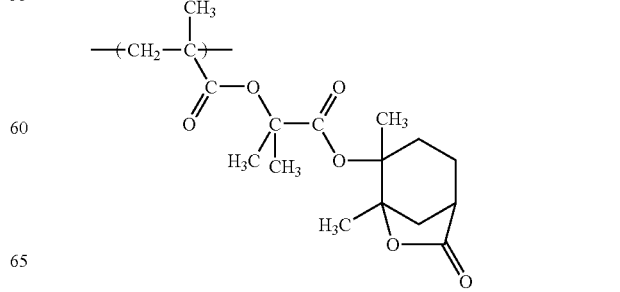

-continued

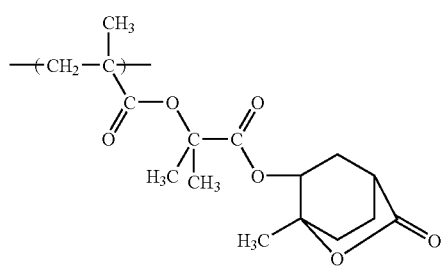
(Ib-24)

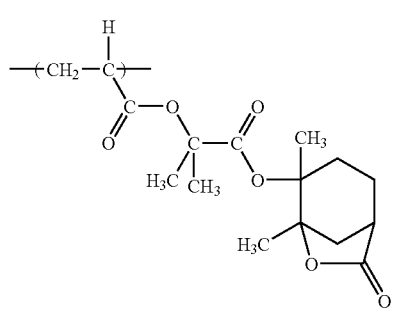
(Ib-25)

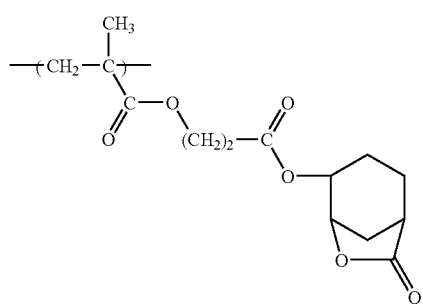
(Ib-26)

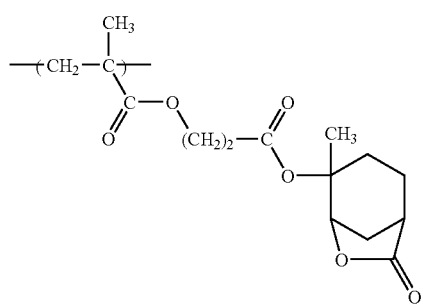
(Ib-27)

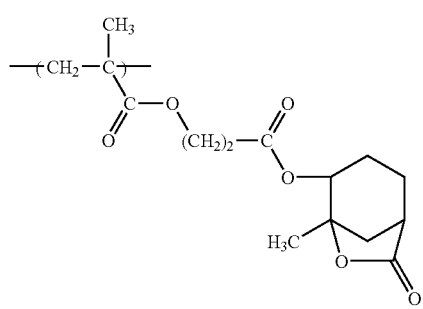
(Ib-28)

-continued (Ib-29)

(Ib-30)

(Ib-31)

The resins may further contain repeating units represented by the following general formula (VI).

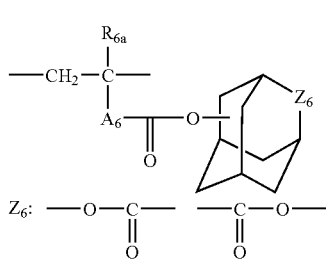
(VI)

In general formula (VI), $A_6$ is a single bond or represents one group or a combination of two or more groups selected from the group consisting of alkylene, cycloalkylene, ether, thioether, carbonyl, and ester groups.

$R_{6a}$ represents a hydrogen atom, alkyl group having 1 to 4 carbon atoms, cyano, or halogen atom.

Examples of the alkylene group represented by or contained in $A_6$ in general formula (VI) include groups represented by the following formula.

$$—[C(Rnf)(Rng)]_r—$$

In the formula, Rnf and Rng may be the same or different and each represent a hydrogen atom, alkyl group, substituted alkyl group, halogenatom, hydroxyl, oralkoxygroup. Preferred examples of the alkyl group include lower alkyl groups such asmethyl, ethyl, propyl, isopropyl, and butyl. More preferably, the alkyl group is one selected from methyl, ethyl, propyl, and isopropyl. Examples of the substituent(s) of the substituted alkyl group include hydroxyl, halogen atoms, and alkoxy groups. Examples of the alkoxy groups include ones having 1 to 4 carbon atoms, such as methoxy, ethoxy, propoxy, and butoxy. Examples of the halogen atoms include chlorine, bromine, fluorine, and iodine atoms. Symbol r is an integer of 1 to 10.

Examples of the cycloalkylene group represented by or contained in $A_6$ in general formula (VI) include ones having 3 to 10 carbon atoms. Specific examples thereof include cyclopentylene, cyclohexylene, and cyclooctylene.

The bridged alicycle containing $Z_6$ may have one or more substituents. Examples of the substituents include halogen atoms, alkoxy groups (preferably having 1 to 4 carbon atoms), alkoxycarbonyl groups (preferably having 1 to 5 carbon atoms), acyl groups (e.g., formyl and benzoyl), acyloxy groups (e.g., propylcarbonyloxy and benzoyloxy), alkyl groups (preferably having 1 to 4 carbon atoms), carboxyl, hydroxyl, and alkylsulfonylsulfamoyl groups (e.g., —CONHSO$_2$CH$_3$). The alkyl groups as substituents may be further substituted with one or more substituents selected from, for example, hydroxyl, halogen atoms, and alkoxy groups (preferably having 1 to 4 carbon atoms).

In general formula (VI), one of the oxygen atoms of the ester group bonded to $A_6$ may be bonded to any of the carbon atoms constituting the bridged alicyclic structure containing $Z_6$.

Examples of the repeating units represented by general formula (VI) are given below, but the repeating units should not be construed as being limited to these examples.

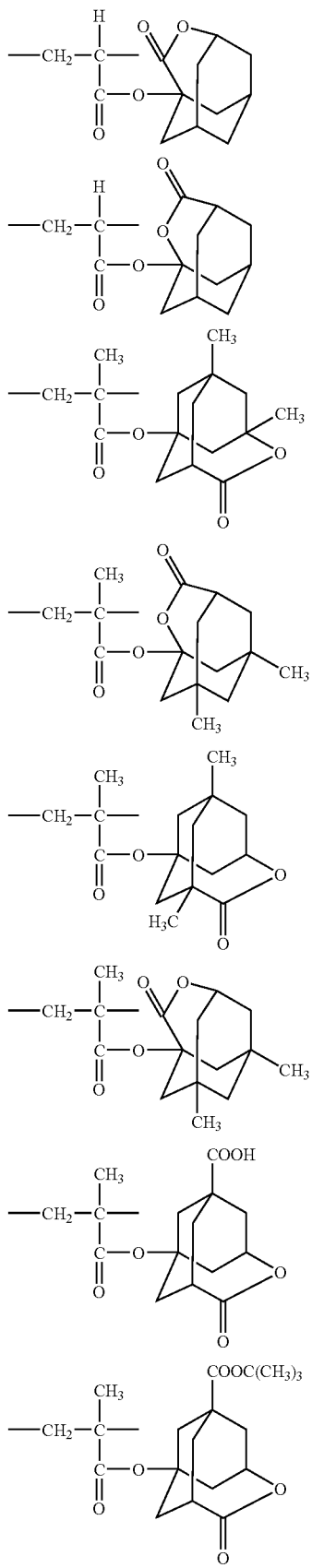

-continued

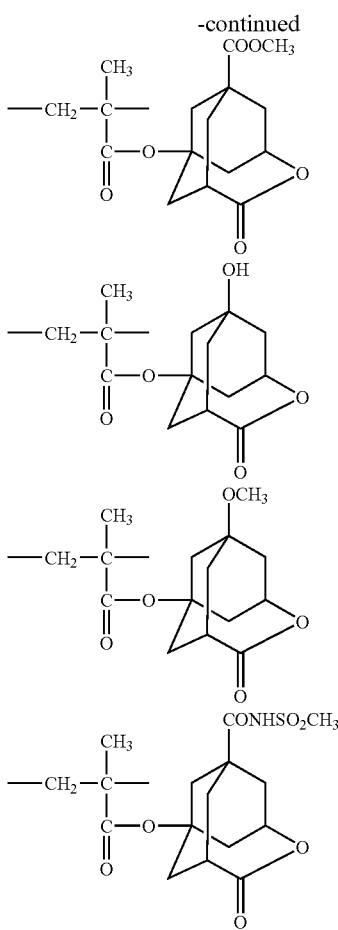

The resins can contain various repeating units besides the repeating units described above for the purpose of regulating resistance to dry etching, suitability for standard developers, adhesion to substrates, resist profile, and properties generally required of resists, such as resolution, heat resistance, and sensitivity.

Examples of such repeating units include the repeating units corresponding to the monomers shown below. However, the repeating units should not be construed as being limited to these examples.

Thus, the performances required of the resins, in particular, (1) solubility in solvents for coating fluid preparation, (2) film-forming properties (glass transition point), (3) alkali developability, (4) resist loss (hydrophilicity/hydrophobicity, selection of alkali-soluble groups), (5) adhesion of unexposed areas to substrates, (6) resistance to dry etching, and the like, can be finely regulated.

Examples of such monomers include compounds having one addition-polymerizable unsaturated bond, such as acrylic esters, methacrylic esters, acrylamideandderivatives thereof, methacrylamide and derivatives thereof, allyl compounds, vinyl ethers, and vinyl esters.

Specific examples of the monomers include the following.

Acrylic Esters (preferably, alkyl acrylates in which the alkyl group has 1 to 10 carbon atoms):

Methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl-acrylate, trimethylolpropane monoacrylate, pentaerythritol monoacrylate, benzyl acrylate, methoxybenzyl acrylate, furfuryl acrylate, and tetrahydrofurfuryl acrylate.

Methacrylic Esters (preferably, alkyl methacrylates in which the alkyl group has 1 to 10 carbon atoms):

Methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, and tetrahydrofurfuryl methacrylate.

Acrylamide and Derivatives:

Acrylamide, N-alkylacrylamides (examples of the alkyl group include ones having 1 to 10 carbon atoms, such as methyl, ethyl, propyl, butyl, t-butyl, heptyl, octyl, cyclohexyl, and hydroxyethyl), N,N-dialkylacrylamides (examples of each alkyl group include ones having 1 to 10 carbon atoms, such as methyl, ethyl, butyl, isobutyl, ethylhexyl, and cyclohexyl), N-hydroxyethyl-N-methylacrylamide, and N-2-acetamidoethyl-N-acetylacrylamide.

Methacrylamide and Derivatives:

Methacrylamide, N-alkylmethacrylamides (examples of the alkyl group include ones having 1 to 10 carbon: atoms, such as methyl, ethyl, t-butyl, ethylhexyl, hydroxyethyl, and cyclohexyl), N,N-dialkylmethacrylamides (examples of each alkyl group include ethyl, propyl, and butyl), and N-hydroxyethyl-N-methylmethacrylamide.

Allyl Compounds:

Allyl esters (e.g., allyl acetate, allyl caproate, allylcaprylate,allyllaurate, allylpalmitate, allylstearate, allyl benzoate, allyl acetoacetate, and allyl lactate) and allyloxyethanol.

Vinyl Ethers:

Alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether).

Vinyl Esters:

Vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate, and vinyl cyclohexanecarboxylate.

Dialkyl Itaconates:

Dimethyl itaconate, diethyl itaconate, and dibutyl itaconate.

Dialkyl or Monoalkyl Esters of Fumaric Acid:

Dibutyl fumarate.

Other examples include crotonic acid, itaconic acid, maleicanhydride, maleimide, acrylonitrile, methacrylonitrile, and maleonitrile.

Furthermore, unsaturated compounds capable of undergoing addition polymerization with any of the aforementioned monomers corresponding various repeating units may have been copolymerized.

In each resin, the molar proportion of each kind of repeating units is suitably selected so as to regulate the resistance to dry etching, suitability for standard developers, adhesion to substrates, and profile of the resist and the performances generally required of resists, such as resolution, heat resistance, and sensitivity.

The content of the repeating units having an alicyclic structure is preferably from 30 to 100% by mole, more preferably from 35 to 100% by mole, even more preferably from 40 to 100% by mole, based on all repeating units constituting the resin.

The content of the repeating units having an acid-dissociable group is preferably from 15 to 70% by mole, more preferably from 20 to 65% by mole, even more preferably from 25 to 60% by mole, based on all repeating units constituting the resin.

The total amount of the repeating units which have a partial structure containing an alicyclic hydrocarbon group and represented by any of general formulae (pI) to (pVI) and the repeating units represented by general formulae (A1) and (A2) is preferably from 30 to 70% by mole, more preferably from 35 to 65% by mole, even more preferably from 40 to 60% by mole, based on all repeating units.

The content of the repeating units having a group represented by general formula (I) is preferably from 5 to 50% by mole, more preferably from 10 to 40% by mole, even more preferably from 15 to 35% by mole, based on all repeating units.

Furthermore, the content in each resin of repeating units derived from any of the aforementioned optional comonomer ingredients can also be suitably selected according to the desired resist performances.

In the case where the composition of the invention is for use in ArF exposure, it is preferred that the resins have no aromatic groups from the standpoint of transparency to ArF light.

The resins to be used in the invention can be synthesized by an ordinary method (e.g., radical polymerization). For example, a general synthesis method is as follows. Monomers are introduced into a reaction vessel either en bloc or during reaction, and dissolved in a reaction solvent according to need. This solvent, for example, is an ether such as tetrahydrofuran, 1,4-dioxane, or diisopropyl ether, a ketone such as methyl ethyl ketone or methyl isobutyl ketone, an ester solvent such as ethyl acetate, or the solvent described later in which the composition of the invention dissolves, such as propylene glycol monomethyl ether acetate. Thus, a homogeneous solution is obtained. Thereafter, in an inert gas atmosphere, e.g., nitrogen or argon, a commercial free-radical initiator (e.g., an azo initiator or peroxide) is used to initiate polymerization optionally with heating. According to need, the initiator may be introduced additionally or portionwise. After completion of the reaction, the reaction mixture is poured into a solvent and the target polymer is recovered by a method for powder or solid recovery, etc.

The concentration of the reactants is generally 20% by weight or higher, preferably 30% by weight or higher, more preferably 40% by weight or higher. The reaction temperature is generally from 10 to 150° C., preferably from 30 to 120° C., more preferably from 50 to 100° C.

The various kinds of repeating structural units examples of which were shown above may be used alone, or a mixture of two or more thereof may be used.

The weight-average molecular weight of each resin according to the invention is preferably from 1,000 to 200,000, more preferably from 3,000 to 20,000, in terms of weight-average molecular weight measured by GPC and calculated for standard polystyrene. Weight-average molecular weights thereof lower than 1,000 tend to result in impaired heat resistance and impaired resistance to dry etching. Weight-average molecular weights thereof exceeding 200,000 tend to result in impaired developability and an exceedingly heightened viscosity, which leads to impaired film-forming properties.

The dispersity ratio ($M_w/M_n$) of each resin to be used is generally from 1 to 10, preferably from 1 to 5, more preferably from 1 to 4. The smaller the dispersity ratio, the better the resolution, resist shape, resist pattern wall smoothness, and non-roughness properties.

The two resins contained in the resist composition of the invention are resins which differ in $T_g$ by at least 5° C., preferably from 5 to 70° C., especially preferably from 10 to 50° C.

Desired values of $T_g$ are obtained by suitably selecting monomer kinds, molecular weights, and dispersity ratios. For example, increasing the proportion of acrylic repeating units in a resin results in a lowered $T_g$, while increasing the proportion of methacrylic repeating units results in an elevated $T_g$. Furthermore, increasing the proportion of repeating units having an alicyclic structure or increasing themolecular weight results in an elevated $T_g$.

In the two resins contained in the resist composition of the invention, the proportion of the resin having a higher $T_g$ is preferably from 5 to 95% by weight, more preferably from 10 to 90% by weight, especially preferably from 20 to 80% by weight, based on the sum of the two resins.

In the two resins contained in the resist composition of the invention, the proportion of the resin having a higher $T_g$ is preferably from 5 to 95% by weight, more preferably from 10 to 90% by weight, especially preferably from 20 to 80% by weight, based on the sum of the two resins.

The sum of the two resins is preferably from 50 to 100% by weight, more preferably from 70 to 100% by weight, based on the total amount of all resins contained in the resist composition of the invention.

It is preferred that the two resins each should comprise repeating units derived from an acrylic acid derivative monomer and repeating units derived from a methacrylic acid derivative monomer and the difference between the two resins in the molar proportion of the repeating units derived from an acrylic acid derivative monomer should be from 20 to 95% by mole.

It is also preferred that of the two resins, one resin 1 should have a glass transition temperature lower than 140° C. and the other resin 2 should have a glass transition temperature of from 140° C. to lower than 180° C.

Furthermore, one of the two resins preferably is a resin which contains no repeating units derived from a methacrylic acid derivative monomer and the other preferably is a resin comprising both repeating units derived from an acrylic acid derivative monomer and repeating units derived from a methacrylic acid derivative monomer.

It is further preferred that at least one of the two resins should comprise at least either of repeating units derived from a dihydroxyadamantyl methacrylate monomer and repeating units derived from a dihydroxyadamantyl acrylate monomer.

In the positive resist composition of the invention, the total amount of all resins is preferably from 40 to 99.99% by weight, more preferably from 50 to 99.97% by weight, based on all solid resist components.

[2] Compound Generating Acid upon Irradiation with Actinic Rays or Radiation (Ingredient B)

The composition of the invention contains a compound (photo-acid generator) which generates an acid upon irradiation with actinic rays or radiation.

The photo-acid generator to be used can be suitably selected from photoinitiators for cationic photopolymerization, photoinitiators for radical photopolymerization, photodecolorants or optical color changes for dyes, known compounds used in microresist formation or the like which generate an acid upon irradiation with actinic rays or radiation, and mixtures of two or more thereof.

Examples thereof include onium salts such as diazonium salts, ammonium salts, phosphonium salts, iodonium salts, sulfonium salts, selenonium salts, and arsonium salts, organohalogen compounds, organometallic compound/organic halide combinations, photo-acid generators having an o-nitrobenzyl type protective group, compounds which photodecompose to generate a sulfonic acid and are represented by iminosulfonates, and disulfone compounds.

A compound obtained by incorporating such a group or compound which generates an acid upon irradiation with actinic rays or radiation into the main chain or side chains of a polymer can be used. Such polymeric compounds are described in, e.g., U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Also usable are the compounds generating an acid by the action of light which are described in, e.g., U.S. Pat. No. 3,779,778 and European Patent 126,712.

Especially effective among those compounds which decompose upon irradiation with actinic rays or radiation to generate an acid are compounds represented by general formula (PAG1) or (PAG2). These compounds will be explained below.

(1) Compounds Represented by the following General Formula (PAG1) or Compounds Represented by the following General Formula (PAG2).

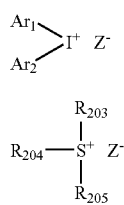

In the formulae, $Ar^1$ and $Ar^2$ each independently represent an aryl group. The aryl groups represented by $Ar^1$ and $Ar^2$ may have one or more substituents. Preferred examples of the substituents include alkyl groups, haloalkyl groups, cycloalkyl groups, aryl groups, alkoxy groups, nitro, carboxyl, alkoxycarbonyl groups, hydroxy, mercapto, and halogen atoms.

$R^{203}$, $R^{204}$, and $R^{205}$ each independently represent an alkyl or aryl group. The alkyl or aryl groups represented by $R^{203}$, $R^{204}$, and $R^{205}$ may have one or more substituents. Preferred examples thereof include aryl groups having 6 to 14 carbon atoms, alkyl groups having 1 to 8 carbon atoms, and substitution derivatives of these.

Preferred examples of substituents for the aryl groups include alkoxy groups having 1 to 8 carbon atoms, alkyl groups having 1 to 8 carbon atoms, nitro, carboxyl, hydroxy, and halogen atoms. Preferred examples of substituents for the alkyl groups include alkoxy groups having 1 to 8 carbon atoms, carboxyl, and alkoxycarbonyl groups.

$Z^-$ represents a counter anion, which is the same as the $Z^-$ in general formula (PAG6) which will be described later.

Two of $R^{203}$, $R^{204}$, and $R^{205}$ may be bonded to each other through a single bond or substituent of each. $Ar^1$ and $Ar^2$ may also be bonded to each other likewise.

Specific examples include the following compounds, but the compounds represented by general formula (PAG1) or (PAG2) should not be construed as being limited to these examples.

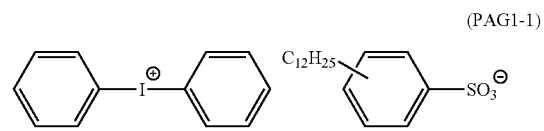
(PAG1-1)

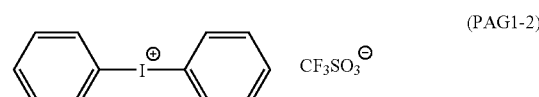
(PAG1-2)

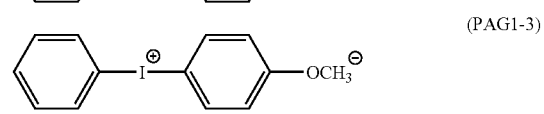
(PAG1-3)

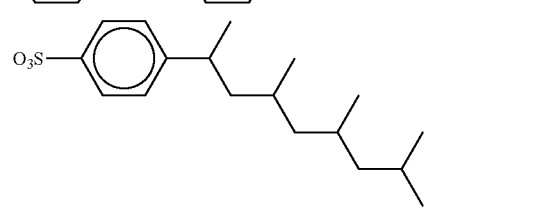

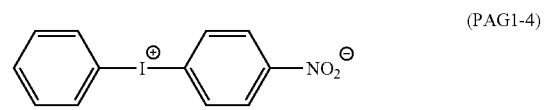
(PAG1-4)

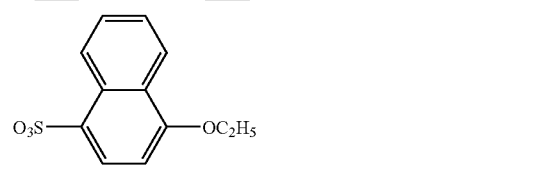

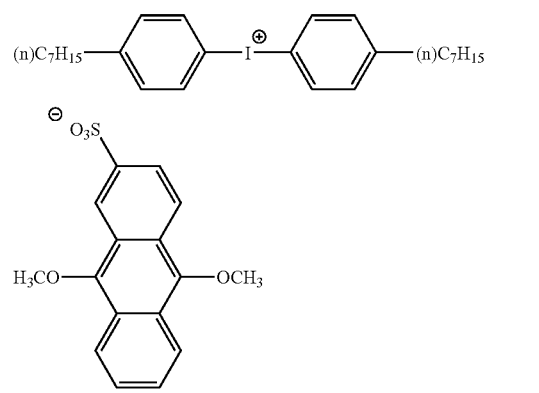
(PAG1-5)

-continued (PAG1-6)

(PAG1-7)

(PAG1-8)

(PAG1-9)

(PAG1-10)

(PAG1-11)

(PAG1-12)

(PAG1-13)

-continued (PAG1-14)

(PAG2-1)

(PAG2-2)

(PAG2-3)

(PAG2-4)

(PAG2-5)

(PAG2-6)

(PAG2-7)

(PAG2-8)

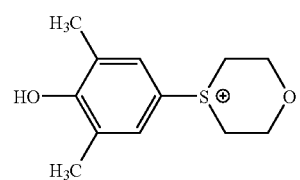 (PAG2-9) 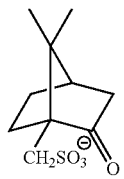
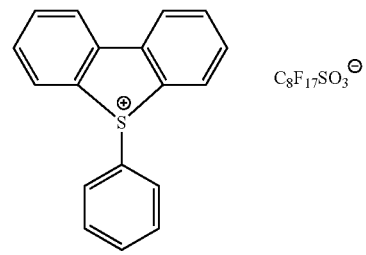 (PAG2-10)
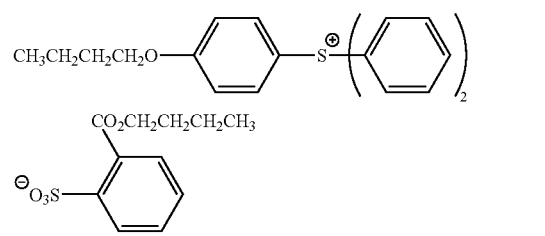 (PAG2-11)
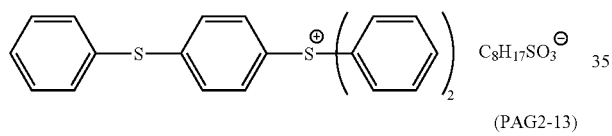 (PAG2-12)
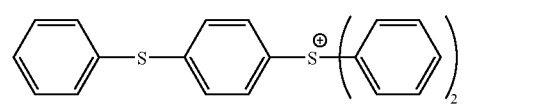 (PAG2-13)
 (PAG2-14)
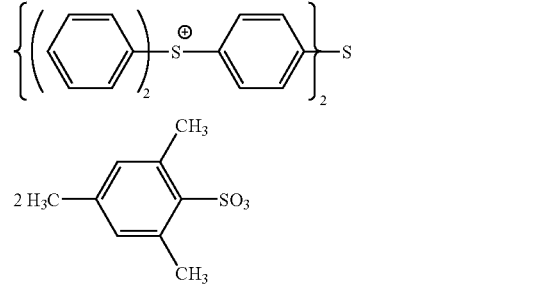 (PAG2-15)
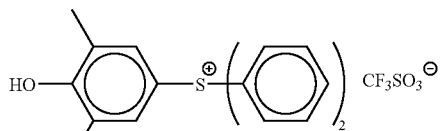 (PAG2-16)
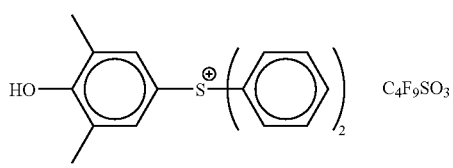 (PAG2-17)
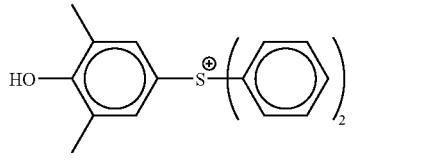 (PAG2-18)
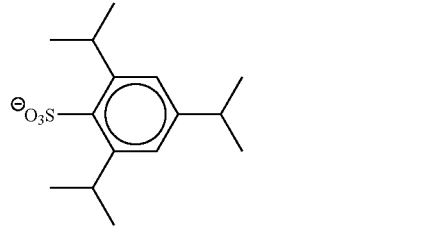 
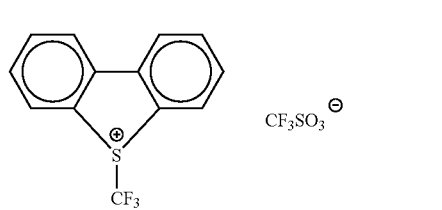 (PAG2-19)
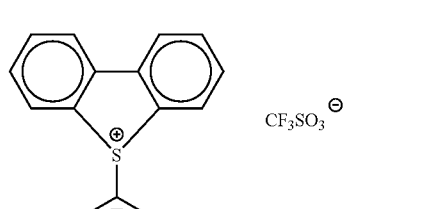 (PAG2-20)
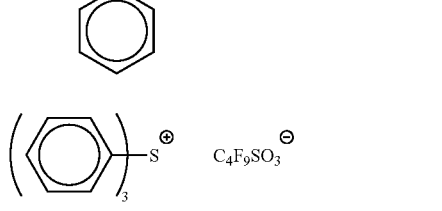 (PAG2-21)
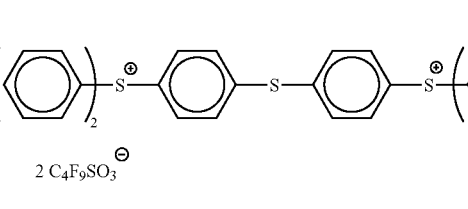 (PAG2-22)

-continued (PAG2-23)

(PAG2-24)

(PAG2-25)

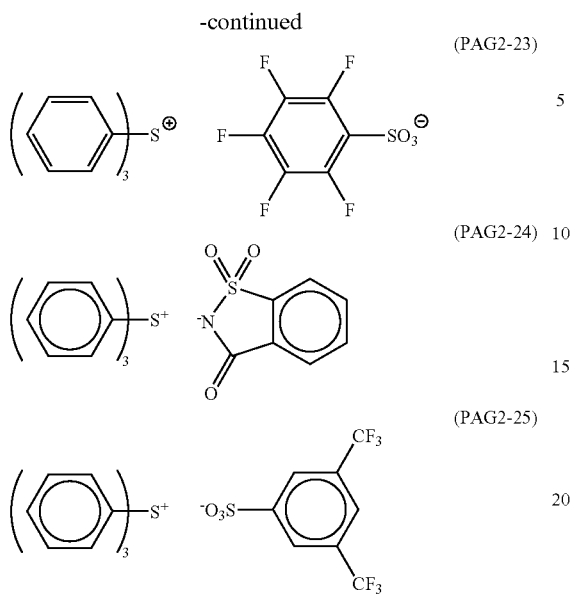

The onium salts shown above represented by general formulae (PAG1) and (PAG2) are known, and can be synthesized, for example, by the methods described in U.S. Pat. Nos. 2,807,648 and 4,247,473 and JP-A-53-101,331.

(2) Disulfone Derivatives Represented by the following General Formula (PAG3) or Iminosulfonate Derivatives Represented by the following General Formula (PAG4).

$$Ar^3-SO_2-SO_2-Ar^4 \quad \text{(PAG3)}$$

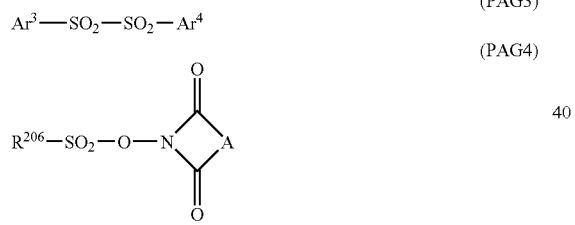

(PAG4)

In the formulae, $Ar^3$ and $Ar^4$ each independently represent a substituted or unsubstituted aryl group.

$R^{206}$ represents a substituted or unsubstituted alkyl group or aryl group, and A represents a substituted or unsubstituted alkylene group, alkenylene group, or arylene group.

Specific examples include the following compounds, but the compounds represented by general formula (PAG3) or (PAG4) should not be construed as being limited to these examples.

(PAG3-1)

(PAG3-2)

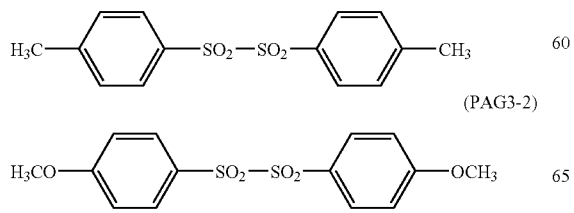

-continued (PAG3-3)

(PAG3-4)

(PAG-3-5)

(PAG3-6)

(PAG3-7)

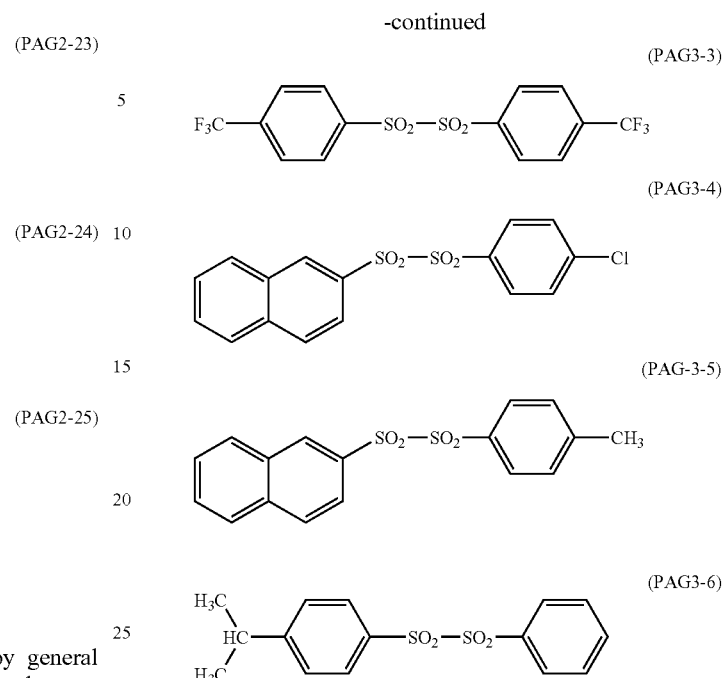

(PAG4-1)

(PAG4-2)

(PAG4-3)

(PAG4-4)

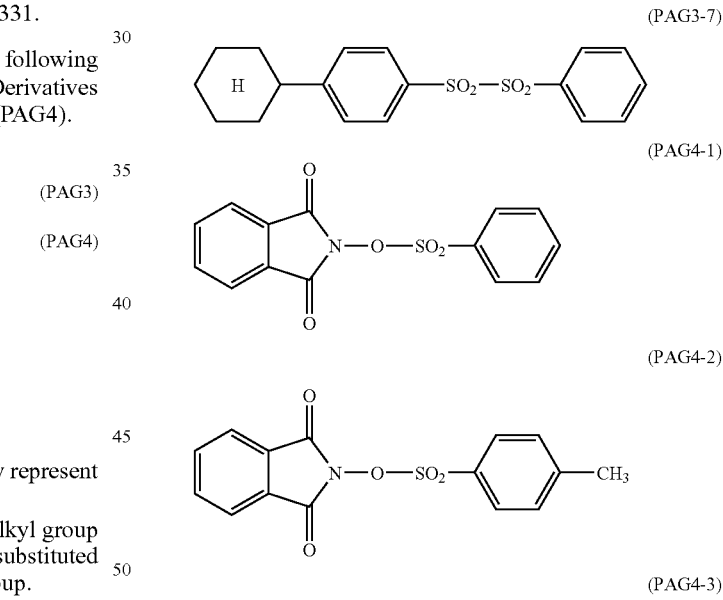

(PAG4-5)

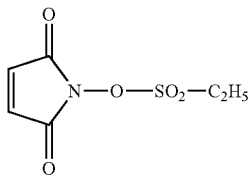

(PAG4-6)

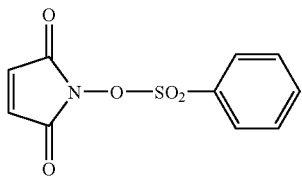

(PAG4-7)

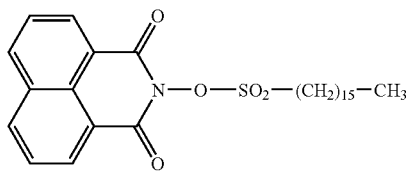

(3) Diazo Disulfone Derivatives Represented by the following General Formula (PAG5).

(PAG5)

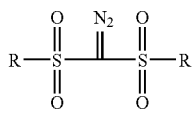

In the formula, R represents a linear, branched, or cyclic alkyl group or an optionally substituted aryl group.

Specific examples include the following compounds, but the compounds represented by general formula (PAG5) should not be construed as being limited to these examples.

(PAG5-1)

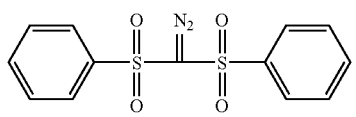

(PAG5-2)

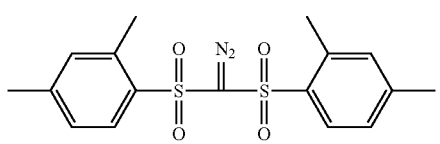

(PAG5-3)

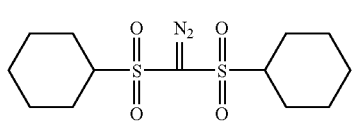

(PAG5-4)

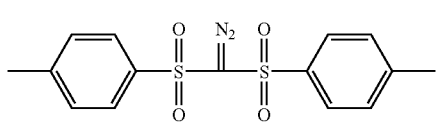

(PAG5-5)

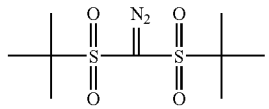

(4) Compounds Represented by the following General Formula (PAG6).

(PAG6)

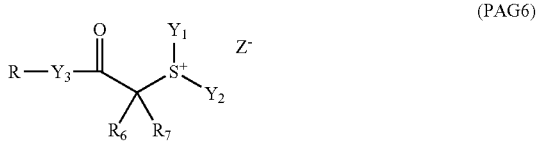

R represents a chain or cyclic alkyl group or an aromatic group.

$Y_3$ represents a single bond or a bivalent connecting group.

$R_6$ and $R_7$ each represent a hydrogen atom, cyano, alkyl group, or aryl group, provided that $R_6$ and $R_7$ may be bonded to each other to form a ring.

$Y_1$ and $Y_2$ each represent an alkyl group, aryl group, aralkyl group, or aromatic group containing one or more heteroatoms, provided that $Y_1$ and $Y_2$ may be bonded to each other to form a ring.

$Z^-$ represents a counter anion.

The alkyl group or aromatic group represented by R preferably has up to 20 carbon atoms.

The aromatic group represented by R preferably is either a group represented by the following formula (Va) or naphthyl.

(Va)

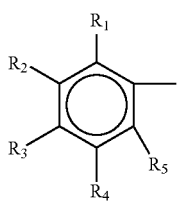

In formula (PAG6), $R_1$ to $R_5$ each represent a hydrogen atom, alkyl group, alkoxy group, nitro, halogen atom, alkyloxycarbonyl group, or aryl group, provided that at least two of $R_1$ to $R_5$ may be bonded to form a ring structure.

At least one of $R_1$ to $R_5$ is bonded to at least one of $Y_1$ and $Y_2$ to form a ring. Alternatively, at least one of $R_1$ to $R_5$ is bonded to at least one of $R_6$ and $R_7$ to form a ring.

A compound having two or more structures represented by formula (PAG6) may be used in which the structures are bonded to each other through a connecting group at any of $R_1$ to $R_7$ or at either $Y_1$ or $Y_2$.

Examples of the group formed by the bonding of $R_6$ to $R^7$ include alkylene groups (preferably having 4 to 10 carbon atoms). Preferred examples thereof include butylene, pentylene, and hexylene. The ring formed may have one or more substituents, and the ring framework may contain one or more heteroatoms therein.

The alkyl groups represented by $R_1$ to $R_7$ are substituted or unsubstituted alkyl groups preferably having 1 to 5 carbon atoms. Examples of the unsubstituted alkyl groups include methyl, ethyl, propyl, n-butyl, sec-butyl, and t-butyl.

The alkoxy groups represented by $R_1$ to $R_5$ and the alkoxy groups in the alkyloxycarbonyl groups represented by $R_1$ to $R_5$ are substituted or unsubstituted alkoxy groups preferably having 1 to 5 carbon atoms. Examples of the unsubstituted alkoxy groups-include methoxy, ethoxy, propoxy, and butoxy.

The aryl groups represented by $R_1$ to $R^7$, $Y_1$, and $Y_2$ are substituted or unsubstituted aryl groups preferably having 6 to 14 carbon atoms. Examples of the unsubstituted aryl groups include phenyl, tolyl, and naphthyl.

Examples of the halogen atoms represented by $R_1$ to $R_5$ include fluorine, chlorine, bromine, and iodine atoms.

The alkyl groups represented by $Y_1$ and $Y_2$ are substituted or unsubstituted alkyl groups preferably having 1 to 30 carbon atoms. Examples of the unsubstituted alkyl groups include linear or branched alkyl groups such as methyl, ethyl, propyl, n-butyl, sec-butyl, and t-butyl and cycloalkyl groups such ascyclopropyl, cyclopentyl, cyclohexyl, adamantyl, norbornyl, and bornyl.

The aralkyl groups represented by $Y_1$ and $Y_2$ are substituted or unsubstituted aralkyl groups preferably having 7 to 12 carbon atoms. Examples of the unsubstituted aralkyl groups include benzyl, phenethyl, and cumyl.

The aromatic group containing one or more heteroatoms represents a group consisting of an aromatic group, e.g., an aryl group having 6 to 14 carbon atoms, which has one or more heteroatoms selected from, e.g., nitrogen, oxygen, and sulfur atoms.

The heteroatom-containing aromatic groups represented by $Y_1$ and $Y_2$ are substituted or unsubstituted heteroatom-containing aromatic groups. Examples of the unsubstituted groups include heterocyclic aromatic hydrocarbon groups such as furan, thiophene, pyrrole, pyridine, and indole.

$Y_1$ and $Y_2$ may be bonded to each other to form a ring in cooperation with the $S^+$ in formula (PAG6).

In this case, examples of the group formed by the bonding of $Y_1$ to $Y_2$ include alkylene groups having 4 to 10 carbon atoms. Preferred examples thereof include butylene, pentylene, and hexylene. Especially preferred are butylene and pentylene.

The ring made up of $Y_1$ and $Y_2$ bonded to each other and of the $S^+$ in formula (PAG6) may contain one or more heteroatoms therein.

The alkyl, alkoxy, alkoxycarbonyl, aryl, aralkyl, and alkylene groups described above each may have been substituted with one or more substituents selected, for example, from nitro, halogen atoms, carboxyl, hydroxyl, amino, cyano, and alkoxy groups (preferably having 1 to 5 carbon atoms). With respect to the aryl and aralkyl groups, they may have been substituted with one or more alkyl groups (preferably having 1 to 5 carbon atoms).

$Y_3$ represents a single bond or a bivalent connecting group. Preferred examples of the bivalent connecting group include optionally substituted alkylene and alkenylene groups, —O—, —S—, —CO—, —CONR— (R is a hydrogen atom, alkyl group, or acyl group), and connecting groups which may contain two or more of these.

$Z^-$ preferably is a non-nucleophilic anion. Examples thereof include sulfonic acid anions and carboxylic acid anions.

A non-nucleophilic anion is an anion the ability of which to undergo a nucleophilic reaction is considerably low and which can inhibit the decomposition with time caused by an intramolecular nucleophilic reaction. The non-nucleophilic anion improves the long-term stability of resists.

Examples of the sulfonic acid anions include alkylsulfonic acid anions, arylsulfonic acid anions, and camphorsulfonic acid anions.

Examples of the carboxylic acid anions include alkylcarboxylic acid anions, arylcarboxylic acid anions, and aralkylcarboxylic acid anions.

Preferred examples of the alkyl groups in the alkylsulfonic acid anions include alkyl groups having 1 to 30 carbon atoms, such as methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, cyclopropyl, cyclopentyl, cyclohexyl, adamantyl, norbornyl, and bornyl.

Preferred examples of the aryl groups in the arylsulfonic acid anions include aryl groups having 6 to 14 carbon atoms, such as phenyl, tolyl, and naphthyl.

The alkyl groups and aryl groups in the alkylsulfonic acid anions and arylsulfonic acid anions may have one or more substituents.

Examples of the substituents include halogen atoms, alkyl groups, alkoxy groups, and alkylthio groups.

Examples of the halogen atoms include chlorine, bromine, fluorine, and iodine atoms.

Preferred examples of the alkyl groups include alkyl groups having 1 to 15 carbon atoms, such as methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, and eicosyl.

Preferred examples of the alkoxy groups include alkoxy groups having 1 to 5 carbon atoms, such as methoxy, ethoxy, propoxy, and butoxy.

Preferred examples of the alkylthio groups include alkylthio groups having 1 to 15 carbon atoms, such as methylthio, ethylthio, propylthio, isopropylthio, n-butylthio, isobutylthio, sec-butylthio, pentylthio, neopentylthio, hexylthio, heptylthio, octylthio, nonylthio, decylthio, undecylthio, dodecylthio, tridecylthio, tetradecylthio, pentadecylthio, hexadecylthio, heptadecylthio, octadecylthio, nonadecylthio, and eicosylthio. The alkyl groups, alkoxy groups, and alkylthio groups may have been further substituted with one or morehalogen atoms (preferably fluorine atoms).

Examples of the alkyl groups in the alkylcarboxylic acid anions include the same alkyl groups as those enumerated above with regard to the alkylsulfonic acid anions.

Examples of the aryl groups in the arylcarboxylic acid anions include the same aryl groups as those enumerated above with regard to the arylsulfonic acid anions.

Preferred examples of the aralkyl groups in the aralkylcarboxylic acid anions include aralkyl groups having 6 to 12 carbon atoms, such as benzyl, phenethyl, naphthylmethyl, naphthylethyl, and naphthylbutyl.

The alkyl groups, aryl groups, and aralkyl groups in the alkylcarboxylic acid anions, arylcarboxylic acid anions, and aralkylcarboxylic acid anions may have one or more substituents. Examples of the substituents include the same halogen atoms, alkyl groups, alkoxy groups, and alkylthio groups as those enumerated above with regard to the arylsulfonic acid anions.

Other examples of the non-nucleophilic anion include phosphorus fluoride, boron fluoride, and antimony fluoride.

In formula (PAG6) in the invention, at least one of $R_1$ to $R_5$ has been bonded to at least one of $Y_1$ and $Y_2$ to form a ring, or at least one of $R_1$ to $R_5$ has been bonded to at least one of $R_6$ and $R^7$ to form a ring. Due to this ring formation, the compound represented by formula (PAG6) has a fixed steric structure and improved photodecomposability.

A compound having two or more structures each represented by formula (PAG6) may also be used in which the structures are bonded to each other through a connecting group at any of $R_1$ to $R_7$ or at either $Y_1$ or $Y_2$.

Specific examples of the compounds represented by general formula (PAG6) are shown below, but the compounds for use in the invention should not be construed as being limited to these examples.

(PAG6A-1)
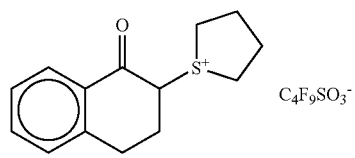
$C_4F_9SO_3^-$ (PAG6A-2)
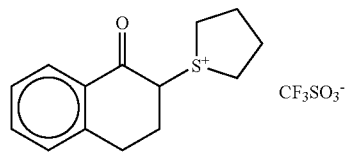
$CF_3SO_3^-$ (PAG6A-3)
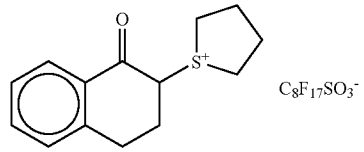
$C_8F_{17}SO_3^-$ (PAG6A-4)
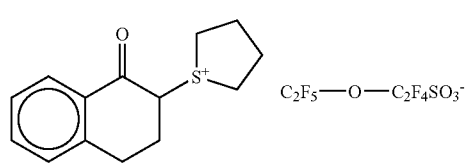
$C_2F_5$—O—$C_2F_4SO_3^-$ (PAG6A-5)
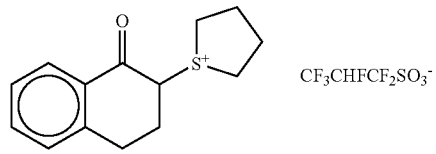
$CF_3CHFCF_2SO_3^-$ (PAG6A-7)
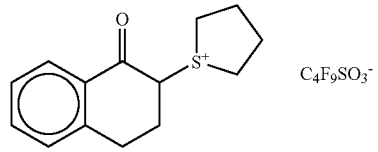
$C_4F_9SO_3^-$ (PAG6A-10)
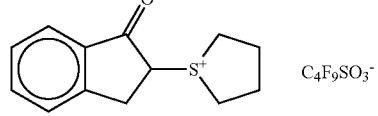
$C_4F_9SO_3^-$ -continued (PAG6A-13)
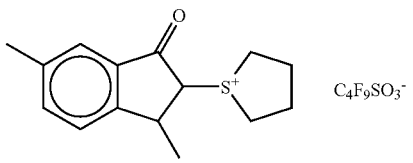
$C_4F_9SO_3^-$ (PAG6A-17)
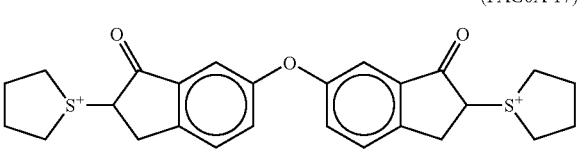
$C_4F_9SO_3^-$      $C_4F_9SO_3^-$ (PAG6A-22)
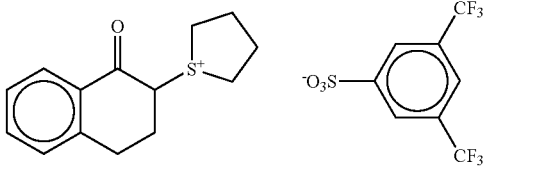

(PAG6A-23)
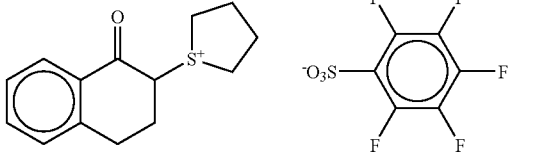

(PAG6A-28)
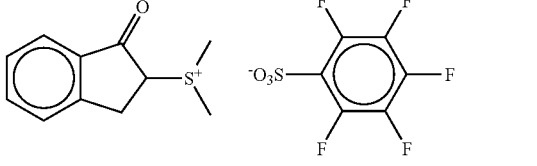

(PAG6A-34)
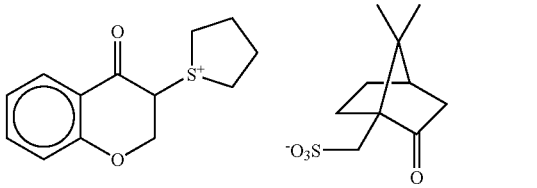

(PAG6B-1)
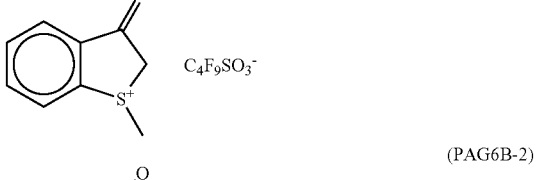
$C_4F_9SO_3^-$ (PAG6B-2)
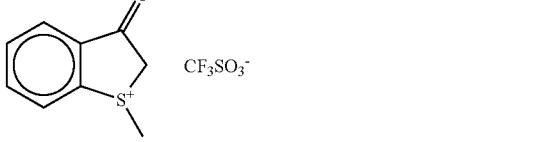
$CF_3SO_3^-$

-continued
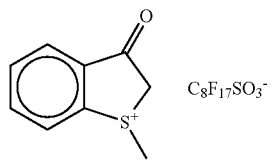 C$_8$F$_{17}$SO$_3^-$
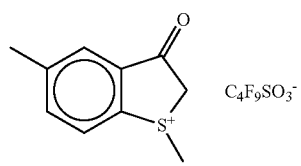 C$_4$F$_9$SO$_3^-$
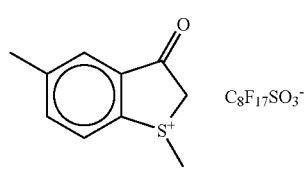 C$_8$F$_{17}$SO$_3^-$
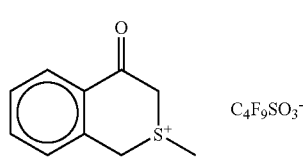 C$_4$F$_9$SO$_3^-$
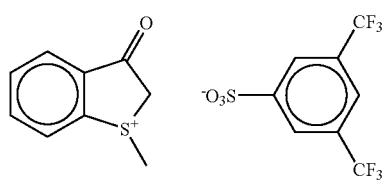
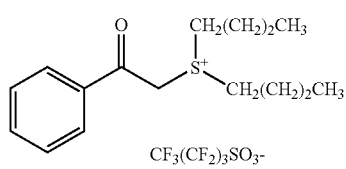 (I-1)
CF$_3$(CF$_2$)$_3$SO$_3^-$
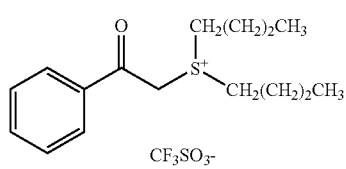 (I-2)
CF$_3$SO$_3^-$
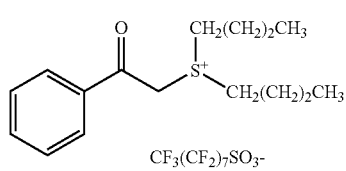 (I-3)
CF$_3$(CF$_2$)$_7$SO$_3^-$
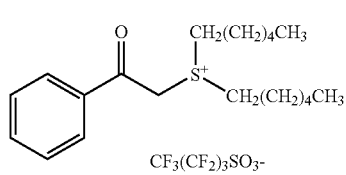 (I-4)
CF$_3$(CF$_2$)$_3$SO$_3^-$
-continued
(PAG6B-3)
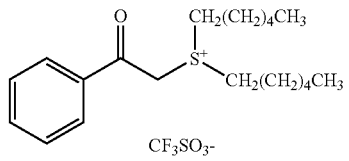 (I-5)
CF$_3$SO$_3^-$
(PAG6B-4)
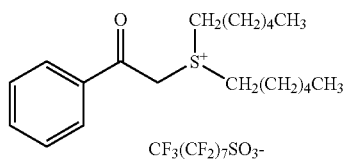 (I-6)
CF$_3$(CF$_2$)$_7$SO$_3^-$
(PAG6B-6)
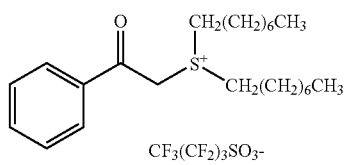 (I-7)
CF$_3$(CF$_2$)$_3$SO$_3^-$
(PAG6B-10)
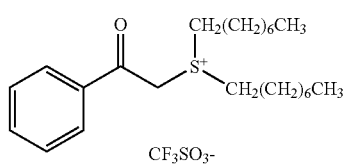 (I-8)
CF$_3$SO$_3^-$
(PAG6B-14)
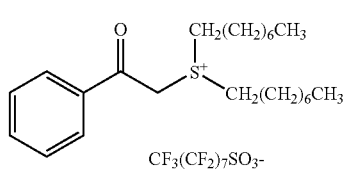 (I-9)
CF$_3$(CF$_2$)$_7$SO$_3^-$
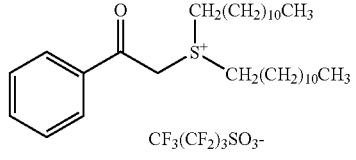 (I-10)
CF$_3$(CF$_2$)$_3$SO$_3^-$
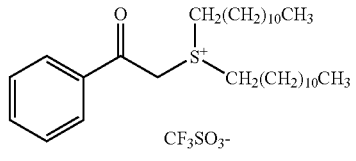 (I-11)
CF$_3$SO$_3^-$
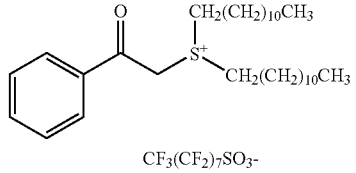 (I-12)
CF$_3$(CF$_2$)$_7$SO$_3^-$
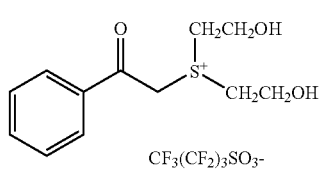 (I-13)
CF$_3$(CF$_2$)$_3$SO$_3^-$ -continued
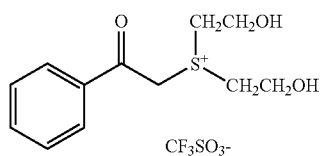
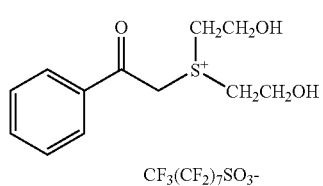
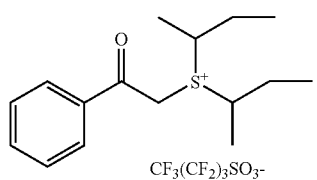 I-16
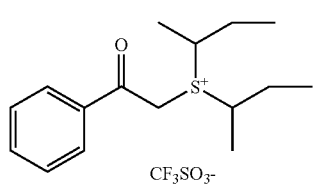 I-17
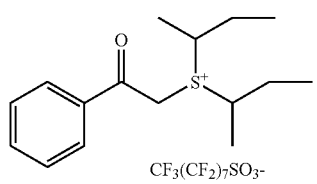 I-18
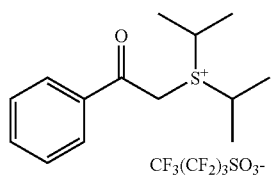 I-19
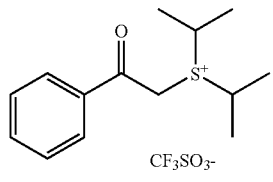 I-20
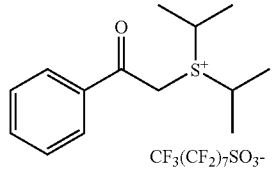 I-21
-continued
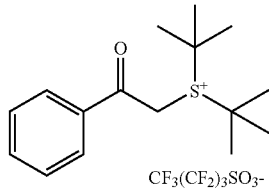 I-22
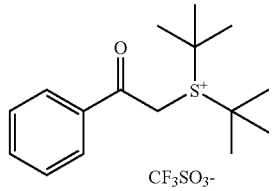 I-23
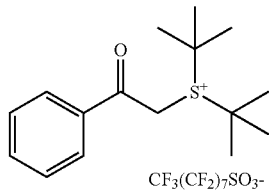 I-24
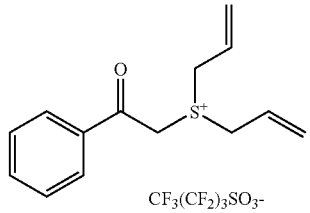 I-25
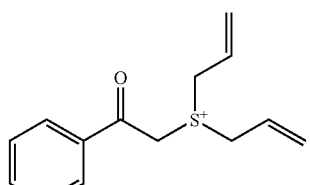 I-26
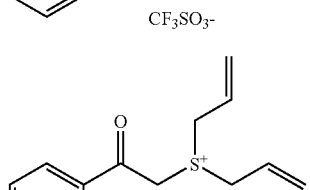 I-27
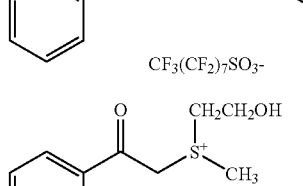 I-28
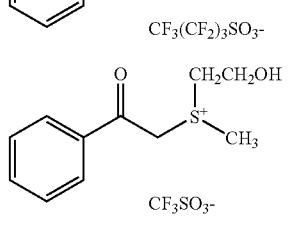 I-29

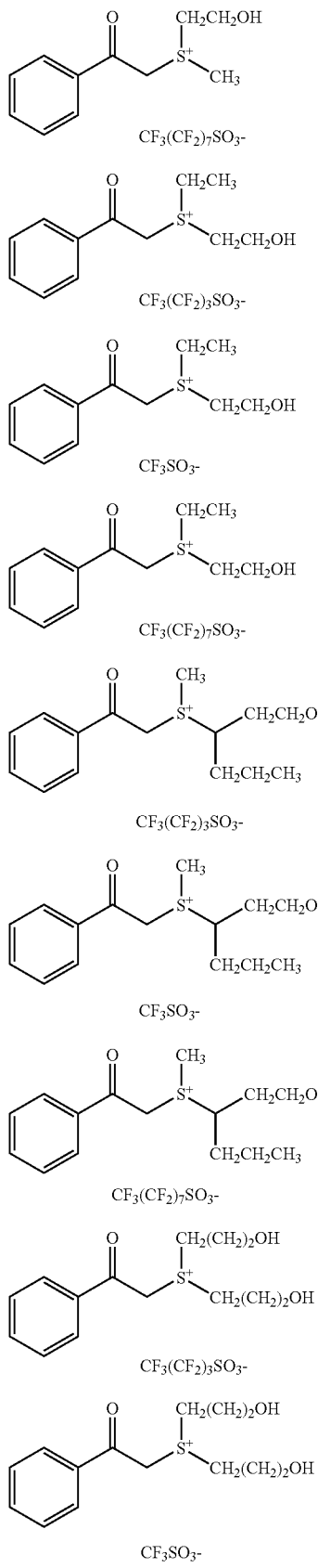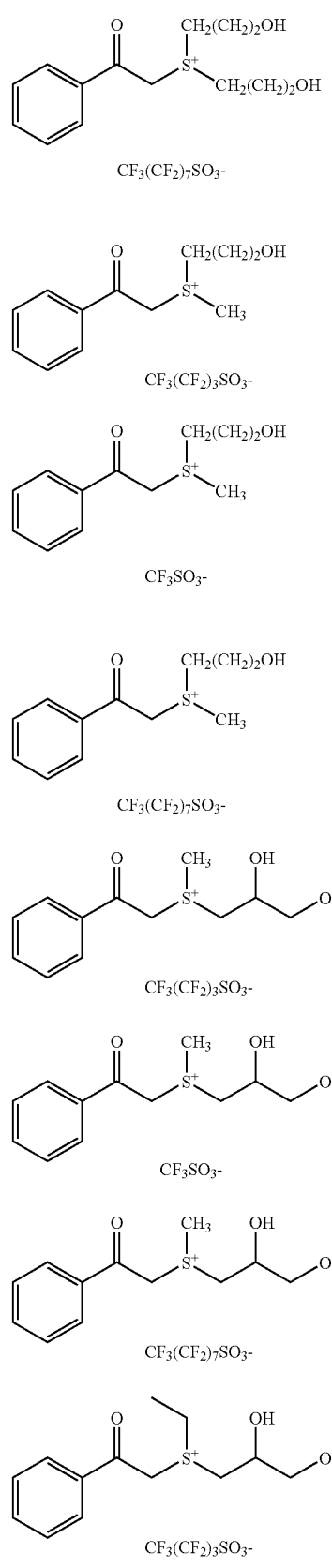

-continued
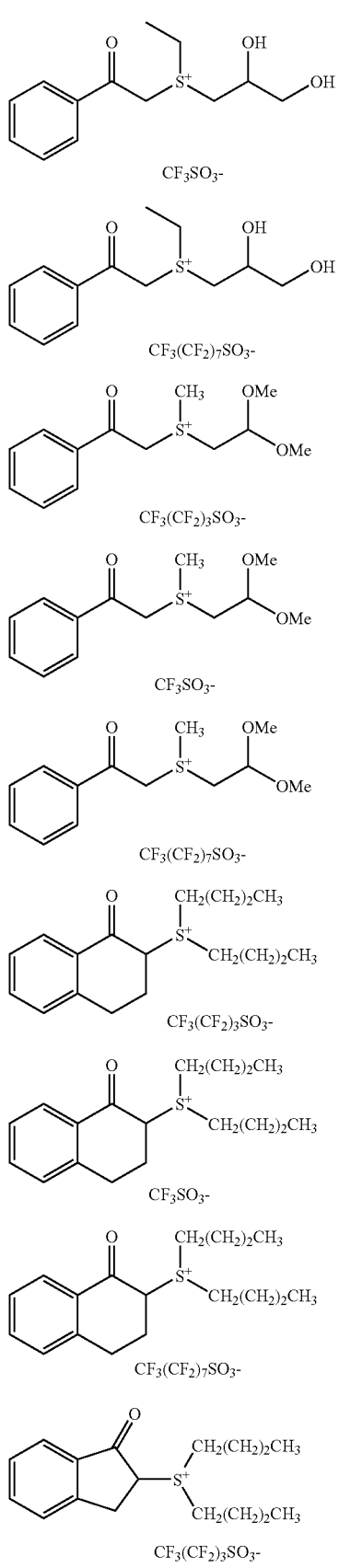
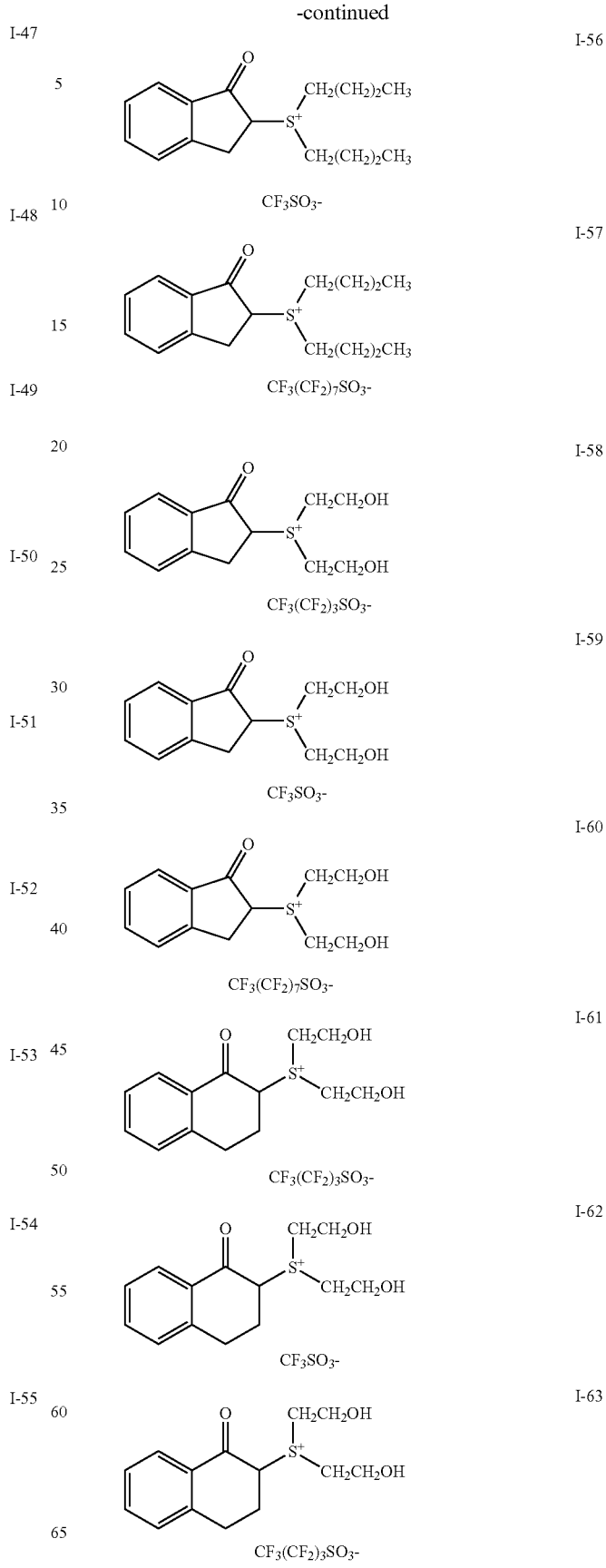

-continued

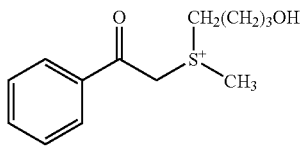
I-64
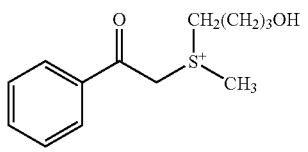
I-65
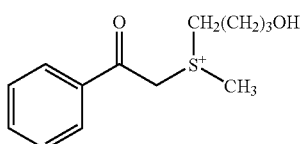
I-66
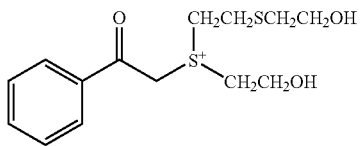
I-67
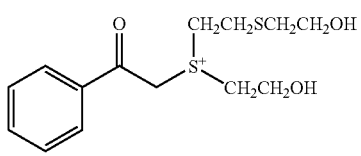
I-68
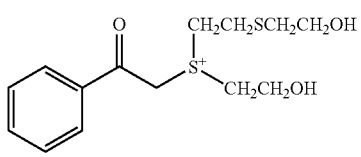
I-69
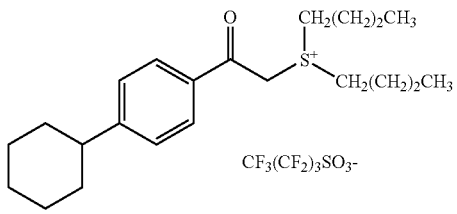
I-70
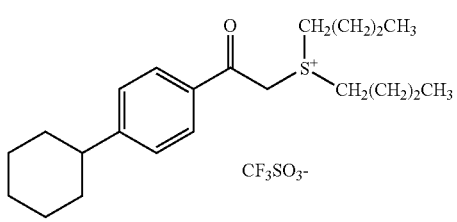
I-71

-continued

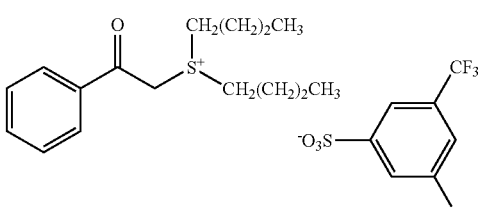
I-72

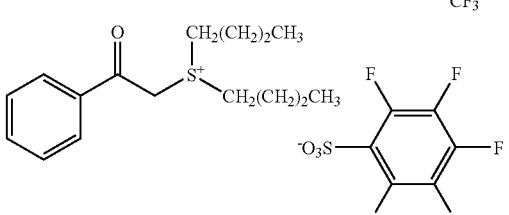
I-73

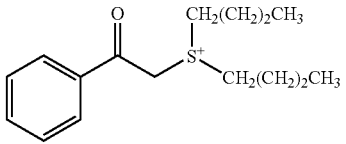
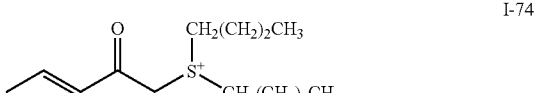
I-74

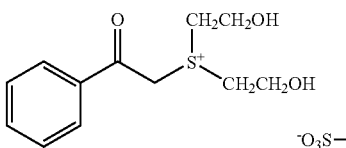
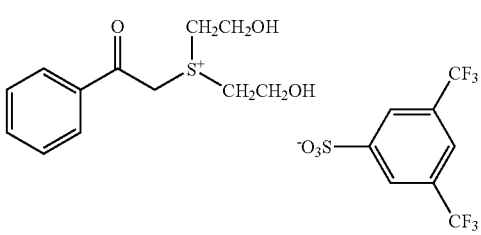
I-75

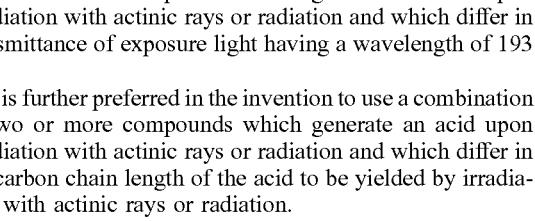

The composition of the invention preferably contains at least one of the compounds represented by general formulae (PAG1), (PAG2), and (PAG6).

In the invention, it is preferred that an onium salt compound such as those represented by general formula (PAG1) or (PAG2) and a non-onium salt compound should be used in combination as compounds which generate an acid upon irradiation with actinic rays or radiation.

It is also preferred in the invention to use a combination of two or more compounds which generate an acid upon irradiation with actinic rays or radiation and which differ in transmittance of exposure light having a wavelength of 193 nm.

It is further preferred in the invention to use a combination of two or more compounds which generate an acid upon irradiation with actinic rays or radiation and which differ in the carbon chain length of the acid to be yielded by irradiation with actinic rays or radiation.

It is furthermore preferred in the invention to use a combination of two or more compounds which generate an acid upon irradiation with actinic rays or radiation and which differ in the strength of the acid to be yielded by irradiation with actinic rays or radiation.

More preferred of the specific examples of the acid generators represented by general formula (PAG6) are (PAG6A-1) to (PAG6A-30) and (PAG6B-1) to (PAG6B-12).

Acid generators can be used alone or in combination of two or more thereof.

The content of the acid generator in the positive resist composition of the invention is preferably from 0.1 to 20% by weight, more preferably from 0.5 to 20% by weight, even more preferably from 1 to 15% by weight, based on the solid components of the composition.
Especially preferred examples of the acid generators usable in the invention are shown below.
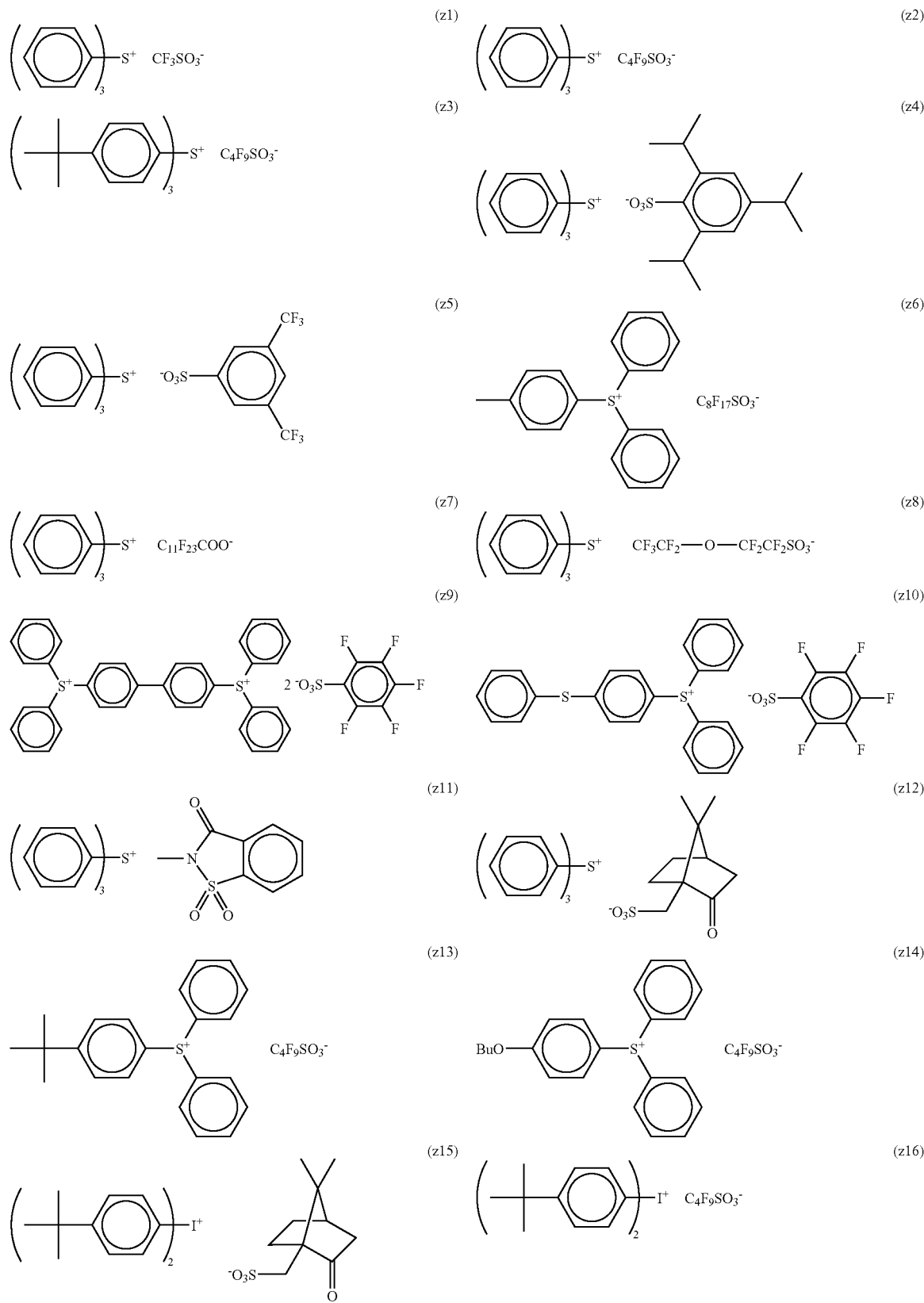

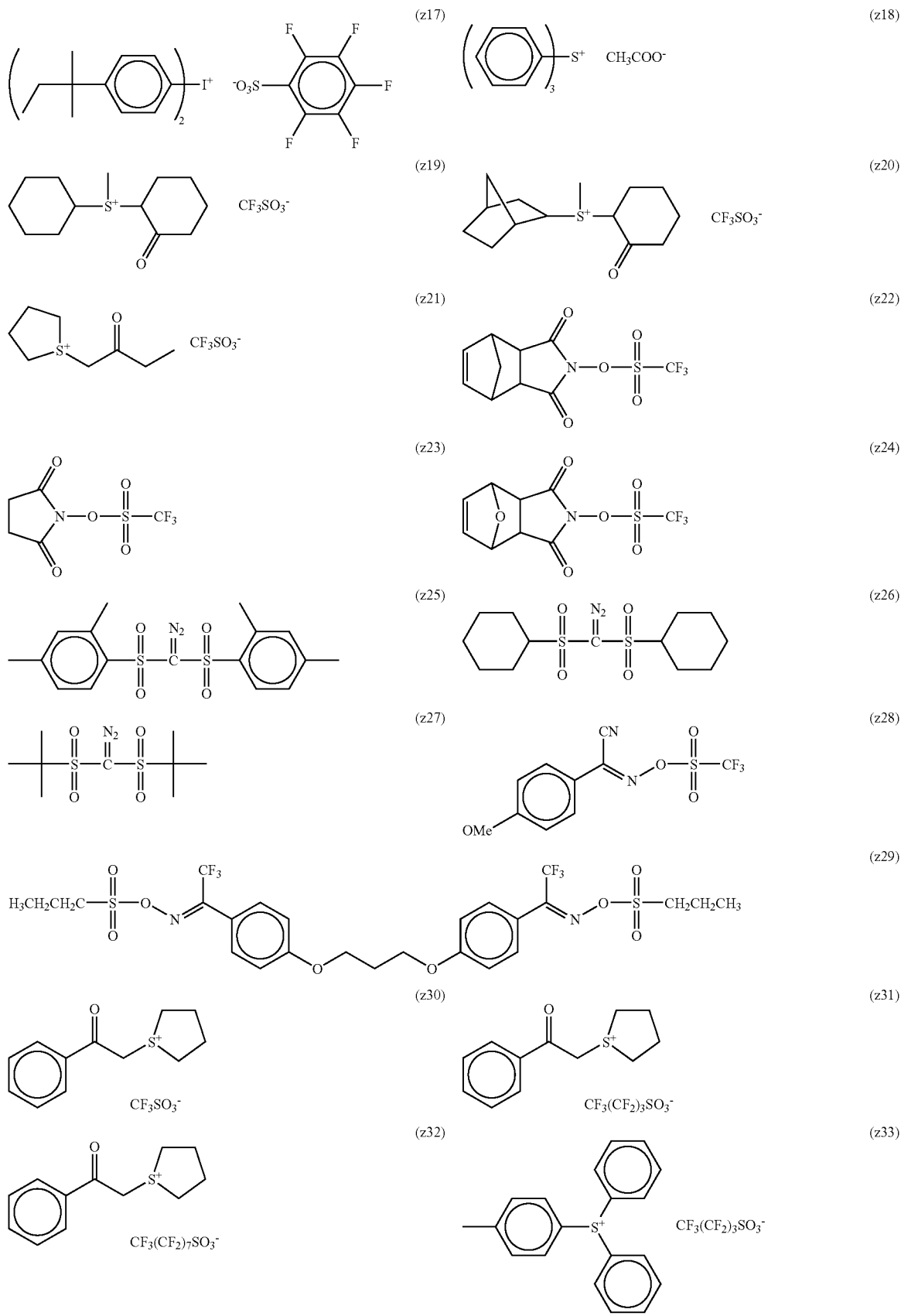

-continued
(z34) 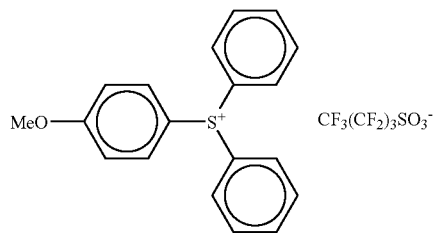
(z35) 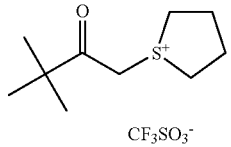
(z36) 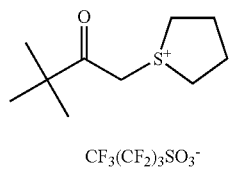
(z37) 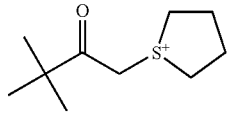
(z38) 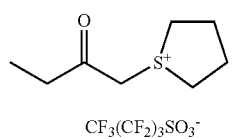
(z39) 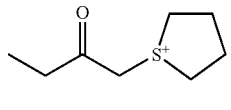
(z40) 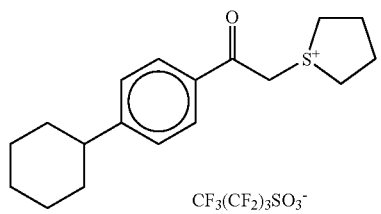
(z41) 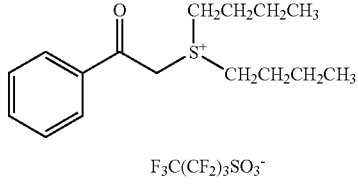
(z42) 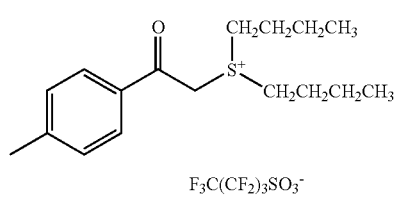
(z43) 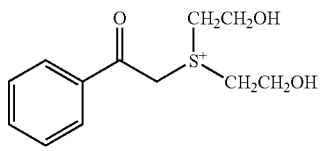
(z44) 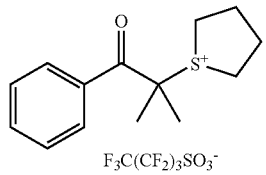
(z45) 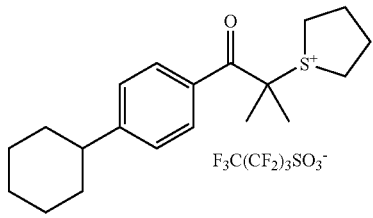
(z46) 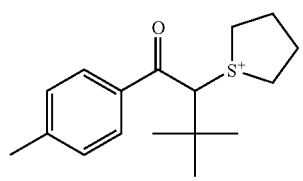
(z47) 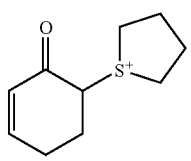

-continued (z48)
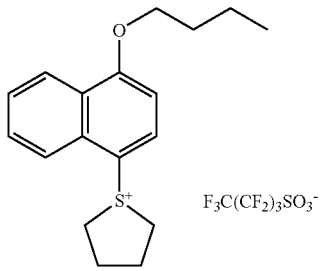

(z49)
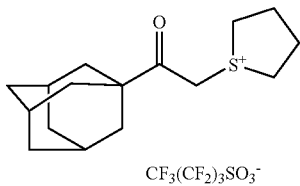

(z50)
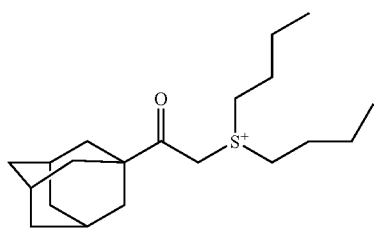

(z51)
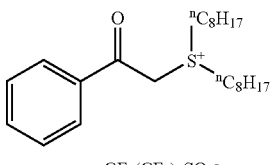

(z52)

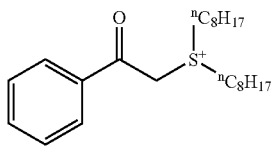

Ingredient (B) in the invention especially preferably comprises a compound which generates perfluorobutanesulfonic acid or perfluorooctanesulfonic acid.

[3] Solvent (Ingredient D)

The resist composition of the invention is prepared by dissolving the ingredients described above in a solvent.

Examples of the solvent include organic solvents such as ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, tetrahydrofuran, 3-methoxy-1-butanol, and propylene carbonate. These solvents may be used alone or as a mixture of two or more thereof.

It is especially preferred in the invention to use a mixed solvent comprising at least two members selected from propylene glycol monoalkyl ethercarboxylates, propylene glycol monoalkyl ethers, chain or cyclic ketones, alkyl lactates, cyclic lactones, 3-methoxy-1-butanol, and propylene carbonate.

In this specific mixed solvent, each specific solvent preferably is contained in an amount of 3% by weight or larger.

[4] Nitrogen-Containing Basic Compound

The resist composition of the invention preferably further contains a nitrogen-containing basic compound.

As the nitrogen-containing basic compound can be used organic amines, basic ammonium salts, basic sulfonium salts, and the like. Any of these may be used as long as it neither sublimates nor impairs resist performances.

Preferred of those nitrogen-containing basic compounds are organic amines because excellent image performance is obtainable therewith. For example, use can be made of the basic compounds shown in JP-A-63-149640, JP-A-5-249662, JP-A-5-127369, JP-A-5-289322, JP-A-5-249683, JP-A-5-289340, JP-A-5-232706, JP-A-5-257282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-T-7-508840 (the term "JP-T" as used herein means a published Japanese translation of a PCT patent application), and U.S. Pat. Nos. 5,525,453, 5,629,134, and 5,667,938.

Specific examples of the nitrogen-containing basic compound include structures represented by the following formulae (A) to (E).

(A)

$$R^{250}-N(R^{251})-R^{252}$$

(B)

(C)

$$-N-C=N-$$

$$=C-N=C-$$

-continued

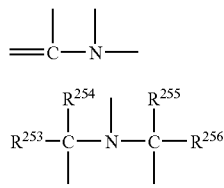

In the formulae, $R^{250}$, $R^{251}$, and $R^{252}$ may be the same or different and each represent a hydrogen atom, an alkyl group having 1 to 20 carbon atoms, an aminoalkyl group having 1 to 20 carbon atoms, a hydroxyalkyl group having 1 to 20 carbon atoms, or a substituted or unsubstituted aryl group having 6 to 20 carbon atoms, provided that $R^{251}$ and $R^{252}$ may be bonded to each other to form a ring.

$R^{253}$, $R^{254}$, $R^{255}$, and $R^{256}$ may be the same or different and each represent an alkyl group having 1 to 10 carbon atoms.

Preferred compounds are nitrogen-containing basic compounds having per molecule two or more nitrogen atoms differing in chemical environment. Also preferred are aliphatic tertiary amines.

Preferred examples of the nitrogen-containing basic compound include 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine and derivatives thereof, hexamethylenetetramine, imidazole and derivatives thereof, hydroxypyridines, pyridine and derivatives thereof, aniline and derivatives thereof, hydroxyalkylanilines, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine, tributylamine, tripentylamine, tri-n-octylamine, triisooctylamine, tris(ethylhexyl)amine, tridecylamine, and tridodecylamine.

Preferred of these are organic amines such as 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, 4-hydroxypiperidine, 2,2,6,6-tetramethyl-4-hydroxypiperidine, hexamethylenetetramine, imidazole and derivatives thereof, hydroxypyridines, pyridine and derivatives thereof, aniline and derivatives thereof, 4,4'-diaminodiphenyl ether, triethylamine, tributylamine, tripentylamine, tri-n-octylamine, tris(ethylhexyl)amine, tridodecylamine, N,N-dihydroxyethylaniline, and N-hydroxyethyl-N-ethylaniline.

The proportion of the acid generator to the nitrogen-containing basic compound in the positive resist. composition is generally such that the (acid generator)/(nitrogen-containing basic compound) molar ratio is from 2.5 to 300, preferably from 5.0 to 200, more preferably from 7.0 to 150.

Ingredients such as, e.g., a low-molecular acid-decomposable compound, surfactant, compound accelerating dissolution in developers, antihalation agent, plasticizer, photosensitizer, adhesion aid, crosslinking agent, and photobase generator can be incorporated into the positive resist composition of the invention according to need.

The positive resist composition of the invention can contain, according to need, a low-molecular acid-decomposable compound or low-molecular alicyclic compound which has a molecular weight of 2,000 or lower, has a group capable of dissociating by the action of an acid, and comes to have enhanced alkali solubility by the action of an acid.

As the low-molecular acid-decomposable compound can be used the alicyclic compounds having an acid-dissociable group, such as cholic acid derivatives, dehydrocholic acid derivatives, deoxycholic acid derivatives, lithocholic acid derivatives, ursocholic acid derivatives, and abietic acid derivatives, and the aromatic compounds, such as naphthalene derivatives having an acid-dissociable group, which are described in, e.g., Proc. SPIE, 2724, 355(1996), JP-A-8-15865, U.S. Pat. Nos. 5,310,619 and 5,372,912, and J. Photopolym. Sci., Tech., Vol. 10, No. 3, 511(1997).

Furthermore, the low-molecular acid-decomposable dissolution inhibitive compounds described in JP-A-6-51519 can be used in such an amount as not to impair transparency at 220 nm. Also usable are 1,2-naphthoquinonediazide compounds.

Examples of the alicyclic moiety in the low-molecular alicyclic compound include the structures (1) to (50) shown hereinabove as examples of the alicyclic moieties of the alicyclic hydrocarbon groups in repeating units having a partial structure which contains an alicyclic hydrocarbon group and is represented by any of general formulae (pI) to (pVI). These alicyclic moieties may have one or more substituents. Examples of the substituents include alkyl groups (preferably having 1 to 10 carbon atoms), halogen atoms, hydroxyl, carboxyl, and alkoxy groups.

In the case where the low-molecular acid-decomposable dissolution inhibitive compound is incorporated into the resist composition of the invention, it is used in an amount of generally from 0.5 to 50 parts by weight, preferably from 0.5 to 40 parts by weight, more preferably from 0.5 to 30 parts by weight, especially preferably from 0.5 to 20.0 parts by weight, per 100 parts by weight of the resist composition (on a solid basis).

Addition of the low-molecular acid-decomposable dissolution inhibitive compound or low-molecular alicyclic. compound is effective not only in further diminishing development defects but also in improving resistance to dry etching.

Examples of the compound accelerating dissolution in developers include low-molecular compounds having a molecular weight of 1,000 or lower such as, e.g., the compounds having two or more phenolichydroxyl groups described in JP-A-3-206458, naphthols including 1-naphthol, compounds having one or more carboxyl groups, carboxylic acid anhydrides, sulfonamide compounds, and sulfonylimide compounds.

The amount of these dissolution-accelerating compounds to be incorporated is preferably 30% by weight or smaller, more preferably 20% by weight or smaller, based on the whole composition (on a solid basis).

Preferred antihalation agents are compounds which efficiently absorb the radiation with which the resist is to be irradiated. Examples thereof include substituted benzene compounds such as fluorene, 9-fluorenone, and benzophenone and polycyclic aromatic compounds such as anthracene, anthracene-9-methanol, 9-carboxyethylanthracene, phenanthrene, perylene, and azirene. Especially preferred of these are the polycyclic aromatic compounds. These antihalation agents diminish light reflection by substrates and lessen the influence of multiple reflection within the resist film to thereby produce the effect of attaining an improvement concerning standing waves.

A photosensitizer can be added in order to improve the efficiency of acid generation upon exposure. Preferred examples of the photosensitizer include benzophenone, p,p'-tetramethyldiaminobenzophenone, 2-chlorothioxanthone, anthrone, 9-ethoxyanthracene, pyrene, phenothiazine, benzil, benzoflavin, acetophenone, phenanthrene, benzoquinone, anthraquinone, and 1,2-naphthoquinone. However, the photosensitizers usable in the invention should not be construed as being limited to these examples. These photosensitizers can be used also as the antihalation agent described above.

The positive resist composition of the invention preferably contains a surfactant. In particular, it preferably contains any one of or two or more of fluorochemical and/or silicone surfactants (fluorochemical surfactants, silicone surfactants, and surfactants containing both fluorine atoms and silicon atoms).

When the positive resist composition of the invention contains one or more surfactants of the fluorochemical and/or silicone type, it can show satisfactory sensitivity and resolution when irradiated with an exposure light having a wavelength of 250 nm or shorter, especially 220 nm or shorter, and give a resist pattern having satisfactory adhesion and reduced in development defects.

Examples of those surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,36.0,692, 5,529,881, 5,296,330, 5,436,098, 5,576,143, 5,294,511, and 5,824,451. It is also possible to use the following commercial surfactants as they are.

Examples of usable commercial surfactants include fluorochemical or silicone surfactants such as F-Top EF301 and FE303 (manufactured by New Akita Chemical Company), Fluorad FC430 and 431 (manufactured by Sumitomo 3M Ltd.), Megafac F171, F173, F176, F189, and R08 (manufactured by Dainippon Ink & Chemicals, Inc.), Surflon S-382 and SC101, 102, 103, 104, 105, and 106 (manufactured by Asahi Glass Co., Ltd.), and Troysol S-366 (manufactured by Troy Chemical Co., Ltd.). Polysiloxane polymer KP-341 (manufactured by Shin-Etsu Chemical Co., Ltd.) can also be used as a silicone surfactant.

Also usable besides the known surfactants shown above is a surfactant comprising a polymer having a fluoroaliphatic group and derived from a fluoroaliphatic compound produced by the telomerization method (also called telomer method) or oligomerization method (also called oligomer method). The fluoroaliphatic compound can be synthesized by the method described in JP-A-2002-90991.

The polymer having a fluoroaliphatic group preferably is a copolymer of a monomer having a fluoroaliphatic group with a poly(oxyalkylene) acrylate and/or a poly(oxyalkylene) methacrylate. This copolymer may be one in which the monomer units are randomly distributed or be a block copolymer. Examples of the poly(oxyalkylene) group include poly(oxyethylene), poly(oxypropylene), and poly (oxybutylene). The poly(oxyalkylene) group maybe a unit having, in the same chain, alkylenes having different chain lengths, such as a poly(blocks of oxyethylene, oxypropylene, and oxyethylene) or poly(blocks of oxyethylene and oxypropylene) group. The copolymer of a monomer having a fluoroaliphatic group with a poly (oxyalkylene) acrylate (or methacrylate) is not limited to binary copolymers, and may be a copolymer of three or more monomers which is obtained by copolymerization in which two or more different monomers each having a fluoroaliphatic group, two or more different poly(oxyalkylene) acrylates (or methacrylates), etc. are simultaneously copolymerized.

Examples of commercial surfactants include Megafac F178, F-470, F-473, F-475, F-476, and F-472 (manufactured by Dainippon Ink & Chemicals, Inc.). Examples of the polymer having a fluoroaliphatic group further include a copolymer of an acrylate (or methacrylate) having a $C_6F_{13}$ group with a poly(oxyalkylene) acrylate (or methacrylate), a copolymer of an acrylate (or methacrylate) having a $C_6F_{13}$ group with poly(oxyethylene) acrylate (or methacrylate) and poly(oxypropylene) acrylate (or methacrylate), a copolymer of an acrylate (or methacrylate) having a $C_8F_{17}$ group with a poly(oxyalkylene) acrylate (or methacrylate), and a copolymer of an acrylate (or methacrylate) having a $C_8F_{17}$ group with poly(oxyethylene) acrylate (or methacrylate) and poly(oxypropylene) acrylate (or methacrylate).

The amount of the surfactant to be used is preferably from 0.0001 to 2% by weight, more preferably from 0.001 to 1% by weight, based on the total amount of the positive resist composition (excluding the solvent).

<Method of Use>

The positive resist composition of the invention can be prepared by dissolving the ingredients described above in a solvent, preferably in the mixed solvent described above. This composition can be applied to a given substrate in the following manner.

Namely, the positive resist composition is applied to a substrate such as those for use in the production of precision integrated-circuit elements (e.g., a silicon substrate coated with silicon dioxide) by an appropriate method using a spinner, coater, or the like.

After the application, the resultant coating film is exposed through a given mask, baked, and then developed. Thus, a satisfactory resist pattern can be obtained. The exposure light to be used here preferably is far ultraviolet rays having a wavelength of 200 nm or shorter. Examples thereof include ArF excimer laser light (193 nm), $F_2$ excimer laser light (157 nm), radiations, electron beams, X-rays, and ion beams.

A method for obtaining a pattern of a desired size through thermal flow is as follows. Either a semiconductor substrate or a substrate obtained by forming an inorganic or organic antireflection film on a semiconductor substrate is coated with the resist composition of the invention to form a resist film thereon. The resist film is subjected successively to pattern-wise exposure to far ultraviolet rays having a wavelength of 200 nm or shorter (preferably ArF excimer laser light), radiation such as electron beams or X-rays, or ion beams, a heat treatment (e.g., at from 80 to 150° C. for from 30 to 120 seconds), and development to thereby form a contact hole pattern having a slightly larger hole size (e.g., diameter of from 90 to 150 nm) than the desired value. This semiconductor substrate is heated, for example, at from 120 to 200° C. for from 30 to 120 seconds to cause the resist pattern to flow thermally, whereby a contact hole pattern having the desired hole size can be formed. For example, a pattern having a hole diameter of 150 nm can give a pattern having a hole diameter of 80 nm through thermal flow.

In a development step, a developer is used in the following manner. As the developer for the positive resist composition can be used an alkaline aqueous solution (usually having a concentration of from 0.1 to 10% by weight) of, e.g., an inorganic alkali such as sodium hydroxide, potassium hydroxide, sodium carbonate, sodium silicate, sodium metasilicate, or ammonia water, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternaryammonium salt such as tetramethylammonium hydroxide or tetraethylammonium hydroxide, or a cyclic amine such as pyrrole or piperidine.

It is also possible to use a developer prepared by adding an appropriate amount of an alcohol or a surfactant to the alkaline aqueous solution.

The alkali concentration of the alkali developer is generally from 0.1 to 20% by weight.

EXAMPLES

The invention will be explained below in greater detail by reference to Examples, but the invention should not be construed as being limited to the following Examples. In the following Synthesis Examples, the proportions of solvents used in combination are by weight, and the monomer ratios and the monomer unit ratios indicating polymer compositions are by mole.

Symthesis Example (1)

Synthesis of Resin (1-1)

Into a reactor were introduced 2-ethyl-2-adamantyl acrylate, 3-hydroxy-1-adamantane acrylate, and norbornanelactone acrylate in a proportion of 40/20/40. These monomers were dissolved in a propylene glycol monomethyl ether acetate/propylene glycol monomethyl ether=60/40 to prepare 450 g of a solution having a solid concentration of 22%. To this solution was added 1 mol % V-601, manufactured by Wako Pure Chemical. In a nitrogen atmosphere, this mixture was added dropwise over 6 hours to 50 g of a solution consisting of a propylene glycol monomethyl ether acetate/propylene glycol monomethyl ether=60/40 mixture heated at 80° C. After completion of the dropwise addition, the reaction mixture was stirred for 2 hours. After completion of the reaction, the reaction mixture was cooled to room temperature and then added to 5 L of a hexane/ethyl acetate=10/1 mixed solvent to conduct crystallization. The white powder precipitated was taken out by filtration to recover a resin (1-1) as the target polymer.

$^{13}$C-NMR analysis revealed that the composition of this polymer was such that a/b/c=36/22/42. Analysis by GPC revealed that this polymer had a weight-average molecular weight calculated for standard polystyrene of 7,900 and a dispersity ratio of 2.2. Analysis by DSC revealed that the resin (1-1) had a glass transition point of 83° C.

Synthesis Example (2)

Synthesis of Resin (1-2)

In 90 mL of tetrahydrofuran was dissolved 10 g of the resin (1-1). To this solution was added 80 mL of hexane with stirring. The white solid precipitated was taken out by filtration to recover a resin (1-2) as the target polymer.

$^{13}$C-NMR analysis revealed that the composition of this polymer was such that a/b/c=35/23/42. Analysis by GPC revealed that this polymer had a weight-average molecular weight calculated for standard polystyrene of 11,540 and a dispersity ratio of 1.5. Analysis by DSC revealed that the resin (1-2) had a glass transition point of 141° C.

Synthesis Example (3)

Synthesis of Resin (2-1)

Polymerization was conducted in the same manner as in Synthesis Example (1) to obtain a resin (2-1) as the target polymer.

$^{13}$C-NMR analysis revealed that the composition of this polymer was such that a/b/c=39/20/41. Analysis by GPC revealed that this polymer had a weight-average molecular weight calculated for standard polystyrene of 9,070 and a dispersity ratio of 2.0. Analysis by DSC revealed that the resin (2-1) had a glass transition point of 126° C.

Synthesis Example (4)

Synthesis of Resin (2-2)

The resin (2-1) obtained in Synthesis Example (3) was subjected to solvent fractionation in the same manner as in Synthesis Example (2) to obtain a resin (2-2) as the target polymer.

$^{13}$C-NMR analysis revealed that the composition of this polymer was such that a/b/c=39/20/41. Analysis by GPC revealed that this polymer had a weight-average molecular weight calculated for standard polystyrene of 10,410 and a dispersity ratio of 1.7. Analysis by DSC revealed that the resin (2-2) had a glass transition point of 155° C.

Synthesis Example (5)

Synthesis of Resin (2-3)

Into a reactor were introduced 2-adamantyl-2-propyl acrylate, dihydroxyadamantane acrylate, and norbornanelactone acrylate in a proportion of 40/20/40. These monomers were dissolved in a propylene glycol monomethyl ether acetate/propylene glycol monomethyl ether=60/40 to prepare 450 g of a solution having a solid concentration of 22%. To this solution was added 5 mol % V-601, manufactured by Wako Pure Chemical. In a nitrogen atmosphere, this mixture was added dropwise over 6 hours to 50 g of a solution consisting of a propylene glycol monomethyl ether acetate/propylene glycol monomethyl ether=60/40 mixture heated at 80° C. After completion of the dropwise addition, the reaction mixture was stirred for 2 hours. After completion of the reaction, the reaction mixture was cooled to room temperature and then added to 5 L of a hexane/ethyl acetate=9/1 mixed solvent to conduct crystallization. The white powder precipitated was taken out by filtration to recover a resin (2-3) as the target polymer.

$^{13}$C-NMR analysis revealed that the composition of this polymer was such that a/b/c=39/21/40. Analysis by GPC revealed that this polymer had a weight-average molecular weight calculated for standard polystyrene of 4,860 and a dispersity ratio of 1.7. Analysis by DSC revealed that the resin (2-3) had a glass transition point of 113° C.

Synthesis Example (6)

Synthesis of Resin (3-1)

Into a reactor were introduced 2-norbornyl-2-propyl methacrylate, 3,5-dihydroxy-1-adamantane acrylate, and adamantanelactone acrylate in a proportion of 40/20/40. These monomers were dissolved in a propylene glycol monomethyl ether acetate/propylene glycol monomethyl ether=60/40 to prepare 450 g of a solution having a solid concentration of 22%. To this solution was added 1 mol % V-601, manufactured by Wako Pure Chemical. In a nitrogen atmosphere, this mixture was added dropwise over 6 hours to 50 g of a solution consisting of a propylene glycol monomethyl ether acetate/propylene glycol monomethyl ether=60/40 mixture heated at 100° C. After completion of the dropwise addition, the reaction mixture was stirred for 2 hours. After completion of the reaction, the reaction mixture was cooled to room temperature and then added to 5 L of a hexane/ethyl acetate=9/1 mixed solvent to conduct crystallization. The white powder precipitated was taken out by filtration to recover a resin (3-1) as the target polymer.

$^{13}$C-NMR analysis revealed that the composition of this polymer was such that a/b/c=43/19/38. Analysis by GPC revealed that this polymer had a weight-average molecular weight calculated for standard polystyrene of 9,200 and a dispersity ratio of 2.1. Analysis by DSC revealed that the resin (3-1) had a glass transition point of 148° C.

Synthesis Example (7)

Synthesis of Resin (4-1)

Polymerization was conducted in the same manner as in Synthesis Example (1) to synthesize a resin (4). The resin (4) obtained was subjected to solvent fractionation in the same manner as in Synthesis Example (2) to obtain a resin (4-1) as the target polymer.

$^{13}$C-NMR analysis revealed that the composition of this polymer was such that a/b/c=44/20/36. Analysis by GPC revealed that this polymer had a weight-average molecular weight calculated for standard polystyrene of 11,390 and a dispersity ratio of 1.6. Analysis by DSC revealed that the resin (4-1) had a glass transition point of 151° C.

Synthesis Example (8)

Synthesis of Resin (5-1)

Polymerization was conducted in the same manner as in Synthesis Example (1) to synthesize a resin (5) The resin (5) obtained was subjected to solvent fractionation in the same manner as in Synthesis Example (2) to obtain a resin (5-1) as the target polymer.

$^{13}$C-NMR analysis revealed that the composition of this polymer was such that a/b/c=37/23/40. Analysis by GPC revealed that this polymer had a weight-average molecular weight calculated for standard polystyrene of 12,220 and a dispersity ratio of 1.7. Analysis by DSC revealed that the resin (5-1) had a glass transition point of 138° C.

Synthesis Example (9)

Synthesis of Resin (6-1)

Polymerization was conducted in the same manner as in Synthesis Example (6) to obtain a resin (6-1) as the target polymer.

$^{13}$C-NMR analysis revealed that the composition of this polymer was such that a/b/c=38/22/40. Analysis by GPC revealed that this polymer had a weight-average molecular weight calculated for standard polystyrene of 8,330 and a dispersity ratio of 2.1. Analysis by DSC revealed that the resin (6-1) had a glass transition point of 131° C.

Synthesis Example (10)

Synthesis of Resin (7-1)

Into a reactor were introduced 2-adamantyl-2-propyl methacrylate, dihydroxyadamantane methacrylate, and norbornanelactone acrylate in a proportion of 40/20/40. These monomers were dissolved in a propylene glycol monomethyl ether acetate/propylene glycol monomethyl ether=60/40 to prepare 450 g of a solution having a solid concentration of 22%. To this solution was added 8 mol % V-601, manufactured by Wako Pure Chemical. In a nitrogen atmosphere, this mixture was added dropwise over 6 hours to 50 g of a solution consisting of a propylene glycol monomethyl ether acetate/propylene glycol monomethyl ether=60/40 mixture heated at 100° C. After completion of the dropwise addition, the reaction mixture was stirred for 2 hours. After completion of the reaction, the reaction mixture was cooled to room temperature and then added to 5 L of a hexane/ethyl acetate=9/1 mixed solvent to conduct crystallization. The white powder precipitated was taken out by filtration to recover a resin (7-1) as the target polymer.

$^{13}$C-NMR analysis revealed that the composition of this polymer was such that a/b/c=39/22/39. Analysis by GPC revealed that this polymer had a weight-average molecular weight calculated for standard polystyrene of 5,190 and a dispersity ratio of 1.8. Analysis by DSC revealed that the resin (7-1) had a glass transition point of 152° C.

Synthesis Example (11)

Synthesis of Resin (7-2)

Into a reactor were introduced 2-adamantyl-2-propyl methacrylate, dihydroxyadamantane methacrylate, and norbornanelactone acrylate in a proportion of 40/20/40. These monomers were dissolved in a propylene glycol monomethyl ether acetate/3-methoxy-1-butanol=60/40 to prepare 450 g of a solution having a solid concentration of 22%. To this solution was added 8 mol % V-601, manufactured by Wako Pure Chemical. In a nitrogen atmosphere, this mixture was added dropwise over 6 hours to 50 g of a solution consisting of a propylene glycol monomethyl ether acetate/3-methoxy-1-butanol=60/40 mixture heated at 120° C. After completion of the dropwise addition, the reaction mixture was stirred for 2 hours. After completion of the reaction, the reaction mixture was cooled to room temperature and then added to 5 L of a hexane/ethyl acetate=9/1 mixed solvent to conduct crystallization. The white powder precipitated was taken out by filtration to recover a resin (7-2) as the target polymer.

$^{13}$C-NMR analysis revealed that the composition of this polymer was such that a/b/c=36/23/41. Analysis by GPC revealed that this polymer had a weight-average molecular weight calculated for standard polystyrene of 3,270 and a dispersity ratio of 1.5. Analysis by DSC revealed that the resin (7-2) had a glass transition point of 119° C.

Synthesis Example (12)

Synthesis of Resin (7-3)

Into a reactor were introduced 2-adamantyl-2-propyl methacrylate, dihydroxyadamantane methacrylate, and norbornanelactone acrylate in a proportion of 40/20/40. These monomers were dissolved in a propylene glycol monomethyl ether acetate/3-methoxy-1-butanol=60/40 to prepare 450 g of a solution having a solid concentration of 22%. To this solution was added 6 mol % V-601, manufactured by Wako Pure Chemical. In a nitrogen atmosphere, this mixture was added dropwise over 6 hours to 50 g of a solution consisting of a propylene glycol monomethyl ether acetate/3-methoxy-1-butanol=60/40 mixture heated at 120° C. After completion of the dropwise addition, the reaction mixture was stirred for 2 hours. After completion of the reaction, the reaction mixture was cooled to room temperature and then added to 5 L of a hexane/ethyl acetate=9/1 mixed solvent to conduct crystallization. The white powder precipitated was taken out by filtration to recover a resin (7-3) as the target polymer.

$^{13}$C-NMR analysis revealed that the composition of this polymer was such that a/b/c=36/23/41. Analysis by GPC revealed that this polymer had a weight-average molecular weight calculated for standard polystyrene of 4,100 and a dispersity ratio of 1.6. Analysis by DSC revealed that the resin (7-3) had a glass transition point of 139° C.

Synthesis Example (13)

Synthesis of Resin (8-1)

Polymerization was conducted in the same manner as in Synthesis Example (6) to obtain a resin (8-1) as the target polymer.

$^{13}$C-NMR analysis revealed that the composition of this polymer was such that a/b/c=37/22/41. Analysis by GPC revealed that this polymer had a weight-average molecular weight calculated for standard polystyrene of 7,760 and a dispersity ratio of 2.3. Analysis by DSC revealed that the resin (8-1) had a glass transition point of 133° C.

Synthesis Example (14)

Synthesis of Resin (9-1)

Polymerization was conducted in the same manner as in Synthesis Example (6) to obtain a resin (9-1) as the target polymer.

$^{13}$C-NMR analysis revealed that the composition of this polymer was such that a/b/c=35/27/28. Analysis by GPC revealed that this polymer had a weight-average molecular weight calculated for standard polystyrene of 9,910 and a dispersity ratio of 2.2. Analysis by DSC revealed that the resin (9-1) had a glass transition point of 122° C.

Synthesis Example (15)

Synthesis of Resin (10-1)

Polymerization was conducted in the same manner as in Synthesis Example (10) to obtain a resin (10-1) as the target polymer.

$^{13}$C-NMR analysis revealed that the composition of this polymer was such that a/b/c/d=30/22/39/9. Analysis by GPC revealed that this polymer had a weight-average molecular weight calculated for standard polystyrene of 5,840 and a dispersity ratio of 1.7. Analysis by DSC revealed that the resin (10-1) had a glass transition point of 152° C.

Synthesis Example (16)

Synthesis of Resin (10-2)

Polymerization was conducted in the same manner as in Synthesis Example (12) to obtain a resin (10-2) as the target polymer.

$^{13}$C-NMR analysis revealed that the composition of this polymer was such that a/b/c/d=30/22/39/9. Analysis by GPC revealed that this polymer had a weight-average molecular weight calculated for standard polystyrene of 3,890 and a dispersity ratio of 1.6. Analysis by DSC revealed that the resin (10-2) had a glass transition point of 134° C.

Synthesis Example (17)

Synthesis of Resin (11-1)

Into a reactor were introduced 2-adamantyl-2-propyl methacrylate, 2-adamantyl-2-propyl acrylate, dihydroxyadamantane methacrylate, and norbornanelactone acrylate in a proportion of 20/20/20/40. These monomers were dissolved in a propylene glycol monomethyl ether acetate/propylene glycol monomethyl ether=60/40 to prepare 450 g of a solution having a solid concentration of 22%. To this solution was added 9 mol % V-601, manufactured by Wako Pure Chemical. In a nitrogen atmosphere, this mixture was added dropwise over 6 hours to 50 g of a solution consisting of a propylene glycol monomethyl ether acetate/propylene glycol monomethyl ether=60/40 mixture heated at 80° C. After completion of the dropwise addition, the reaction mixture was stirred for 2 hours. After completion of the reaction, the reaction mixture was cooled to room temperature and then added to 5 L of a hexane/ethyl acetate=9/1 mixed solvent to conduct crystallization. The white powder precipitated was taken out by filtration to recover a resin (11-1) as the target polymer.

$^{13}$C-NMR analysis revealed that the composition of this polymer was such that a/b/c/d=20/20/21/39. Analysis by GPC revealed that this polymer had a weight-average molecular weight calculated for standard polystyrene of 7,980 and a dispersity ratio of 2.3. Analysis by DSC revealed that the resin (11-1) had a glass transition point of 155° C.

Synthesis Example (18)

Synthesis of Resin (11-2)

Into a reactor were introduced 2-adamantyl-2-propyl methacrylate, 2-adamantyl-2-propyl acrylate, dihydroxyadamantane methacrylate, and norbornanelactone acrylate in a proportion of 20/20/20/40. These monomers were dissolved in a propylene glycol monomethyl ether acetate/propylene glycol monomethyl ether=60/40 to prepare 450 g of a solution having a solid concentration of 22%. To this solution was added 5 mol % V-601, manufactured by Wako Pure Chemical. In a nitrogen atmosphere, this mixture was added dropwise over 6 hours to 50 g of a solution consisting of a propylene glycol monomethyl ether acetate/propylene glycol monomethyl ether=60/40 mixture heated at 80° C. After completion of the dropwise addition, the reaction mixture was stirred for 2 hours. After completion of the reaction, the reaction mixture was cooled to room temperature and then added to 5 L of a hexane/ethyl acetate=9/1 mixed solvent to conduct crystallization. The white powder precipitated was taken out by filtration to recover a resin (11-2) as the target polymer.

$^{13}$C-NMR analysis revealed that the composition of this polymer was such that a/b/c/d=20/20/21/39. Analysis by GPC revealed that this polymer had a weight-average molecular weight calculated for standard polystyrene of 9,370 and a dispersity ratio of 2.2. Analysis by DSC revealed that the resin (11-2) had a glass transition point of 161° C.

Synthesis Example (19)

Synthesis of Resin (12-1)

Into a reactor were introduced the acrylic ester of t-butyl hydroxytetraschlododecanylcarboxylate, the methacrylic ester of hydroxytetraschlododecanylcarboxylic acid, and norbornanelactone acrylate in a proportion of 44/6/50. These monomers were dissolved in a propylene glycol monomethyl ether acetate/propylene glycol monomethyl ether=60/40 to prepare 450 g of a solution having a solid concentration of 22%. To this solution was added 2.5 mol % V-601, manufactured by Wako Pure Chemical. In a nitrogen atmosphere, this mixture was added dropwise over 6 hours to 50 g of a solution consisting of a propylene glycol monomethyl ether acetate/propylene glycol monomethyl ether=60/40 mixture heated at 80° C. After completion of the dropwise addition, the reaction mixture was stirred for 2 hours. After completion of the reaction, the reaction mixture was cooled to room temperature and then added to 5 L of a hexane/ethyl acetate=9/1 mixed solvent to conduct crystallization. The white powder precipitated was taken out by filtration to recover a resin (12-1) as the target polymer.

$^{13}$C-NMR analysis revealed that the composition of this polymer was such that a/b/c=45/7/48. Analysis by GPC revealed that this polymer had a weight-average molecular weight calculated for standard polystyrene of 10,370 and a dispersity ratio of 2.2. Analysis by DSC revealed that the resin (12-1) had a glass transition point of 136° C.

Synthesis Example (20)

Synthesis of Resin (13-1)

Polymerization was conducted in the same manner as in Synthesis Example (6) to obtain a resin (13-1) as the target polymer.

$^{13}$C-NMR analysis revealed that the composition of this polymer was such that a/b/c=45/28/27. Analysis by GPC revealed that this polymer had-a weight-average molecular weight calculated for standard polystyrene of 10,180 and a dispersity ratio of 2.3. Analysis by DSC revealed that the resin (13-1) had a glass transition point of 144° C.

Synthesis Example (21)

Synthesis of Resin (14-1)

Polymerization was conducted in the same manner as in Synthesis Example (6) to obtain a resin (14-1) as the target polymer.

$^{13}$C-NMR analysis revealed that the composition of this polymer was such that a/b/c/d=37/19/2/42. Analysis by GPC revealed that this polymer had a weight-average molecular weight calculated for standard polystyrene of 8,350 and a dispersity ratio of 2.1. Analysis by DSC revealed that the resin (14-1) had a glass transition point of 156° C.

Synthesis Example (22)

Synthesis of Resin (14-2)

Polymerization was conducted in the same manner as in Synthesis Example (6) to obtain a resin (14-2) as the target polymer.

$^{13}$C-NMR analysis revealed that the composition of this polymer was such that a/b/c/d=35/19/5/41. Analysis by GPC revealed that this polymer had a weight-average molecular weight calculated for standard polystyrene of 7,630 and a dispersity ratio of 2.0. Analysis by DSC revealed that the resin (14-2) had a glass transition point of 139° C.

Synthesis Example (23)

Synthesis of Resin (15-1)

Polymerization was conducted in the same manner as in Synthesis Example (6) to obtain a resin (15-1) as the target polymer.

$^{13}$C-NMR analysis revealed that the composition of this polymer was such that a/b/c/d=39/16/40/5. Analysis by GPC revealed that this polymer had a weight-average molecular weight calculated for standard polystyrene of 8,670 and a dispersity ratio of 2.2. Analysis by DSC revealed that the resin (15-1) had a glass transition point of 147° C.

Synthesis Example (24)

Synthesis of Resin (16-1)

Polymerization was conducted in the same manner as in Synthesis Example (6) to obtain a resin (16-1) as the target polymer.

$^{13}$C-NMR analysis revealed that the composition of this polymer was such that a/b/c/d=37/19/39/5. Analysis by GPC revealed that this polymer had a weight-average molecular weight calculated for standard polystyrene of 7,560 and a dispersity ratio of 1.9. Analysis by DSC revealed that the resin (16-1) had a glass transition point of 139° C.

Synthesis Example (25)

Synthesis of Resin (17-1)

Polymerization was conducted in the same manner as in Synthesis Example (1) to synthesize a resin (17). The resin (17) obtained was subjected to solvent fractionation in the same manner as in Synthesis Example (2) to obtain a resin (17-1) as the target polymer.

$^{13}$C-NMR analysis revealed that the composition of this polymer was such that a/b/c/d=35/19/36/10. Analysis by GPC revealed that this polymer had a weight-average molecular weight calculated for standard polystyrene of 10,150 and a dispersity ratio of 1.8. Analysis by DSC revealed that the resin (17-1) had a glass transition point of 153° C.

Synthesis Example (26)

Synthesis of Resin (18-1)

Polymerization was conducted in the same manner as in Synthesis Example (1) to synthesize a resin (18). The resin (18) obtained was subjected to solvent fractionation in the same manner as in Synthesis Example (2) to obtain a resin (18-1) as the target polymer.

$^{13}$C-NMR analysis revealed that the composition of this polymer was such that a/b/c/d=35/8/29/28. Analysis by GPC revealed that this polymer had a weight-average molecular weight calculated for standard polystyrene of 10,650 and a dispersity ratio of 1.6. Analysis by DSC revealed that the resin (18-1) had a glass transition point of 149° C.

Synthesis Example (27)

Synthesis of Resin (7-4)

Into a reactor were introduced 2-adamantyl-2-propyl methacrylate, norbornanelactone acrylatel and dihydroxyadamantane methacrylate in a proportion of 35/45/20. These monomers were dissolved in THF to prepare 450 g of a solution having a solid concentration of 22%. To this solution was added 9 mol % V-601, manufactured by Wako Pure Chemical. In a nitrogen atmosphere, this mixture was added dropwise over 6 hours to 50 g of THF solvent heated at 65° C. After completion of the dropwise addition, the reaction mixture was stirred for 2 hours. After completion of the reaction, the reaction mixture was cooled to room temperature and then added to 5 L of a heptane/ethyl acetate=9/1 mixed solvent to conduct crystallization. The white powder precipitated was taken out by filtration to recover a resin (7-4) as the target polymer.

NMR analysis revealed that the composition of this polymer was 35/44/21. Analysis by GPC revealed that this polymer had a weight-average molecular weight calculated for standard polystyrene of 7,700 and a dispersity ratio of 1.95. The resin (7-4) obtained had a glass transition temperature of 168° C.

Synthesis Example (28)

Synthesis of Resin (7-5)

Into a reactor were introduced 2-adamantyl-2-propyl methacrylate, norbornanelactone acrylate, and dihydroxy-adamantane methacrylate in a proportion of 35/45/20. These monomers were dissolved in a propylene glycol monomethyl ether acetate/propylene glycol monomethyl ether=7/3 mixed solvent to prepare 450 g of a solution having a solid concentration of 22%. To this solution was added 8 mol % V-601, manufactured by Wako Pure Chemical. In a nitrogen atmosphere, this mixture was added dropwise over 6 hours to 50 g of a propylene glycol monomethyl ether acetate/propylene glycol monomethyl ether =7/3 mixed solvent heated at 80° C. After completion of the dropwise addition, the reaction mixture was stirred for 2 hours. After completion of the reaction, the reaction mixture was cooled to room temperature and then added to 5 L of a heptane/ethyl acetate=9/1 mixed solvent to conduct crystallization. The white powder precipitated was taken out by filtration to recover a resin (7-5) as the target polymer.

NMR analysis revealed that the composition of this polymer was 35/44/21. Analysis by GPC revealed that this polymer had a weight-average molecular weight calculated for standard polystyrene of 8,500 and a dispersity ratio of 1.98. The resin (7-5) obtained had a glass transition temperature of 183° C.

-continued

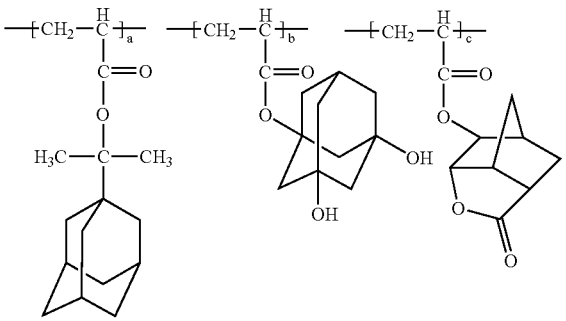

(2)

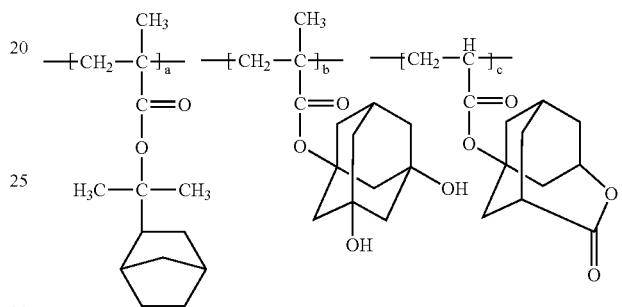

(3)

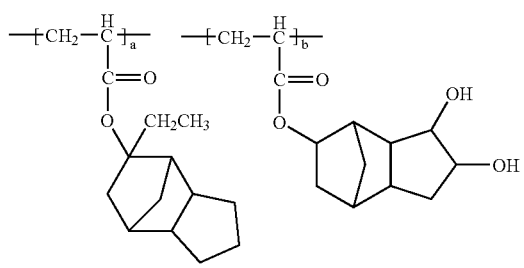

(4)

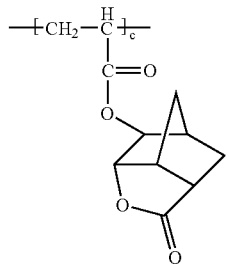

(1)

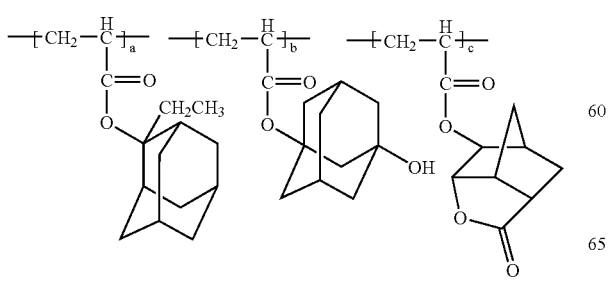

(5)

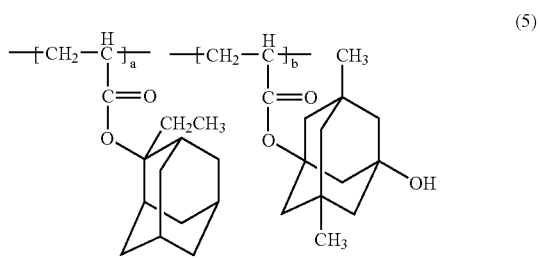

(6)
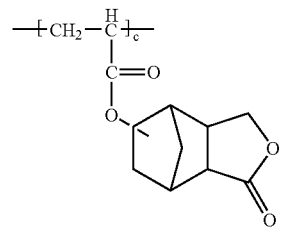
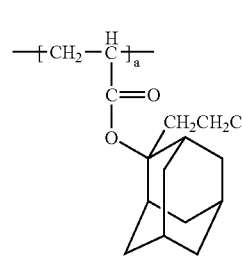
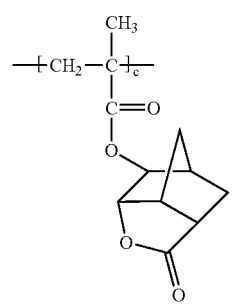
(7)
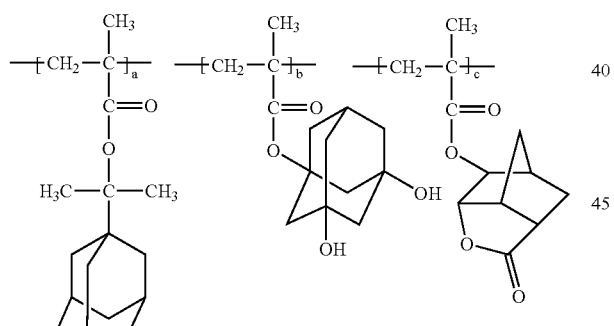
(8)
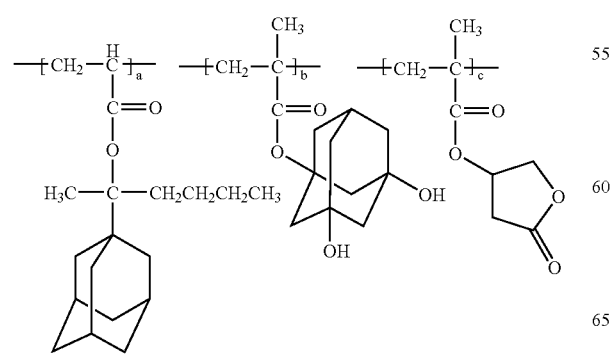
(9)
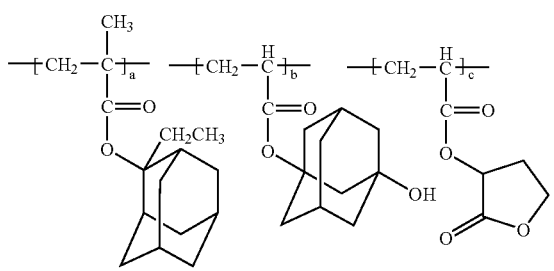
(10)
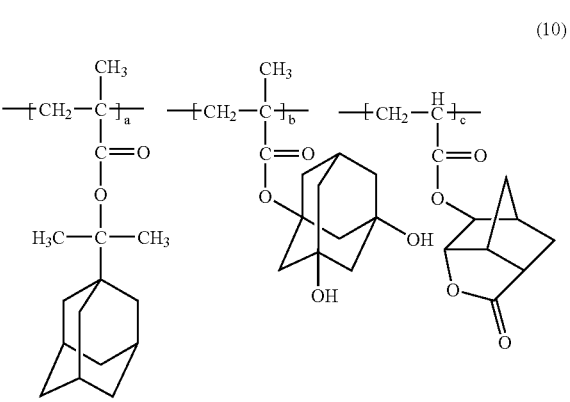
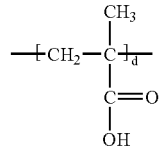
(11)
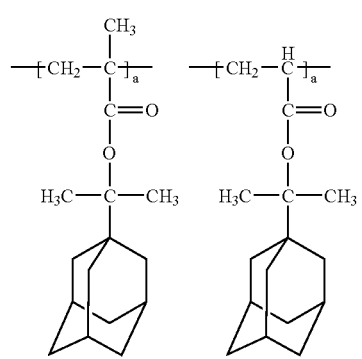
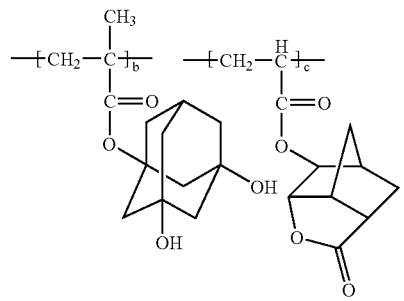

89
-continued
(12)
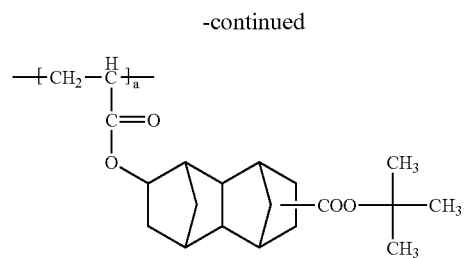
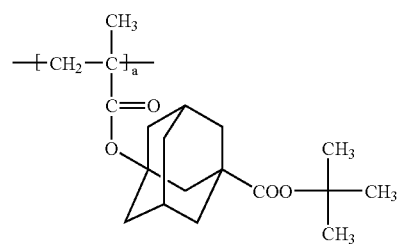
(13)
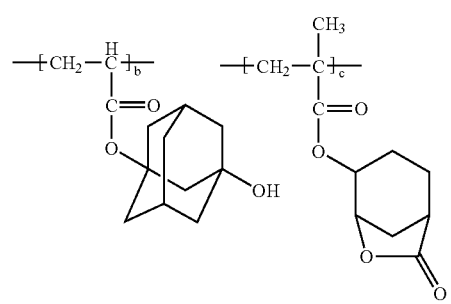
(14)
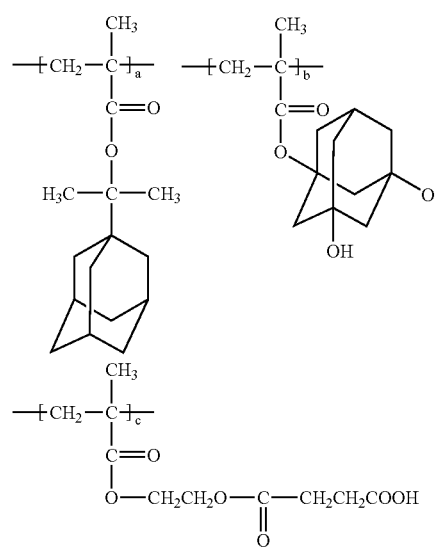
90
-continued
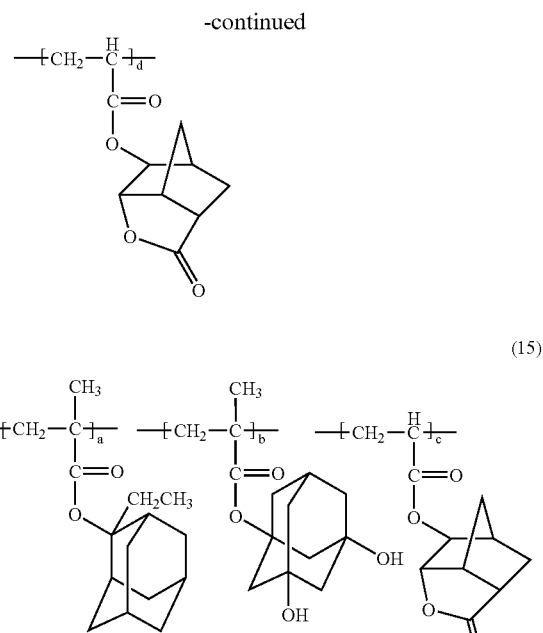
(15)
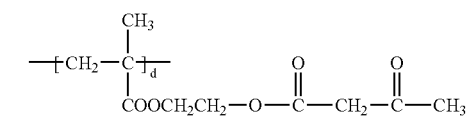
(16)
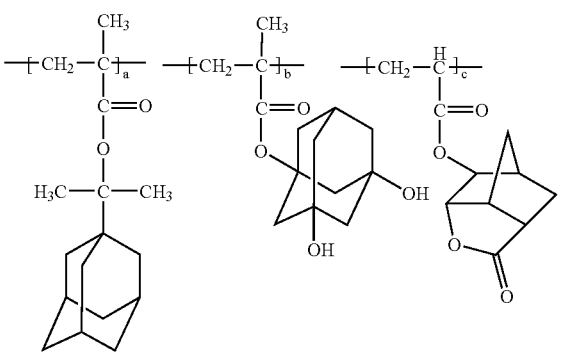
(17)
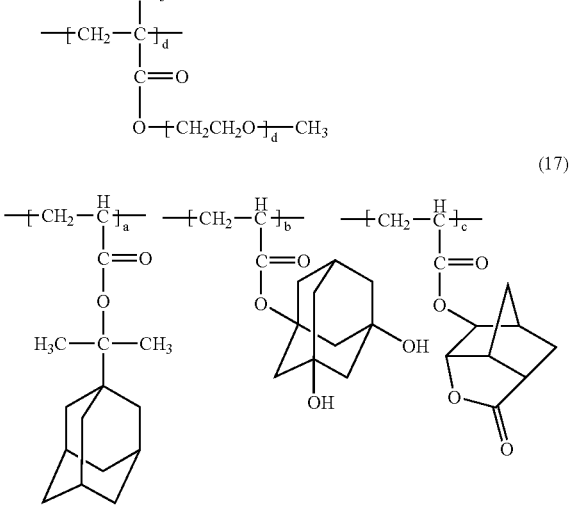

-continued

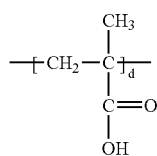

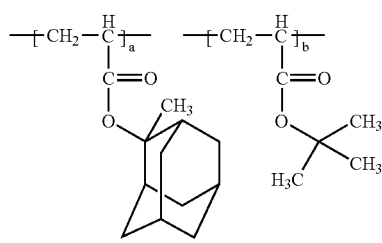

(18)

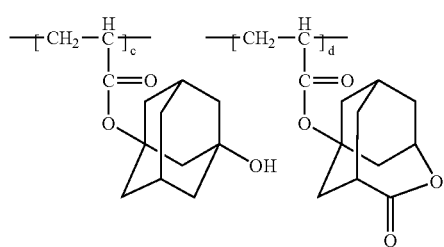

Example 1

Fifty parts by weight of resin 1-1 was mixed with 65 parts by weight of resin 11-2, 4.0 parts by weight of photo-acid generator PAG1-12, 0.2 parts by weight of additive N-1, 0.7 parts by weight of surfactant W-1, 460 parts by weight of propylene glycol monomethyl ether acetate, and 300 parts by weight of cyclohexanone. This mixture was sufficiently stirred for dissolution and then filtered through a 0.1-μm filter to prepare a resist solution.

ARC 29A for antireflection film formation (manufactured by Nissan Chemical Industries, Ltd.) was applied to a bare silicon substrate by spin coating, and proximity bake was conducted for 60 seconds with a 205° C. hot plate to form a 78-nm film of ARC 29A on the substrate. The resist solution prepared above was applied to this substrate by spin coating. Proximity bake was conducted for 90 seconds with a 120° C. hot plate to form a 300-nm resist film. This wafer was exposed with an ArF micro stepper having an NA of 0.60 with various exposure energies. Immediately thereafter, proximity bake was conducted for 90 seconds with a 120° C. hot plate. Subsequently, the substrate was subjected to 60-second development with a 2.38% aqueous solution of tetramethylammonium hydroxide, rinsed with pure water for 15 seconds, and then spin-dried to form a resist pattern (substrate A). Substrates on which a resist pattern had been formed in the same manner as for substrate A were produced and subjected to 90-second proximity bake (flow bake) with 150° C. to 180° C. hot plates (substrates B). The exposure energy at which contact holes of 150 nm were formed so as to have the desired size was determined in substrate A. The 150-nm contact holes of the substrate B produced with this exposure energy and through the flow bake at a temperature of 170° C. were examined. As a result, the diameter of the holes was found to have decreased to 140 nm or smaller.

Examples 2 to 21

The compositions of Examples 2 to 21 shown in Table 2 were also evaluated in the same manner as in Example 1. The results obtained are shown in Table 3. In all resists, the hole diameter decreased by 5 nm or more at the flow bake temperatures of 180° C. and lower. These compositions were thus ascertained to have suitability for thermal flow.

Comparative Examples 1 and 2

The compositions of Comparative Examples 1 and 2 shown in Table 2 were also evaluated in the same manner as in Example 1. The results obtained are shown in Table 3. As a result, the hole diameter did not decrease by 5 nm or more even through flow bake at 180° C. Practical suitability for thermal flow was not observed.

TABLE 1

| Resin No. | Structural formula | Composition a | b | c | d | $T_g$ (° C.) | Molecular weight | Dispersity ratio |
|---|---|---|---|---|---|---|---|---|
| 1-1 | 1 | 36 | 22 | 42 | | 83 | 7900 | 2.2 |
| 1-2 | 1 | 35 | 23 | 42 | | 141 | 11540 | 1.5 |
| 2-1 | 2 | 39 | 20 | 41 | | 126 | 9070 | 2.0 |
| 2-2 | 2 | 39 | 20 | 41 | | 155 | 10410 | 1.7 |
| 2-3 | 2 | 39 | 20 | 41 | | 113 | 4860 | 1.7 |
| 3-1 | 3 | 43 | 19 | 38 | | 148 | 9200 | 2.1 |
| 4-1 | 4 | 44 | 20 | 36 | | 151 | 11390 | 1.6 |
| 5-1 | 5 | 37 | 23 | 40 | | 138 | 12220 | 1.7 |
| 6-1 | 6 | 38 | 22 | 40 | | 131 | 8330 | 2.1 |
| 7-1 | 7 | 39 | 22 | 39 | | 152 | 5190 | 1.8 |
| 7-2 | 7 | 36 | 23 | 41 | | 119 | 3270 | 1.5 |
| 7-3 | 7 | 36 | 23 | 41 | | 139 | 4100 | 1.6 |
| 7-4 | 7 | 35 | 21 | 44 | | 168 | 7700 | 2.0 |
| 7-5 | 7 | 35 | 21 | 44 | | 183 | 8500 | 2.0 |
| 8-1 | 8 | 37 | 22 | 41 | | 133 | 7760 | 2.3 |
| 9-1 | 9 | 35 | 32 | 33 | | 122 | 9910 | 2.2 |
| 10-1 | 10 | 30 | 22 | 39 | 9 | 152 | 5840 | 1.7 |
| 10-2 | 10 | 30 | 22 | 39 | 9 | 134 | 3890 | 1.6 |
| 11-1 | 11 | 20 | 20 | 21 | 39 | 155 | 7980 | 2.3 |
| 11-2 | 11 | 20 | 20 | 21 | 39 | 161 | 9370 | 2.2 |
| 12-1 | 12 | 45 | 7 | 48 | | 136 | 10370 | 2.2 |
| 13-1 | 13 | 45 | 27 | 28 | | 144 | 10180 | 2.3 |
| 14-1 | 14 | 37 | 19 | 2 | 42 | 156 | 8350 | 2.1 |
| 14-2 | 14 | 35 | 19 | 5 | 41 | 139 | 7630 | 2.0 |
| 15-1 | 15 | 39 | 16 | 5 | 40 | 147 | 8670 | 2.2 |
| 16-1 | 16 | 37 | 19 | 39 | 5 | 139 | 7560 | 1.9 |
| 17-1 | 17 | 35 | 19 | 36 | 10 | 153 | 10150 | 1.8 |
| 18-1 | 18 | 35 | 8 | 29 | 28 | 149 | 10650 | 1.6 |

TABLE 2

| | Resin A | | Resin B | | Resin C | | Photo-acid generator | |
|---|---|---|---|---|---|---|---|---|
| | Kind | Parts by weight | Kind | Parts by weight | Kind | Parts by weight | Kind | Parts by weight |
| Ex. 1 | 1-1 | 35.0 | 11-2 | 65.0 | | | PAG1-12 | 4.0 |
| Ex. 2 | 1-2 | 40.0 | 7-2 | 60.0 | | | PAG2-21 | 3.0 |
| Ex. 3 | 2-3 | 50.0 | 7-1 | 50.0 | | | z45 | 5.0 |
| Ex. 4 | 3-1 | 55.0 | 9-1 | 45.0 | | | PAG1-12/PAG2-25 | 3.0/0.4 |
| Ex. 5 | 4-1 | 30.0 | 7-2 | 70.0 | | | PAG2-21/I-19 | 2.0/4.0 |
| Ex. 6 | 5-1 | 90.0 | 1-1 | 10.0 | | | PAG2-21/I-19/z46 | 1.3/3.0/2.0 |
| Ex. 7 | 6-1 | 85.0 | 12-1 | 15.0 | | | PAG2-21/PAG2-25/I-19 | 1.8/0.75/4.0 |
| Ex. 8 | 7-1 | 10.0 | 7-3 | 90.0 | | | PAG1-12/PAG2-25 | 3.5/0.5 |
| Ex. 9 | 7-1 | 70.0 | 9-1 | 30.0 | | | PAG2-21/I-19 | 1.5/6.0 |
| Ex. 10 | 7-3 | 80.0 | 10-2 | 20.0 | | | PAG2-21 | 2.8 |
| Ex. 11 | 7-2 | 40.0 | 11-2 | 60.0 | | | PAG2-21 | 3.0 |
| Ex. 12 | 7-2 | 75.0 | 13-1 | 25.0 | | | PAG2-21/I-19 | 2.0/5.5 |
| Ex. 13 | 7-3 | 80.0 | 9-1 | 20.0 | | | z33 | 2.6 |
| Ex. 14 | 7-2 | 55.0 | 16-1 | 45.0 | | | PAG2-17/PAG2-21 | 1.0/2.5 |
| Ex. 15 | 7-2 | 80.0 | 18-1 | 10.0 | 9-1 | 10.0 | z34 | 2.8 |
| Ex. 16 | 8-1 | 65.0 | 14-2 | 35.0 | | | z33/z40 | 2.2/4.0 |
| Ex. 17 | 9-1 | 70.0 | 14-1 | 30.0 | | | z13/z36 | 2.0/4.0 |
| Ex. 18 | 9-1 | 70.0 | 15-1 | 30.0 | | | z33/z44/z12 | 2.5/4.5/0.5 |
| Ex. 19 | 9-1 | 85.0 | 17-1 | 15.0 | | | z9/z33/z36 | 0.5/2.0/5.0 |
| Ex. 20 | 10-1 | 10.0 | 10-2 | 90.0 | | | z30/z33 | 4.0/2.0 |
| Ex. 21 | 12-1 | 40.0 | 15-1 | 40.0 | 1-1 | 20.0 | z33 | 3.0 |
| Comp. Ex. 1 | 7-5 | 100.0 | | | | | PAG2-21 | 2.5 |
| Comp. Ex. 2 | 7-3 | 50.0 | 12-1 | 50.0 | | | PAG2-21 | 3.0 |

| | Additive | | Surfactant | | Solvent | |
|---|---|---|---|---|---|---|
| | Kind | Parts by weight | Kind | Parts by weight | Kind | Parts by weight |
| Ex. 1 | N-1 | 0.20 | W-1 | 0.7 | SL-1 | 480 |
| | | | | | SL-5 | 300 |
| Ex. 2 | N-2/N-3 | 0.10/0.20 | W-2 | 0.9 | SL-1 | 480 |
| | | | | | SL-2 | 320 |
| Ex. 3 | N-2 | 0.25 | W-3 | 0.8 | SL-1 | 760 |
| | | | | | SL-3 | 400 |
| Ex. 4 | N-4 | 0.22 | W-1 | 1.0 | SL-1 | 785 |
| | | | | | SL-4 | 16 |
| Ex. 5 | N-5 | 0.24 | W-2 | 0.9 | SL-1 | 460 |
| | | | | | SL-5 | 300 |
| Ex. 6 | N-6 | 0.15 | W-3 | 0.9 | SL-1 | 490 |
| | | | | | SL-2 | 320 |
| Ex. 7 | N-7 | 0.21 | W-1 | 0.7 | SL-1 | 460 |
| | | | | | SL-5 | 300 |
| Ex. 8 | N-8 | 0.27 | W-2 | 0.9 | SL-1 | 480 |
| | | | | | SL-2 | 320 |
| Ex. 9 | N-3 | 0.24 | W-3 | 1.0 | SL-1 | 760 |
| | | | | | SL-3 | 400 |
| Ex. 10 | N-4 | 0.20 | W-1 | 0.7 | SL-1 | 785 |
| | | | | | SL-4 | 16 |
| Ex. 11 | N-5 | 0.19 | W-2 | 0.7 | SL-1 | 785 |
| | | | | | SL-4 | 16 |
| Ex. 12 | N-8 | 0.15 | W-3 | 1.0 | SL-1 | 490 |
| | | | | | SL-2 | 320 |
| Ex. 13 | N-1 | 0.11 | W-1 | 0.7 | SL-1 | 785 |
| | | | | | SL-4 | 16 |
| Ex. 14 | N-2 | 0.14 | W-2 | 0.7 | SL-1 | 460 |
| | | | | | SL-5 | 300 |
| Ex. 15 | N-4/N-1 | 0.05/0.10 | W-3 | 0.8 | SL-1 | 460 |
| | | | | | SL-5 | 300 |
| Ex. 16 | N-5 | 0.25 | W-1 | 0.7 | SL-1 | 760 |
| | | | | | SL-3 | 400 |
| Ex. 17 | N-6 | 0.20 | W-2 | 0.8 | SL-1 | 490 |
| | | | | | SL-2 | 320 |
| Ex. 18 | N-7 | 0.19 | W-3 | 0.9 | SL-1 | 760 |
| | | | | | SL-3 | 400 |
| Ex. 19 | N-8 | 0.23 | W-1 | 0.9 | SL-1 | 490 |
| | | | | | SL-2 | 320 |
| Ex. 20 | N-1 | 0.18 | W-2 | 0.7 | SL-1 | 490 |
| | | | | | SL-2 | 320 |

TABLE 2-continued

| | | | | | | |
|---|---|---|---|---|---|---|
| Ex. 21 | N-2 | 0.15 | W-3 | 1.0 | SL-1 | 760 |
| | | | | | SL-3 | 400 |
| Comp. Ex. 1 | N-1 | 0.20 | W-1 | 0.7 | SL-1 | 460 |
| | | | | | SL-5 | 300 |
| Comp. Ex. 2 | N-5 | 0.20 | W-1 | 0.7 | SL-1 | 490 |
| | | | | | SL-2 | 320 |

In Examples 1 to 21 and Comparative Examples 1 and 2, flow initiation temperature and flow amount were evaluated in the following manners. The results obtained are shown in Table 3.

[Flow Initiation Temperature]

A: below 160° C.

B: from 160° C. to below 180° C.

C: 180° C. or above

[Flow Amount]

Flow amount for 150-nm contact hole at (flow initiation temperature +5° C.)

A: 5 nm or more

B: less than 5 nm

The photo-acid generators are compounds shown hereinabove as examples.

[Basic Compounds]

N-1: 1,5-diazabicyclo[4.3.0]-5-nonene

N-2: 1,8-diazobicyclo[5.4.0]-7-undecene

N-3: 4-dimethylaminopyridine

N-4: triphenylimidazole

N-5: 2,6-diisopropylaniline

N-6: tributylamine

N-7: N,N-dibutylaniline

N-8: N,N-diethanolaniline

[Surfactants]

W-1: Megafac F176 (manufactured by Dainippon Ink & Chemicals, Inc.)

W-2: Megafac R08 (manufactured by Dainippon Ink & Chemicals, Inc.)

W-3: Troysol S-366 (manufactured by Troy Chemical Co., Ltd.)

[Solvents]

SL-1: propylene glycol monomethyl ether acetate

SL-2: propylene glycol monomethyl ether

SL-3: 3-methoxy-1-butanol

SL-4: propylene carbonate

SL-5: cyclohexanone

TABLE 3

| | Flow initiation temperature | Flow amount |
|---|---|---|
| Example 1 | B | A |
| Example 2 | A | A |
| Example 3 | B | A |
| Example 4 | B | A |
| Example 5 | A | A |
| Example 6 | B | A |
| Example 7 | B | A |
| Example 8 | B | A |
| Example 9 | B | A |
| Example 10 | B | A |
| Example 11 | B | A |
| Example 12 | A | A |
| Example 13 | B | A |
| Example 14 | A | A |
| Example 15 | A | A |
| Example 16 | B | A |
| Example 17 | A | A |
| Example 18 | B | A |
| Example 19 | B | A |
| Example 20 | A | A |
| Example 21 | B | A |
| Comparative Example 1 | C | B |
| Comparative Example 2 | C | B |

The results given in Table 3 show that the compositions according to the invention have excellent suitability for thermal flow.

According to the invention, a positive resist composition having excellent suitability for thermal flow even in pattern formation through exposure with an ArF excimer laser can be provided.

The entire disclosure of each and every foreign patent application from which the benefit of foreign priority has been claimed in the present application is incorporated herein by reference, as if fully set forth.

What is claimed is:

1. A positive resist composition comprising:
at least two resins, each comprising: at least one of a repeating unit derived from an acrylic acid derivative monomer and a repeating unit derived from a methacrylic acid derivative monomer; an alicyclic structure; and at least one group that increases solubility of each of the at least two resins in alkaline developer by the action of an acid; and
a compound which generates an acid upon irradiation with actinic rays or radiation,
wherein a first resin of the at least two resins has a glass transition temperature different from that of a second resin of the at least two resins by at least 5° C.,
wherein each of the first and second resins comprises at least one repeating unit selected from the group consisting of repeating units represented by formula (A1) and repeating units represented by formula (A2):

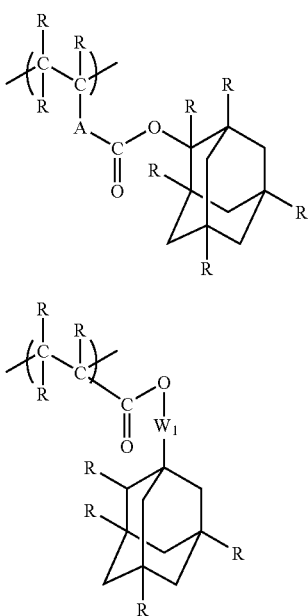

wherein in formula (A1), R represents a hydrogen atom, a hydroxyl group, a halogen atom, or an alkyl group having 1 or 2 carbon atoms, provided that the R's are the same or different; and in formula (A2), R represents a hydrogen atom, a hydroxyl group, a halogen atom, or an alkyl group having 1 to 4 carbon atoms, provided that the R's are the same or different;

A is a single bond or represents one group or a combination of two or more groups selected from the group consisting of alkylene, ether, thioether, carbonyl, ester, amide, sulfonamide, urethane and urea groups; and $W_1$ represents an alkylene group.

2. The positive resist composition as claimed in claim 1, wherein each of the first and second resins comprises both of a repeating unit derived from the acrylic acid derivative monomer and a repeating unit derived the methacrylic acid derivative monomer and the difference between the molar proportion of the repeating unit derived from the acrylic acid derivative monomer in the first resin and that the second resin is from 20 to 95 mol %.

3. The positive resist composition as claimed in claim 1, wherein one of the first and second resins has a glass transition temperature lower than 140° C. and the other one of the first and second resins has a glass transition temperature if from 140° C. to lower than 180° C.

4. The positive resist composition as claimed in claim 1, wherein one of the first and second resin s does not comprise a repeating unit derived from methacrylic acid derivative monomer and the other one of the first and second resins comprises both of a repeating unit derived from the acrylic acid derivative monomer and a repeating unit derived from the methacrylic acid derivative monomer.

5. The positive resist composition as claimed in claim 1, wherein at least one of the first and second resins comprises at least one of a repeating unit derived from a dihydroxyadamantyl methacrylic monomer and a repeating unit derived from a dihydroxyadamantyl acrylate monomer.

6. The positive resist composition as claimed in claim 1, wherein he compound which generates an acid upon irradiation with actinic rays or radiation is at least one member selected from the group consisting of compounds represented by formulae (PAG1), (PAG2), and (PAG6):

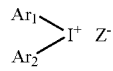 (PAG1)

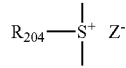 (PAG2)

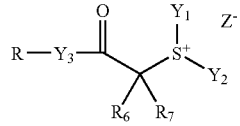 (PAG6)

$Ar^1$ and $Ar^2$ each independently represents an aryl group;

$R^{203}$, $R^{204}$, and $R^{205}$ each independently represents an alkyl group or an aryl group;

R represents a chain or cyclic alkyl group or an aromatic group;

$Y_3$ represents a single bond or a bivalent connecting group;

$R_6$ and $R_7$ each represents a hydrogen atom, a cyano, an alkyl group, or an aryl group, provided that $R_6$ and $R_7$ may be bonded to each other to form a ring;

$Y_1$ and $Y_2$ each represents an alkyl group, an aryl group, an aralkyl group, or an aromatic group containing one or more heteroatoms, provided that $Y_1$ and $Y_2$ may be bonded to each other to form a ring; and $Z^-$ in each formula represents a counter anion.

7. A method of pattern formation comprising:

forming a photoresist film on a semiconductor substrate with a positive resist composition comprising:

at least two resins, each comprising: at least one of a repeating unit derived from an acrylic acid derivative monomer and a repeating unit derived from a methacrylic acid derivative monomer; an alicyclic structure; and at least one group that increases solubility of each of the at least two resins in alkaline developer by the action of an acid; and a compound which generates an acid upon irradiation with actinic rays or radiation, wherein a first resin of the at least two resins has a glass transition temperature different from that of a second resin of the at least two resins by at least 5° C.;

subjecting the photoresist film to pattern-wise exposure with at least one of: radiation having a wavelength of 200 nm or shorter; electron beams; X-rays; and ion beams;

heating the photoresist film;

developing the photoresist film to form a contact hole pattern having a hole size larger than a desired size; and heating the semiconductor substrate to a temperature of from 120 to 200° C. to cause the contact hole pattern to flow thermally and thereby form a contact hole pattern having the desired hole size.

8. A method of pattern formation comprising:

forming a photoresist film on a semiconductor substrate with a positive resist composition as claimed in claim 1;

subjecting the photoresist film to pattern-wise exposure with at least one of: radiation having a wavelength of 200 nm or shorter; electron beams; X-rays; and ion beams;

heating the photoresist film;

developing the photoresist film to form a contact hole pattern having a hole size larger than a desired size; and heating the semiconductor substrate to a temperature of from 120 to 200° C. to cause the contact hole pattern to flow thermally and thereby form a contact hole pattern having the desired hole size.

* * * * *